(12) United States Patent
Kawata et al.

(10) Patent No.: US 12,022,720 B2
(45) Date of Patent: *Jun. 25, 2024

(54) DISPLAY DEVICE

(71) Applicant: Semiconductor Energy Laboratory Co., Ltd., Atsugi (JP)

(72) Inventors: Takuya Kawata, Atsugi (JP); Akihiro Chida, Isehara (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/986,012

(22) Filed: Nov. 14, 2022

(65) Prior Publication Data

US 2023/0147069 A1 May 11, 2023

Related U.S. Application Data

(63) Continuation of application No. 16/867,890, filed on May 6, 2020, now Pat. No. 11,508,787, which is a
(Continued)

(30) Foreign Application Priority Data

Aug. 19, 2013 (JP) ................................. 2013-169542

(51) Int. Cl.
*G06F 1/16* (2006.01)
*H10K 50/84* (2023.01)
(Continued)

(52) U.S. Cl.
CPC ........... *H10K 59/60* (2023.02); *G06F 1/1652* (2013.01); *H10K 50/84* (2023.02); *H10K 59/12* (2023.02);
(Continued)

(58) Field of Classification Search
CPC .............. G06F 1/1652; C09K 2323/00; C09K 2323/06; H01K 59/12; H01K 59/40;
(Continued)

(56) References Cited

U.S. PATENT DOCUMENTS

| 4,934,306 A | 6/1990 | Rudolph |
| 6,242,758 B1 | 6/2001 | Yamazaki et al. |

(Continued)

FOREIGN PATENT DOCUMENTS

| EP | 1450334 A | 8/2004 |
| EP | 1635313 A | 3/2006 |

(Continued)

OTHER PUBLICATIONS

Young's Modulus of Plastic Materials, https://omnexus.specialchem.com/polymer-properties/properties/young-modulus, 2021, Omnexus.
(Continued)

*Primary Examiner* — Ruiyun Zhang
(74) *Attorney, Agent, or Firm* — Eric J. Robinson; Robinson Intellectual Property Law Office, P.C.

(57) ABSTRACT

A display device, an electronic device, or a lighting device that is unlikely to be broken is provided. A flexible first substrate and a flexible second substrate overlap with each other with a display element provided therebetween. A flexible third substrate is bonded on the outer surface of the first substrate, and a flexible fourth substrate is bonded on the outer surface of the second substrate. The third substrate is formed using a material softer than the first substrate, and the fourth substrate is formed using a material softer than the second substrate.

17 Claims, 30 Drawing Sheets

Related U.S. Application Data continuation of application No. 15/225,120, filed on Aug. 1, 2016, now Pat. No. 10,658,433, which is a continuation of application No. 14/459,565, filed on Aug. 14, 2014, now Pat. No. 9,431,618.

(51) Int. Cl.

| | | |
|---|---|---|
| *H10K 59/12* | (2023.01) | |
| *H10K 59/40* | (2023.01) | |
| *H10K 59/60* | (2023.01) | |
| *H10K 71/00* | (2023.01) | |
| *H10K 77/10* | (2023.01) | |
| *H10K 101/00* | (2023.01) | |
| *H10K 102/00* | (2023.01) | |

(52) U.S. Cl.
CPC ............ *H10K 59/40* (2023.02); *H10K 71/00* (2023.02); *H10K 77/111* (2023.02); *C09K 2323/00* (2020.08); *C09K 2323/06* (2020.08); *H10K 59/1201* (2023.02); *H10K 2101/00* (2023.02); *H10K 2102/3026* (2023.02); *H10K 2102/3035* (2023.02); *H10K 2102/311* (2023.02); *Y02E 10/549* (2013.01); *Y02P 70/50* (2015.11)

(58) Field of Classification Search
CPC ............... H01K 77/111; H01K 50/84; H01K 2102/311; H10K 59/12; H10K 59/40; H10K 77/111; H10K 50/84; H10K 2102/311
USPC ...... 428/1.1, 1.6; 257/40, 72, 82; 438/29, 34
See application file for complete search history.

(56) References Cited

U.S. PATENT DOCUMENTS

| | | | |
|---|---|---|---|
| 7,038,377 B2 | 5/2006 | Kobayashi et al. | |
| 7,190,116 B2 | 3/2007 | Kobayashi et al. | |
| 7,316,964 B2 | 1/2008 | Akiyama | |
| RE42,215 E | 3/2011 | Kobayashi et al. | |
| 8,237,165 B2 | 8/2012 | Kim et al. | |
| RE43,738 E | 10/2012 | Kobayashi et al. | |
| 8,427,420 B2 | 4/2013 | Yamazaki et al. | |
| 8,436,122 B2 | 5/2013 | Kho et al. | |
| 8,476,828 B2 | 7/2013 | Hayashi et al. | |
| 8,657,456 B2 | 2/2014 | Yamagata et al. | |
| RE44,902 E | 5/2014 | Kobayashi et al. | |
| RE45,556 E | 6/2015 | Kobayashi et al. | |
| 9,047,799 B2 | 6/2015 | Yamazaki et al. | |
| 9,361,853 B2 | 6/2016 | Yamazaki et al. | |
| 9,431,618 B2 * | 8/2016 | Kawata ............... | H10K 50/84 |
| 9,929,220 B2 | 3/2018 | Yamazaki et al. | |
| 9,996,115 B2 | 6/2018 | Yamazaki et al. | |
| 10,658,433 B2 * | 5/2020 | Kawata ............... | H10K 59/40 |
| 11,508,787 B2 * | 11/2022 | Kawata ............... | H10K 59/40 |
| 2005/0259189 A1 | 11/2005 | Bouten et al. | |
| 2006/0050169 A1 | 3/2006 | Misawa | |
| 2006/0132698 A1 | 6/2006 | Furlani et al. | |
| 2010/0007942 A1 | 1/2010 | Oikawa et al. | |
| 2010/0171138 A1 | 7/2010 | Yamazaki et al. | |
| 2010/0327737 A1 | 12/2010 | Hayashi et al. | |
| 2011/0062434 A1* | 3/2011 | Eguchi ............... | H01L 27/12 257/E29.095 |
| 2011/0209901 A1 | 9/2011 | MacDonald et al. | |
| 2012/0020056 A1 | 1/2012 | Yamagata et al. | |
| 2012/0033354 A1 | 2/2012 | Huang | |
| 2012/0120364 A1 | 5/2012 | Wu et al. | |
| 2013/0010405 A1 | 1/2013 | Rothkopf et al. | |
| 2013/0076649 A1 | 3/2013 | Myers et al. | |
| 2013/0299789 A1* | 11/2013 | Yamazaki ............ | H10K 59/131 257/40 |
| 2014/0029171 A1 | 1/2014 | Lee | |
| 2014/0254111 A1 | 9/2014 | Yamazaki et al. | |
| 2014/0306260 A1 | 10/2014 | Yamazaki et al. | |
| 2015/0179717 A1 | 6/2015 | Kawata | |
| 2018/0212006 A1 | 7/2018 | Yamazaki et al. | |
| 2018/0348824 A1 | 12/2018 | Yamazaki et al. | |

FOREIGN PATENT DOCUMENTS

| | | |
|---|---|---|
| EP | 2259321 A | 12/2010 |
| JP | 06-054079 | 7/1994 |
| JP | 2004-072050 A | 3/2004 |
| JP | 2003/060858 | 5/2005 |
| JP | 2005-311171 A | 11/2005 |
| JP | 2006-058764 A | 3/2006 |
| JP | 2006-072115 A | 3/2006 |
| JP | 2006-243621 A | 9/2006 |
| JP | 2006-287982 A | 10/2006 |
| JP | 2007-013049 A | 1/2007 |
| JP | 2010-048887 A | 3/2010 |
| JP | 2010-182668 A | 8/2010 |
| JP | 2010-244694 A | 10/2010 |
| JP | 2010-256660 A | 11/2010 |
| JP | 2010-282181 A | 12/2010 |
| JP | 2010-540684 | 12/2010 |
| JP | 2011-007904 A | 1/2011 |
| JP | 2011-018097 A | 1/2011 |
| JP | 2011-022302 A | 2/2011 |
| JP | 2011-118082 A | 6/2011 |
| JP | 2011-128481 A | 6/2011 |
| JP | 2011-192564 A | 9/2011 |
| JP | 2013-069480 A | 4/2013 |
| KR | 2005-0067182 A | 6/2005 |
| KR | 2010-0130898 A | 12/2010 |
| KR | 2010-0138824 A | 12/2010 |
| WO | WO-2004/036298 | 4/2004 |
| WO | WO-2009/016388 | 2/2009 |
| WO | WO-2010/125976 | 11/2010 |
| WO | WO-2010/128616 | 11/2010 |

OTHER PUBLICATIONS

Eguchi.S et al., "A Flexible OLED Display with Robustness and Bendability", SID Digest '19 : SID International Symposium Digest of Technical Papers, May 29, 2019, vol. 50, No. 1, pp. 632-635.

Lee.H et al., "Folding stabilities of encapsulation layers at positions off the mechanical neutral plane", Applied Physics Express, Jul. 17, 2018, vol. 11, No. 8, pp. 086502-1-086502-4.

\* cited by examiner

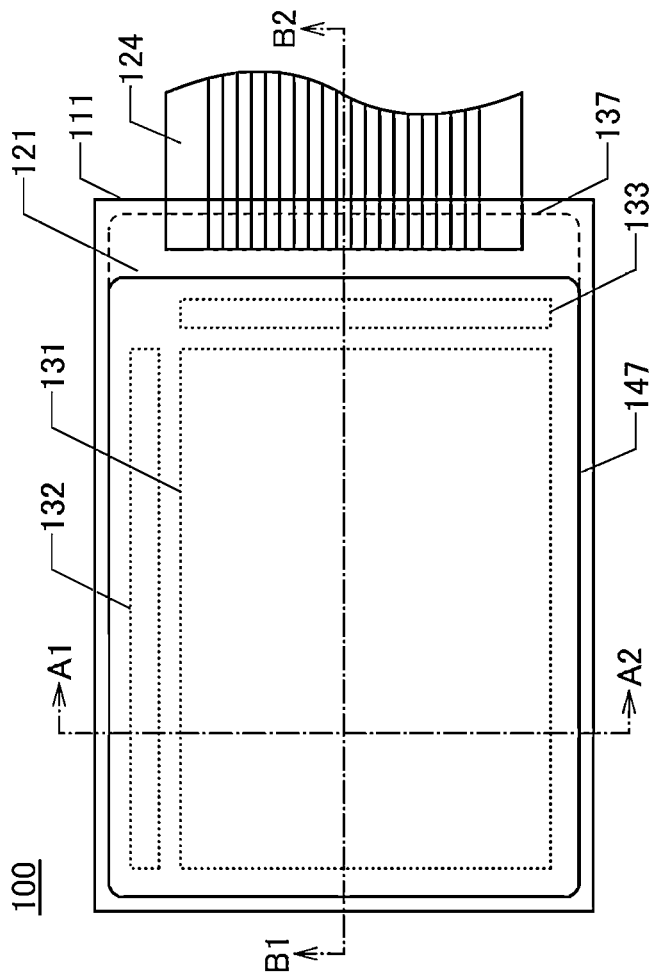
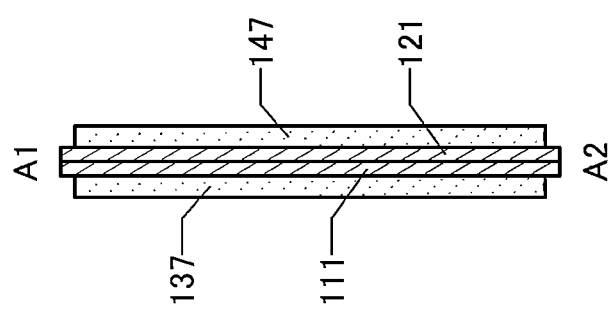
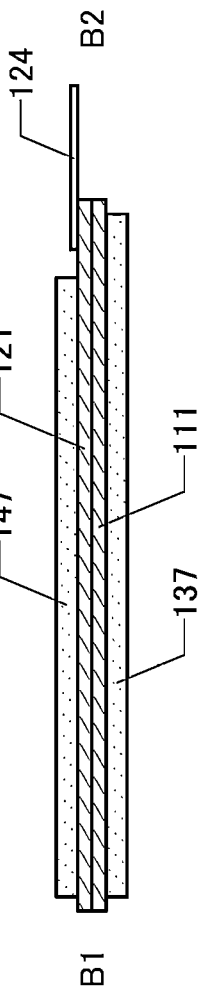
FIG. 1A
FIG. 1B
FIG. 1C

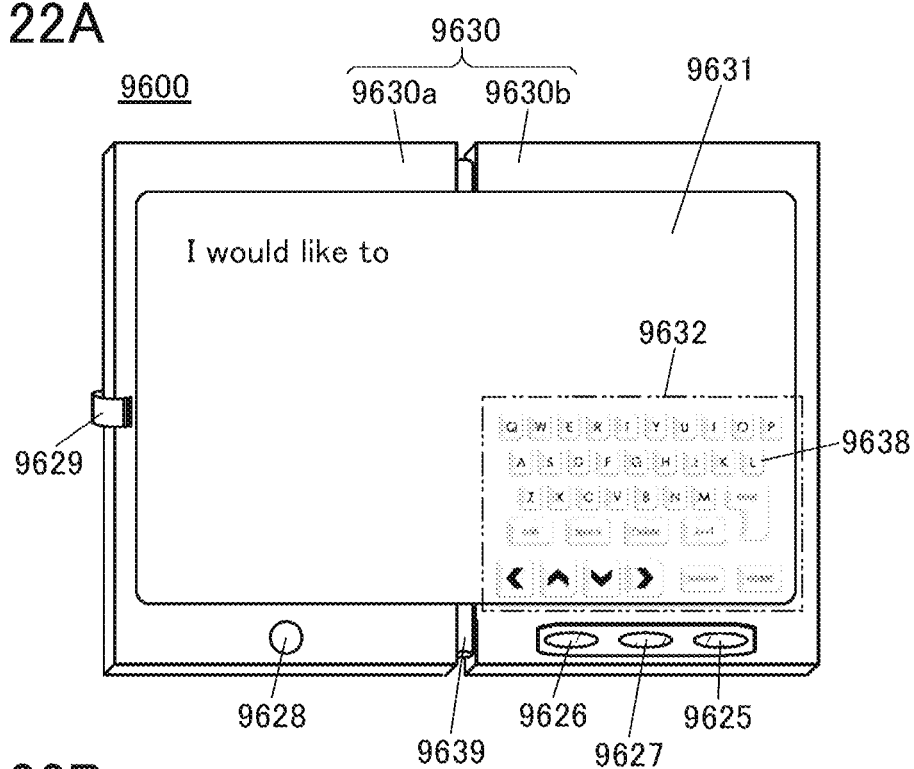
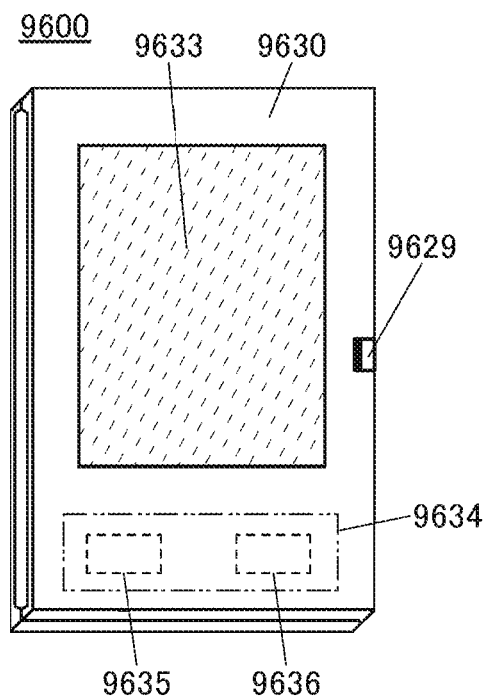
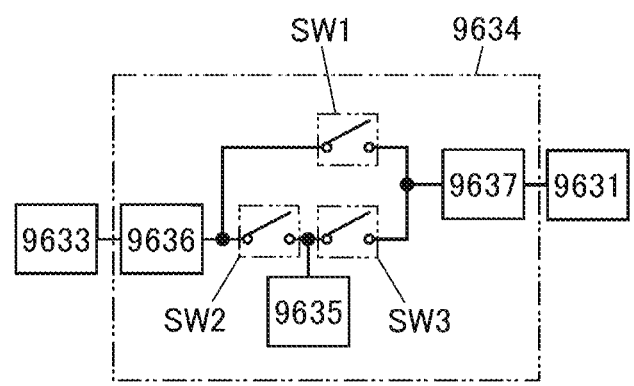

DISPLAY DEVICE

BACKGROUND OF THE INVENTION

1. Field of the Invention

One embodiment of the present invention relates to an object, a method, or a manufacturing method. In addition, one embodiment of the present invention relates to a process, a machine, manufacture, or a composition of matter. One embodiment of the present invention particularly relates to a light-emitting device, a display device, an electronic device, a lighting device, a manufacturing method thereof, a usage method thereof, an operation method thereof, or the like. In particular, the present invention relates to a light-emitting device, a display device, an electronic device, or a lighting device utilizing electroluminescence (EL), a manufacturing method thereof, a usage method thereof, an operation method thereof, or the like.

2. Description of the Related Art

Recent light-emitting devices and display devices are expected to be applied to a variety of uses and become diversified.

For example, light-emitting devices and display devices for mobile devices and the like are required to be thin, lightweight, capable of being provided on a curved surface, and unlikely to be broken. In addition, a light-emitting device and a display device that can be bent at any part are demanded for greater portability.

Light-emitting elements utilizing EL (also referred to as EL elements) have features such as ease of thinning and lightening, high-speed response to input signal, and driving with a direct-current low voltage source; therefore, application of the light-emitting elements to light-emitting devices and display devices has been suggested.

For example, Patent Document 1 discloses a technical idea that a thin film device layer formed on a silicon wafer, a glass substrate, or the like is transferred onto a plastic substrate having a stacked-layer structure.

REFERENCE

Patent Document

[Patent Document 1] Japanese Published Patent Application No. 2004-72050

SUMMARY OF THE INVENTION

In Patent Document 1, materials of the plastic substrate that can be used for a display device are listed; however, some of them, such as a fluorine rubber material or a silicone resin, are too soft to be favorable for transfer of a thin film device layer. Furthermore, Patent Document 1 does not disclose a material for a substrate that can be favorably used in a repeatedly bendable display device.

An object of one embodiment of the present invention is to provide a highly portable display device, electronic device, or lighting device.

Another object of one embodiment of the present invention is to provide a repeatedly bendable display device, electronic device, or lighting device.

Another object of one embodiment of the present invention is to provide a highly reliable display device, electronic device, or lighting device.

Another object of one embodiment of the present invention is to provide a display device, electronic device, or lighting device that is unlikely to be broken.

Another object of one embodiment of the present invention is to provide a display device, electronic device, or lighting device with low power consumption.

Another object of one embodiment of the present invention is to provide a novel display device, electronic device, or lighting device.

Note that the descriptions of these objects do not disturb the existence of other objects. Note that in one embodiment of the present invention, there is no need to achieve all the objects. Note that other objects will be apparent from the description of the specification, the drawing, the claims, and the like and other objects can be derived from the description of the specification, the drawings, the claims, and the like.

One embodiment of the present invention is a display device that includes a first substrate, a second substrate, a third substrate, and a fourth substrate. The first substrate and the second substrate overlap with each other with a display element provided therebetween. The third substrate and the fourth substrate overlap with each other with the first substrate and the second substrate provided therebetween. The third substrate and the fourth substrate are softer than the first substrate and the second substrate.

One embodiment of the present invention is a display device that includes a first substrate, a second substrate, a third substrate, and a fourth substrate. The first substrate and the second substrate overlap with each other with a display element provided therebetween. The third substrate and the fourth substrate overlap with each other with the first substrate and the second substrate provided therebetween. The Young's modulus of the third substrate and the fourth substrate is smaller than the Young's modulus of the first substrate and the second substrate.

The Young's modulus of a material suitable for the first substrate and the second substrate is larger than or equal to 1 GPa ($1 \times 10^9$ Pa) and smaller than or equal to 100 GPa ($100 \times 10^9$ Pa), preferably larger than or equal to 2 GPa and smaller than or equal to 50 GPa, further preferably larger than or equal to 2 GPa and smaller than or equal to 20 GPa.

The Young's modulus of a material used for the third substrate and the fourth substrate is preferably smaller than or equal to one fiftieth, further preferably smaller than or equal to one hundredth, still further preferably smaller than or equal to one five hundredth of the Young's modulus of the material used for the first substrate and the second substrate.

In one embodiment of the present invention, a highly portable display device, electronic device, or lighting device can be provided.

In one embodiment of the present invention, a repeatedly bendable display device, electronic device, or lighting device can be provided.

In one embodiment of the present invention, a highly reliable display device, electronic device, or lighting device can be provided.

In one embodiment of the present invention, a display device, electronic device, or lighting device that is unlikely to be broken can be provided.

In one embodiment of the present invention, a display device, electronic device, or lighting device with low power consumption can be provided.

In one embodiment of the present invention, a novel display device, electronic device, or lighting device can be provided.

BRIEF DESCRIPTION OF THE DRAWINGS

FIGS. 1A to 1C illustrate one mode of a display device.

FIGS. 22A to 22C illustrate one example of an electronic device.

DETAILED DESCRIPTION OF THE INVENTION

Figure 2A:
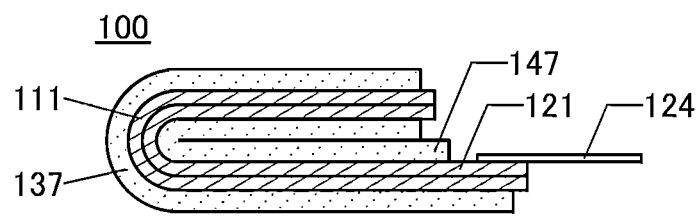
FIGS. 2A to 2C are cross-sectional views illustrating examples of bending of a display device.

Embodiments will be described in detail with reference to the drawings. Note that one embodiment of the present invention is not limited to the following description, and it will be easily understood by those skilled in the art that various changes and modifications can be made without departing from the spirit and scope of the present invention. Therefore, one embodiment of the present invention should not be construed as being limited to the description in the following embodiments. Note that in the structures of the invention described below, the same portions or portions having similar functions are denoted by the same reference numerals in different drawings, and description of such portions is not repeated.

Note that in each drawing referred to in this specification, the size of each component or the thickness of each layer might be exaggerated or a region might be omitted for clarity of the invention. Therefore, embodiments of the invention are not limited to such scales. Especially in a top view (a plan view) and a perspective view, some components might not be illustrated for easy understanding.

The position, size, range, and the like of each component illustrated in the drawings and the like are not accurately represented in some cases to facilitate understanding of the invention. Therefore, the disclosed invention is not necessarily limited to the position, size, range, and the like disclosed in the drawings and the like. For example, in the actual manufacturing process, a resist mask or the like might be unintentionally reduced in size by treatment such as etching, which is not illustrated in some cases for easy understanding.

Note that ordinal numbers such as "first" and "second" in this specification and the like are used in order to avoid confusion among components and do not denote the priority or the order such as the order of steps or the stacking order. A term without an ordinal number in this specification and the like might be provided with an ordinal number in a claim in order to avoid confusion among components.

In addition, in this specification and the like, the term such as an "electrode" or a "wiring" does not limit a function of a component. For example, an "electrode" is used as part of a "wiring" in some cases, and vice versa. Further, the term "electrode" or "wiring" can also mean a combination of a plurality of "electrodes" and "wirings" formed in an integrated manner.

Note that the term "over" or "under" in this specification and the like does not necessarily mean that a component is placed "directly above and in contact with" or "directly below and in contact with" another component. For example, the expression "electrode B over insulating layer A" does not necessarily mean that the electrode B is on and in direct contact with the insulating layer A and can mean the case where another component is provided between the insulating layer A and the electrode B.

Further, functions of a source and a drain might be switched depending on operation condition, e.g., when a transistor having a different polarity is employed or a direction of current flow is changed in circuit operation. Therefore, it is difficult to define which is the source (or the drain). Thus, the terms "source" and "drain" can be used to denote the drain and the source, respectively.

In this specification and the like, the term "electrically connected" includes the case where components are connected through an object having any electric function. There is no particular limitation on an "object having any electric function" as long as electric signals can be transmitted and received between components that are connected through the object. Thus, even when the expression "electrically connected" is used in this specification, there is a case in which no physical connection is made and a wiring is just extended in an actual circuit.

In this specification and the like, the term "parallel" indicates that the angle formed between two straight lines is greater than or equal to −10° and less than or equal to 10°, and accordingly also includes the case where the angle is greater than or equal to −5° and less than or equal to 5°. In addition, the term "perpendicular" indicates that the angle formed between two straight lines is greater than or equal to 80° and less than or equal to 100°, and accordingly also includes the case where the angle is greater than or equal to 85° and less than or equal to 95°. The term "equal" allows for a maximum error of ±5%.

In this specification, in the case where an etching step is performed after a photolithography process, a resist mask formed in the photolithography process is removed after the etching step, unless otherwise specified.

Embodiment 1

A structure example of a display device 100 that is one embodiment of the present invention will be described with reference to drawings. FIG. 1A is a top view of the display device 100 and FIG. 1B is a cross-sectional view taken along a dashed-dotted line A1-A2 in FIG. 1A. FIG. 1C is a cross-sectional view taken along a dashed-dotted line B1-B2 in FIG. 1A.

Figure 24A:
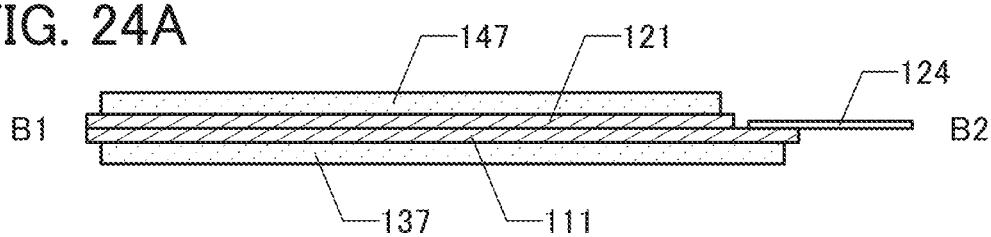
FIGS. 24A to 24F each illustrate one mode of a display device.
Figure 24B:
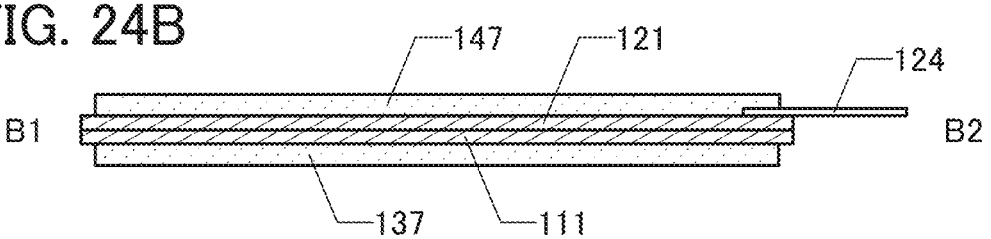
Figure 24C:
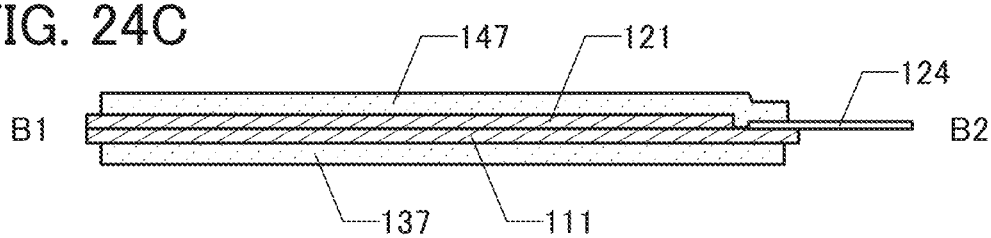
Figure 24D:
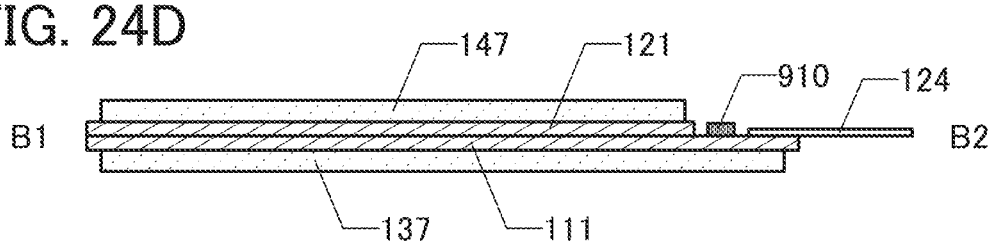
Figure 24E:
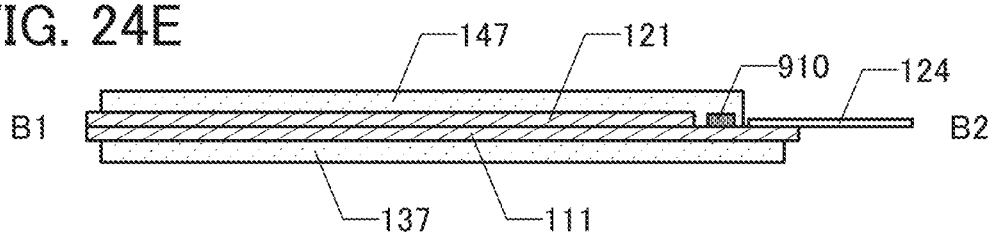
Figure 24F:
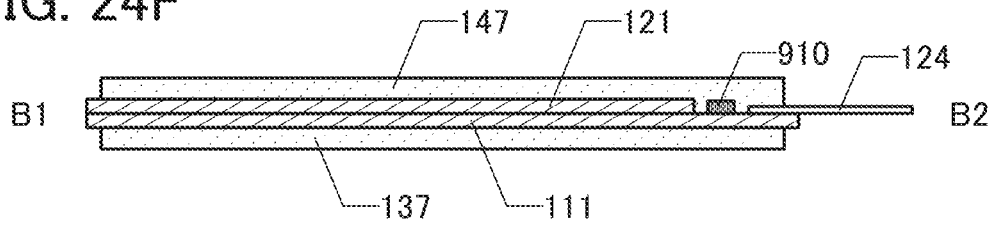

The cross-sectional structure of one embodiment of the present invention is not limited to that illustrated in FIG. 1C. For example, any of cross-sectional structures illustrated in FIGS. 24A to 24F may also be employed. The external electrode 124 may be covered with a substrate 147 as illustrated in FIGS. 24B, 24C, and 24F, in which case a connection portion can be protected. Note that FIGS. 24D to 24F each illustrate a structure in which a semiconductor chip 910 is provided over a substrate by COG or the like. When the semiconductor chip 910 is covered with the substrate 147 as illustrated in FIGS. 24E and 24F, the semiconductor chip 910 and its connection portion can be protected.

Figure 2B:
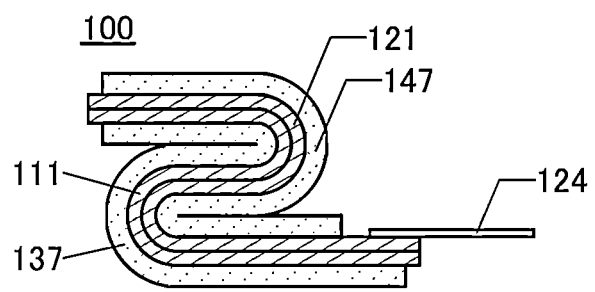
Figure 2C:
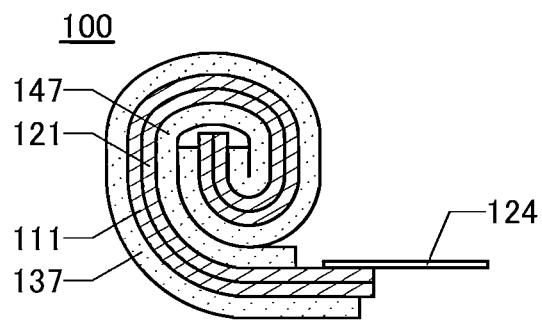

FIGS. 2A to 2C are cross-sectional views illustrating the display device 100 in a bent state. Note that FIGS. 2A to 2C are each a cross-sectional view taken along the dashed-dotted line B1-B2 in FIG. 1A. FIG. 2A illustrates the display device 100 which is folded double. FIG. 2B illustrates the display device 100 which is folded in three. FIG. 2C illustrates the display device 100 which is rolled up. Note that the bending directions are not limited to those shown in FIGS. 2A to 2C, and the display device 100 that is one embodiment of the present invention can be bent in any direction.

Figure 3A:
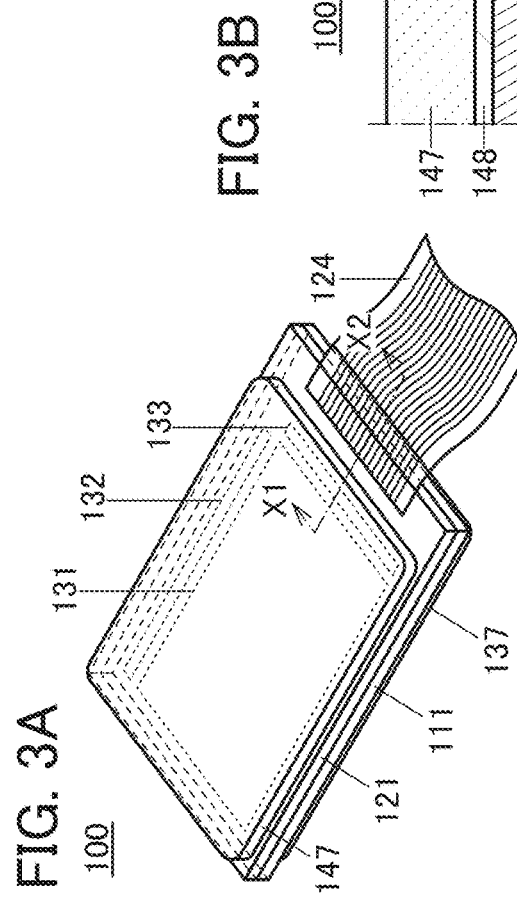
FIGS. 3A and 3B illustrate one mode of a display device.
Figure 3B:
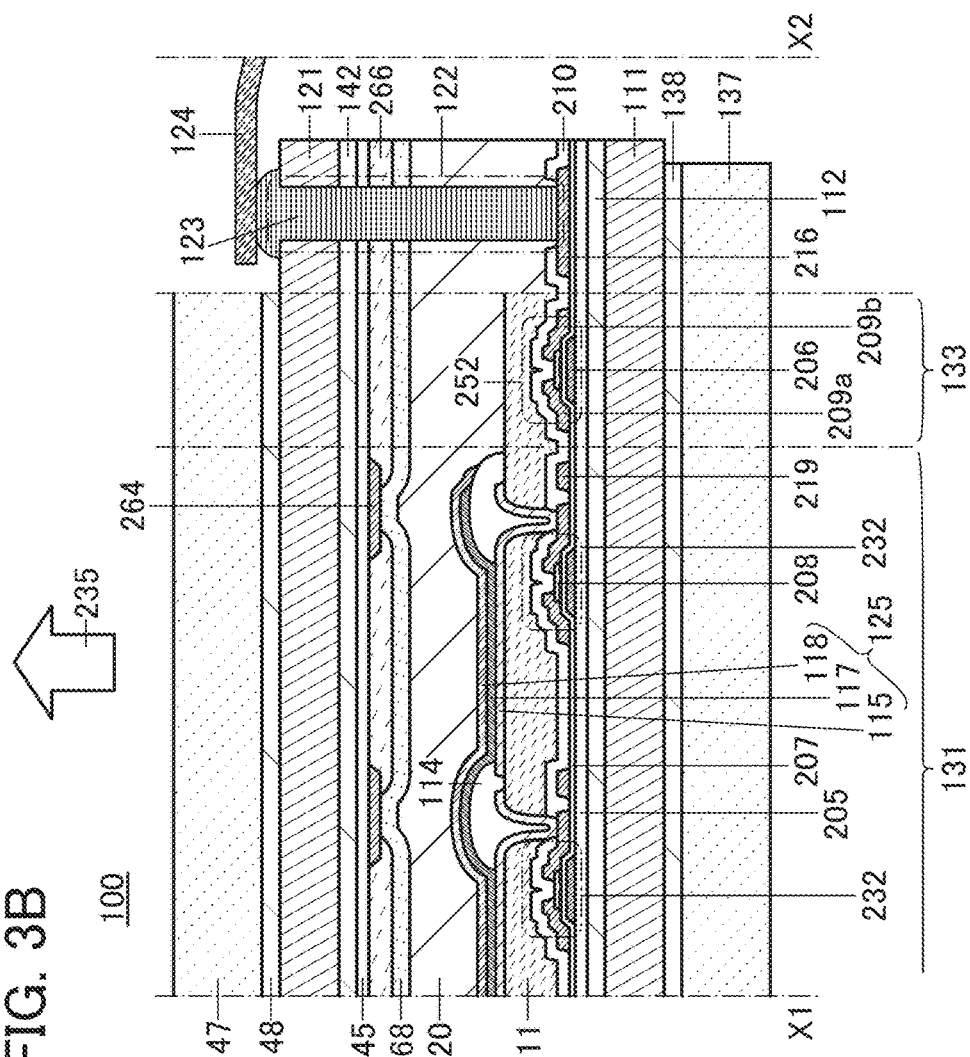
Figure 25:
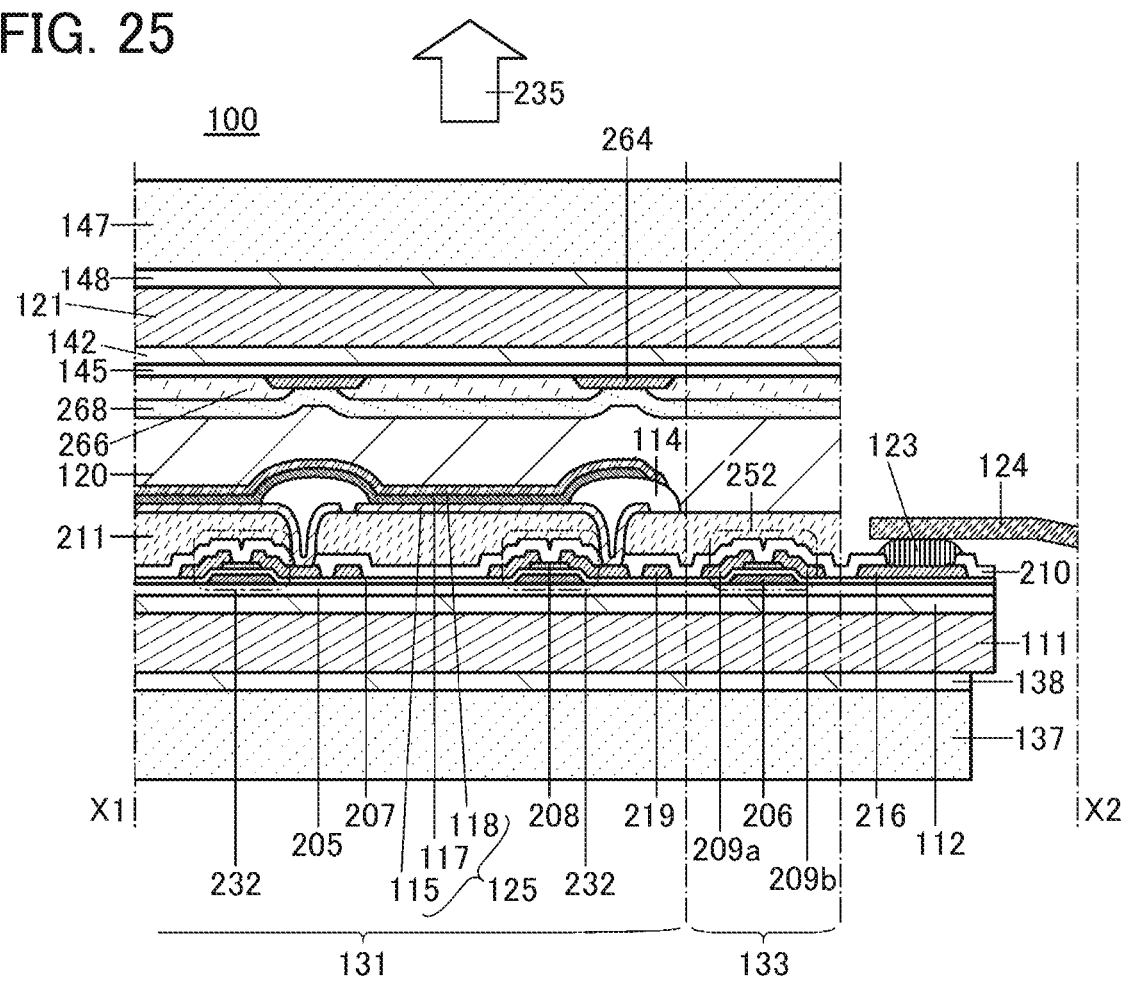
FIG. 25 illustrates one mode of a display device.

FIG. 3A is a perspective view of the display device 100, and FIG. 3B is a cross-sectional view for specifically describing a portion taken along a dashed-dotted line X1-X2 in FIG. 3A. Note that the cross-sectional structure may be the one illustrated in FIG. 3B or the one illustrated in FIG. 25.

<Configuration Example of Display Device>

The display device 100 described in this embodiment includes a display area 131, a driver circuit 132, and a driver circuit 133. The display device 100 also includes a terminal electrode 216 and a light-emitting element 125 including an electrode 115, an EL layer 117, and an electrode 118. A plurality of light-emitting elements 125 are formed in the display area 131. A transistor 232 for controlling the amount of light emitted from the light-emitting element 125 is connected to each of the light-emitting elements 125.

The external electrode 124 and the terminal electrode 216 are electrically connected to each other through an anisotropic conductive connection layer 123. In addition, the terminal electrode 216 is electrically connected to the driver circuit 132 and the driver circuit 133.

The driver circuit 132 and the driver circuit 133 each include a plurality of transistors 252. The driver circuit 132 and the driver circuit 133 each have a function of determining which of the light-emitting elements 125 in the display area 131 is supplied with a signal from the external electrode 124.

The transistor 232 and the transistor 252 each include a gate electrode 206, a gate insulating layer 207, a semiconductor layer 208, a source electrode 209a, and a drain electrode 209b. A wiring 219 is formed in the same layer where the source electrode 209a and the drain electrode 209b are formed. In addition, an insulating layer 210 is formed over the transistor 232 and the transistor 252, and an insulating layer 211 is formed over the insulating layer 210. The electrode 115 is formed over the insulating layer 211. The electrode 115 is electrically connected to the drain electrode 209b through an opening formed in the insulating layer 210 and the insulating layer 211. A partition 114 is formed over the electrode 115, and the EL layer 117 and the electrode 118 are formed over the electrode 115 and the partition 114.

In the display device 100, a substrate 111 and a substrate 121 are attached to each other with a bonding layer 120 provided therebetween. One surface of the substrate 111 is provided with a substrate 137 with a bonding layer 138 provided therebetween. One surface of the substrate 121 is provided with the substrate 147 with a bonding layer 148 provided therebetween.

The other surface of the substrate 111 is provided with an insulating layer 205 with a bonding layer 112 provided therebetween. The insulating layer 205 is preferably formed as a single layer or a multilayer using silicon oxide, silicon nitride, silicon oxynitride, silicon nitride oxide, aluminum oxide, aluminum oxynitride, aluminum nitride oxide, or the like. The insulating layer 205 can be formed by a sputtering method, a CVD method, a thermal oxidation method, a coating method, a printing method, or the like.

The other surface of the substrate 121 is provided with an insulating layer 145 with a bonding layer 142 provided therebetween. The other surface of the substrate 121 is provided with a light-blocking layer 264 with the insulating layer 145 provided therebetween. The other surface of the substrate 121 is also provided with a coloring layer 266 and an overcoat layer 268 with the insulating layer 145 provided therebetween.

Note that the insulating layer 205 functions as a base layer and can prevent or reduce diffusion of moisture and impurity elements from the substrate 111, the bonding layer 112, or the like to the transistor or the light-emitting element. The insulating layer 145 functions as a base layer and can prevent or reduce diffusion of moisture and impurity elements from the substrate 121, the bonding layer 142, or the like to the transistor or the light-emitting element. The insulating layer 145 can be formed using a material and a method similar to those of the insulating layer 205.

A flexible material such as an organic resin material, or the like can be used for the substrate 111 and the substrate 121. In the case where the display device 100 is a so-called bottom-emission display device or a dual-emission display device, a material that transmits light emitted from the EL layer 117 is used for the substrate 111. In the case where the display device 100 is a top-emission display device or a dual-emission display device, a material that transmits light emitted from the EL layer 117 is used for the substrate 121.

In a similar manner, in the case where the display device 100 is a so-called bottom-emission display device or a dual-emission display device, a material that transmits light emitted from the EL layer 117 is used for the substrate 137. In the case where the display device 100 is a top-emission display device or a dual-emission display device, a material that transmits light emitted from the EL layer 117 is used for the substrate 147.

If the mechanical strength of a material used for the substrate 111 and the substrate 121 is too low, the substrates easily become deformed at the time of manufacture of the display device 100, which reduces yield and thus, contributes to a reduction in productivity. Yet, if the mechanical strength of the material used for the substrate 111 and the substrate 121 is too high, the display device becomes difficult to bend. An index of the mechanical strength of a material is a Young's modulus. The Young's modulus of a material suitable for the substrate 111 and the substrate 121 is larger than or equal to 1 GPa ($1 \times 10^9$ Pa) and smaller than or equal to 100 GPa ($100 \times 10^9$ Pa), preferably larger than or equal to 2 GPa and smaller than or equal to 50 GPa, further preferably larger than or equal to 2 GPa and smaller than or equal to 20 GPa. Note that in measurement of a Young's modulus, ISO527, JISK7161, JISK7162, JISK7127, ASTMD638, ASTMD882, or the like can be referred to.

The thickness of each of the substrate 111 and the substrate 121 is preferably greater than or equal to 5 µm and less than or equal to 100 µm, further preferably greater than or equal to 10 µm and less than or equal to 50 µm. One or both of the substrate 111 and the substrate 121 may be a stacked-layer substrate that includes a plurality of layers.

It is preferable that the substrate 111 and the substrate 121 be formed using the same material and have the same thickness. However, depending on the purpose, the substrates 111 and 121 may be formed using different materials or have different thicknesses.

Examples of materials that have flexibility and transmit visible light, which can be used for the substrate 111 and the substrate 121, include a polyethylene terephthalate resin, a polyethylene naphthalate resin, a polyacrylonitrile resin, a polyimide resin, a polymethylmethacrylate resin, a polycarbonate resin, a polyethersulfone resin, a polyamide resin, a cycloolefin resin, a polystyrene resin, a polyamide imide resin, a polyvinylchloride resin, and the like. Furthermore, when a light-transmitting property is not necessary, a non-light-transmitting substrate may be used. For example, aluminum or the like may be used for the substrate 121 or the substrate 111.

The thermal expansion coefficients of the substrate 111 and the substrate 121 are preferably less than or equal to 30 ppm/K, more preferably less than or equal to 10 ppm/K. In addition, on surfaces of the substrate 111 and the substrate 121, a protective film having low water permeability may be formed in advance; examples of the protective film include a film containing nitrogen and silicon such as a silicon nitride film or a silicon nitride oxide film and a film containing nitrogen and aluminum such as an aluminum nitride film. Note that a structure in which a fibrous body is impregnated with an organic resin (also called prepreg) may be used as the substrate 111 and the substrate 121.

With such substrates, a non-breakable display device can be provided. Alternatively, a lightweight display device can be provided. Alternatively, an easily bendable display device can be provided.

For the substrate 137, a material softer than the substrate 111 is used. For example, a material having a smaller Young's modulus than the substrate 111 is used for the substrate 137. For the substrate 147, a material softer than the substrate 121 is used. For example, a material having a smaller Young's modulus than the substrate 121 is used for the substrate 147.

The Young's modulus of the material used for the substrate 137 is preferably smaller than or equal to one fiftieth, further preferably smaller than or equal to one hundredth, still further preferably smaller than or equal to one five hundredth of the Young's modulus of the material used for the substrate 111. The Young's modulus of the material used for the substrate 147 is preferably smaller than or equal to one fiftieth, further preferably smaller than or equal to one hundredth, still further preferably smaller than or equal to one five hundredth of the Young's modulus of the material used for the substrate 121.

Examples of a material that can be used for the substrate 137 and the substrate 147 include a viscoelastic high molecular material such as silicone rubber or fluorine rubber. The material used for the substrate 137 and the substrate 147 preferably has a light-transmitting property. The substrate 137 and the substrate 147 may be formed using the same kind of material or different materials.

In the case where the substrate 137 and the substrate 147 are bonded to each other with the substrate 111 and the substrate 121 provided therebetween, the thickness of the substrate 137 is preferably equal to that of the substrate 147. When the thickness of the substrate 137 is equal to that of the substrate 147, the substrate 111 and the substrate 121 can be positioned close to a neutral plane of a bent portion. Accordingly, stress applied to the substrate 111 and the substrate 121 at the time of bending can be reduced.

A material with a small Young's modulus more easily becomes deformed than a material with a large Young's modulus does; therefore, internal stress generated by deformation is easily dispersed in the former. When a material with a Young's modulus smaller than that of the substrate 111 and the substrate 121 is used for the substrate 137 and the substrate 147, local stress generated in the substrate 111 and the substrate 121 at the time of bending can be relaxed, whereby the substrate 111 and the substrate 121 can be prevented from being broken. The substrate 137 and the substrate 147 also function as buffers dispersing external physical pressure and impact.

The substrate 137 or the substrate 147 is provided on the inner side of a bent portion, whereby the radius of curvature of the substrate 111 or 121 that is positioned on the inner side of the bent portion can be prevented from being smaller than the thickness of the substrate 137 or the substrate 147. In this manner, breakage of the substrate 111 or the substrate 121 due to bending at an excessively small radius of curvature can be prevented.

In one embodiment of the present invention, the display device 100 can be prevented from being broken even when the radius of curvature of the substrate 111 or 121 that is positioned on the inner side of a bent portion is 1 mm or less.

Note that the thickness of the substrate 137 is preferably greater than or equal to 2 times and less than or equal to 100 times that of the substrate 111, further preferably greater than or equal to 5 times and less than or equal to 50 times that of the substrate 111. The thickness of the substrate 147 is preferably greater than or equal to 2 times and less than or equal to 100 times that of the substrate 121, further preferably greater than or equal to 5 times and less than or equal to 50 times that of the substrate 121. When the substrate 137 is thicker than the substrate 111 and the substrate 147 is thicker than the substrate 121, stress relaxation and the effect of buffers can be enhanced.

It is preferable that the substrate 137 and the substrate 147 be formed using the same material and have the same thickness. However, depending on the purpose, the substrates 137 and 147 may be formed using different materials or have different thicknesses.

Depending on the usage of the display device, it is also possible to provide only one of the substrate 137 and the substrate 147. One or both of the substrate 137 and the substrate 147 may be a stacked-layer substrate that includes a plurality of layers.

In one embodiment of the present invention, a display device that is resistant to external impact and unlikely to be broken can be provided.

In one embodiment of the present invention, a highly reliable display device can be provided which is unlikely to be broken even when it is repeatedly bent and stretched.

<Example of Pixel Circuit Configuration>

Figure 4A:
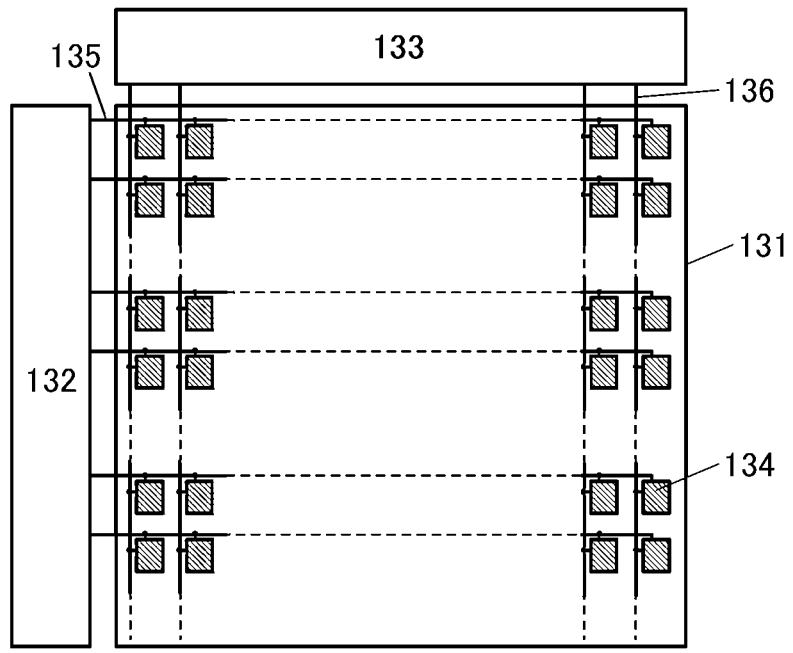
FIGS. 4A to 4C are a block diagram and circuit diagrams illustrating one mode of a display device.

Next, an example of a specific configuration of the display device 100 is described with reference to FIGS. 4A to 4C. FIG. 4A is a block diagram illustrating the configuration of the display device 100. The display device 100 includes the display area 131, the driver circuit 132, and the driver circuit 133. The driver circuit 132 functions as a scan line driver circuit, for example, and the driver circuit 133 functions as a signal line driver circuit, for example.

The display device 100 includes m scan lines 135 which are arranged parallel or substantially parallel to each other and whose potentials are controlled by the driver circuit 132, and n signal lines 136 which are arranged parallel or substantially parallel to each other and whose potentials are controlled by the driver circuit 133. The display area 131 includes a plurality of pixels 134 arranged in a matrix. The driver circuit 132 and the driver circuit 133 are collectively referred to as a driver circuit portion in some cases.

Each of the scan lines 135 is electrically connected to the n pixels 134 in the corresponding row among the pixels 134 arranged in m rows and n columns in the display area 131. Each of the signal lines 136 is electrically connected to the m pixels 134 in the corresponding column among the pixels 134 arranged in m rows and n columns. Note that m and n are each an integer of 1 or more.

Figure 4B:
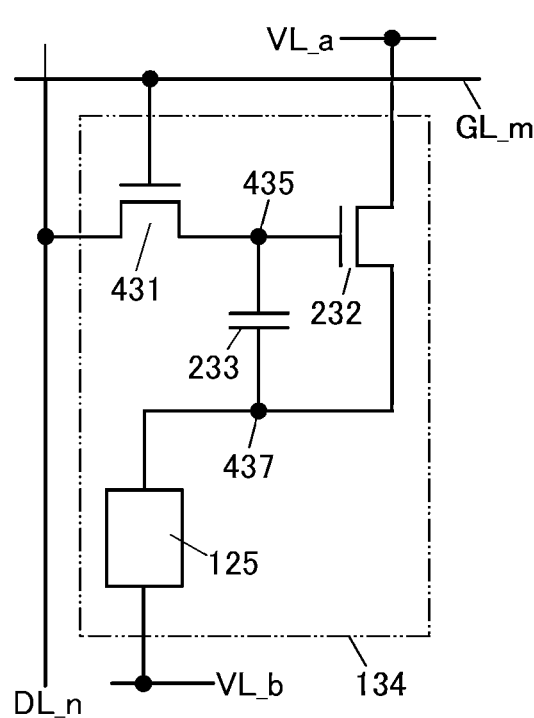
Figure 4C:
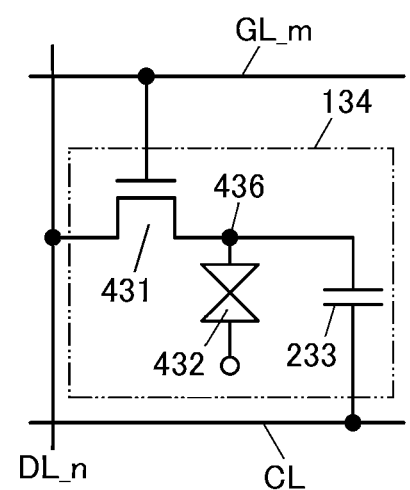

FIGS. 4B and 4C illustrate circuit configurations that can be used for the pixels 134 in the display device illustrated in FIG. 4A.

[Example of Pixel Circuit for Light-Emitting Display Device]

The pixel 134 illustrated in FIG. 4B includes a transistor 431, a capacitor 233, the transistor 232, and the light-emitting element 125.

One of a source electrode and a drain electrode of the transistor 431 is electrically connected to a wiring to which a data signal is supplied (hereinafter referred to as a signal line DL_n). A gate electrode of the transistor 431 is electrically connected to a wiring to which a gate signal is supplied (hereinafter referred to as a scan line GL_m).

The transistor 431 has a function of controlling whether to write a data signal to a node 435 by being turned on or off.

One of a pair of electrodes of the capacitor 233 is electrically connected to the node 435, and the other is electrically connected to a node 437. The other of the source electrode and the drain electrode of the transistor 431 is electrically connected to the node 435.

The capacitor 233 functions as a storage capacitor for storing data written to the node 435.

One of a source electrode and a drain electrode of the transistor 232 is electrically connected to a potential supply line VL_a, and the other is electrically connected to the node 437. A gate electrode of the transistor 232 is electrically connected to the node 435.

One of an anode and a cathode of the light-emitting element 125 is electrically connected to a potential supply line VL_b, and the other is electrically connected to the node 437.

As the light-emitting element 125, an organic electroluminescent element (also referred to as an organic EL element) or the like can be used, for example. Note that the light-emitting element 125 is not limited to organic EL elements; an inorganic EL element including an inorganic material can be used.

Note that a high power supply potential VDD is supplied to one of the potential supply line VL_a and the potential supply line VL_b, and a low power supply potential VSS is supplied to the other.

In the display device including the pixel 134 in FIG. 4B, the pixels 134 are sequentially selected row by row by the first driver circuit 132, whereby the transistors 431 are turned on and a data signal is written to the nodes 435.

When the transistors 431 are turned off, the pixels 134 in which the data has been written to the nodes 435 are brought into a holding state. Further, the amount of current flowing between the source electrode and the drain electrode of the transistor 232 is controlled in accordance with the potential of the data written to the node 435. The light-emitting element 125 emits light with a luminance corresponding to the amount of flowing current. This operation is sequentially performed row by row; thus, an image is displayed.

[Example of Pixel Circuit for Liquid Crystal Display Device]

The pixel 134 illustrated in FIG. 4C includes a liquid crystal element 432, the transistor 431, and the capacitor 233.

The potential of one of a pair of electrodes of the liquid crystal element 432 is set according to the specifications of the pixels 134 as appropriate. The alignment state of the liquid crystal element 432 depends on data written to a node 436. A common potential may be applied to one of the pair of electrodes of the liquid crystal element 432 included in each of the plurality of pixels 134. Further, the potential supplied to one of a pair of electrodes of the liquid crystal element 432 in the pixel 134 in one row may be different from the potential supplied to one of a pair of electrodes of the liquid crystal element 432 in the pixel 134 in another row.

As examples of a driving method of the display device including the liquid crystal element 432, any of the following modes can be given: a TN mode, an STN mode, a VA mode, an axially symmetric aligned micro-cell (ASM) mode, an optically compensated birefringence (OCB) mode, a ferroelectric liquid crystal (FLC) mode, an antiferroelectric liquid crystal (AFLC) mode, an MVA mode, a patterned vertical alignment (PVA) mode, an IPS mode, an FFS mode, a transverse bend alignment (TBA) mode, and the like. Other examples of the driving method of the display device include an electrically controlled birefringence (ECB) mode, a polymer dispersed liquid crystal (PDLC) mode, a polymer network liquid crystal (PNLC) mode, and a guest-host mode. Note that the present invention is not limited to these examples, and various liquid crystal elements and driving methods can be applied to the liquid crystal element and the driving method thereof.

The liquid crystal element 432 may be formed using a liquid crystal composition including liquid crystal exhibiting a blue phase and a chiral material. Liquid crystal exhibiting a blue phase does not need alignment treatment. In addition, the liquid crystal exhibiting a blue phase has a short response time of 1 msec or less and is optically isotropic, which makes the viewing angle dependence small.

Note that a display element other than the light-emitting element 125 and the liquid crystal element 432 can be used. For example, an electrophoretic element, an electronic ink, an electrowetting element, a micro electro mechanical system (MEMS), a digital micromirror device (DMD), a digital micro shutter (DMS), MIRASOL (registered trademark), an interferometric modulator (IMOD) element, or the like can be used as the display element.

In the pixel 134 in the m-th row and the n-th column, one of a source electrode and a drain electrode of the transistor 431 is electrically connected to a signal line DL_n, and the other is electrically connected to the node 436. A gate electrode of the transistor 431 is electrically connected to a scan line GL_m. The transistor 431 has a function of controlling whether to write a data signal to the node 436 by being turned on or off.

One of a pair of electrodes of the capacitor 233 is electrically connected to a wiring to which a particular potential is supplied (hereinafter referred to as a capacitor line CL), and the other is electrically connected to the node 436. The other of the pair of electrodes of the liquid crystal element 432 is electrically connected to the node 436. The potential of the capacitor line CL is set in accordance with the specifications of the pixel 134 as appropriate. The capacitor 233 functions as a storage capacitor for storing data written to the node 436.

For example, in the display device including the pixel 134 in FIG. 4C, the pixels 134 are sequentially selected row by row by the first driver circuit 132, whereby the transistors 431 are turned on and a data signal is written to the nodes 436.

When the transistors 431 are turned off, the pixels 134 in which the data signal has been written to the nodes 436 are brought into a holding state. This operation is sequentially performed row by row; thus, an image is displayed.

Modification Example

Figure 5A:
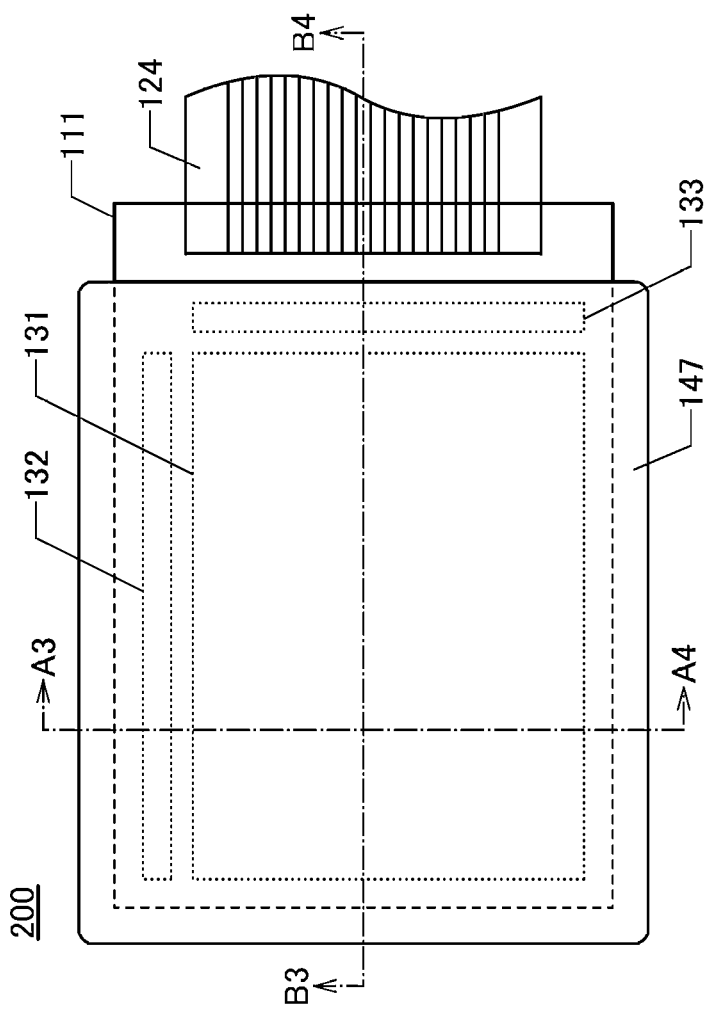
FIGS. 5A to 5C illustrate one mode of a display device.
Figure 5B:
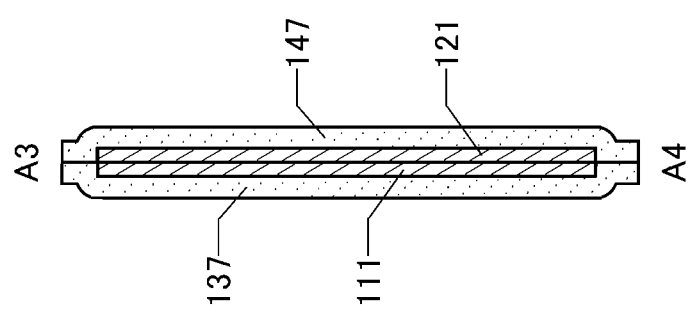
Figure 5C:
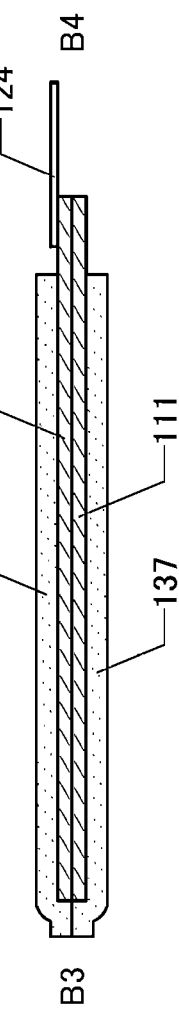

FIGS. 5A to 5C illustrate a display device 200 having a structure different from that of the display device 100. FIG. 5A is a top view of the display device 200 and FIG. 5B is a cross-sectional view taken along a dashed-dotted line A3-A4 in FIG. 5A. FIG. 5C is a cross-sectional view taken along a dashed-dotted line B3-B4 in FIG. 5A.

Figure 26A:
FIGS. 26A to 26H each illustrate one mode of a display device.
Figure 26B:
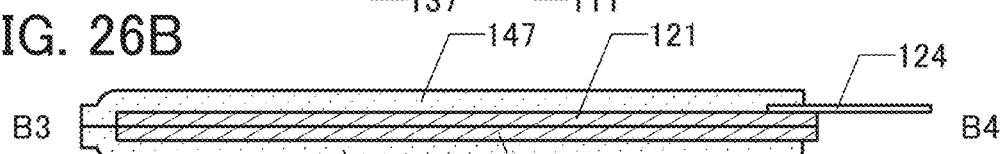
Figure 26C:
Figure 26D:
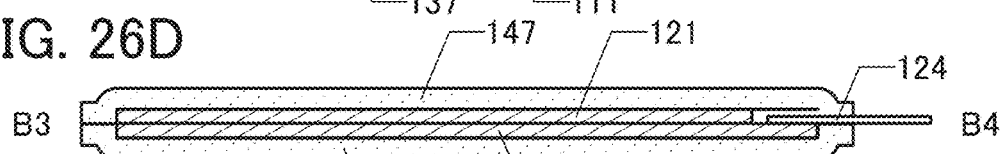
Figure 26E:
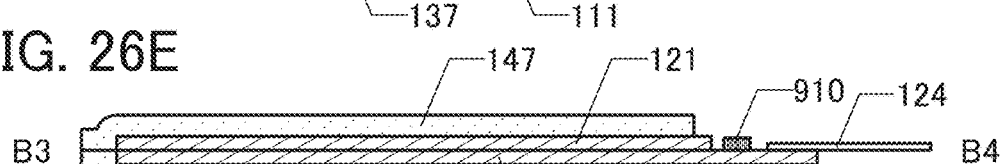
Figure 26F:
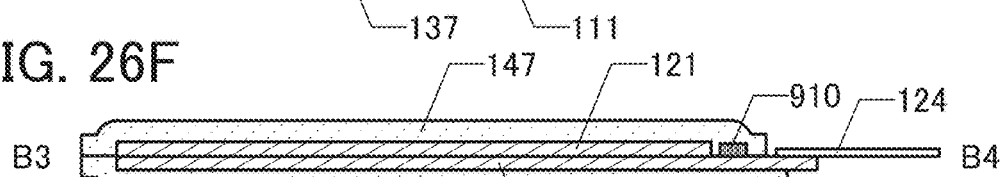
Figure 26G:
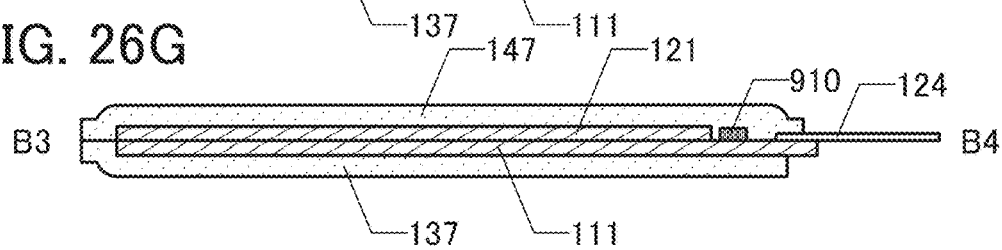
Figure 26H:
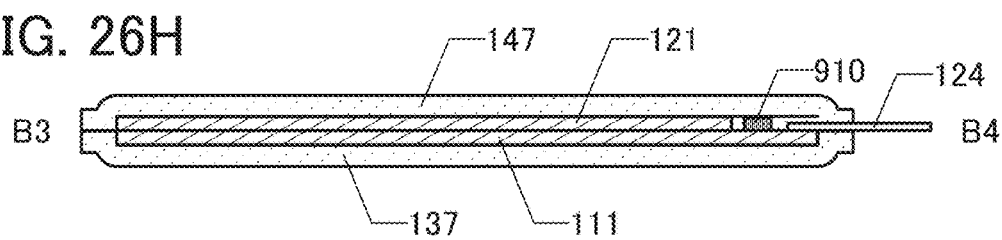

The cross-sectional structure of one embodiment of the present invention is not limited to that illustrated in FIG. 5C. For example, any of cross-sectional structures illustrated in FIGS. 26A to 26H may also be employed. The external electrode 124 may be covered with the substrate 147 as illustrated in FIGS. 26B, 26C, 26D, 26G, and 26H, in which case a connection portion can be protected. The external electrode 124 may be covered with the substrate 147 and the substrate 137 as illustrated in FIGS. 26D and 26H, in which case a connection portion can be protected. When the semiconductor chip 910 is covered with the substrate 147 as illustrated in FIGS. 26F, 26G, and 26H, the semiconductor chip 910 and its connection portion can be protected.

The display device 200 is different from the display device 100 in that at least part of the substrate 137 and part of the substrate 147 extend beyond the edges of the substrate 111 and the substrate 121 and that the extending portion of the substrate 137 and the extending portion of the substrate 147 are connected to each other. Other components can be formed in a manner similar to that of the display device 100. Note that the extending portions of the substrate 137 and the substrate 147 may be connected directly or connected indirectly with a bonding layer or the like provided therebetween.

The structure of the display device 200 can inhibit entry of impurities from the edges of the substrate 111 and the substrate 121 and thus can further improve the reliability of the display device.

This embodiment can be implemented in an appropriate combination with any of the structures described in other embodiments.

Embodiment 2

In this embodiment, another example of a method for manufacturing the display device 100 will be described with reference to FIGS. 6A to 6D, FIGS. 7A to 7D, FIGS. 8A and 8B, FIGS. 9A and 9B, FIGS. 10A and 10B, FIGS. 11A and 11B, and FIG. 12. Note that FIGS. 6A to 6D, FIGS. 7A to 7D, FIGS. 8A and 8B, FIGS. 9A and 9B, FIGS. 10A and 10B, FIGS. 11A and 11B, and FIG. 12 are each a cross-sectional view taken along a dashed-dotted line X1-X2 in FIG. 3A.

<Example of Method for Manufacturing Display Device>
[Formation of Separation Layer]

Figure 6A:
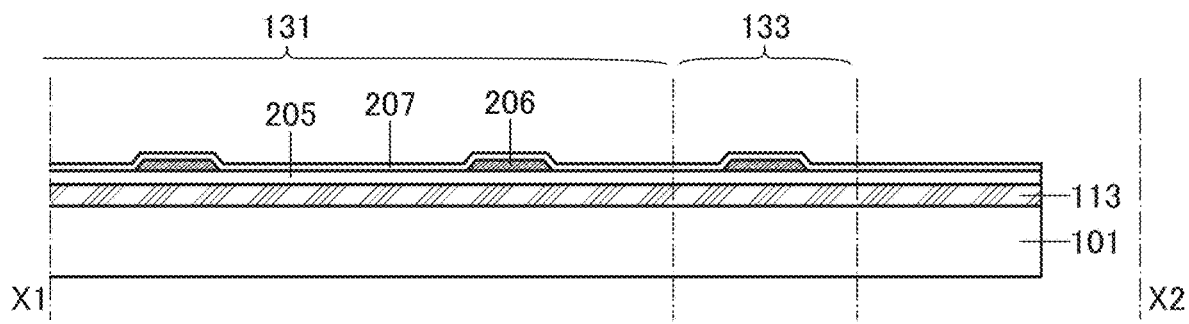
FIGS. 6A to 6D are cross-sectional views illustrating one example of a method for manufacturing a display device.
Figure 6B:
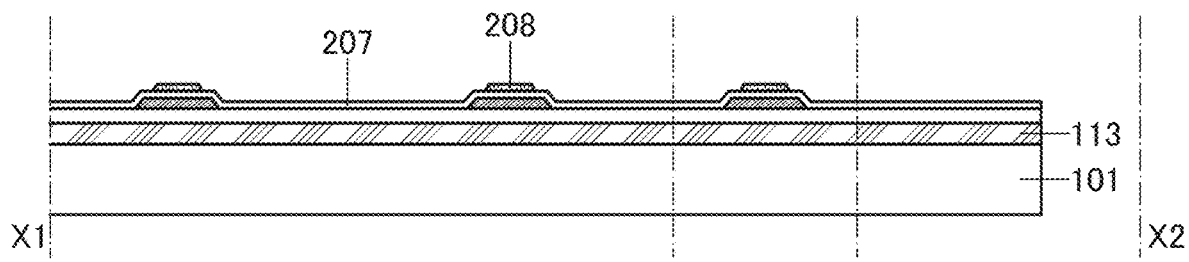

First, a separation layer 113 is formed over an element formation substrate 101 (see FIG. 6A). Note that the element formation substrate 101 may be a glass substrate, a quartz substrate, a sapphire substrate, a ceramic substrate, a metal substrate, or the like. Alternatively, the element formation substrate 101 may be a plastic substrate having heat resistance to the processing temperature in this embodiment.

As the glass substrate, for example, a glass material such as aluminosilicate glass, aluminoborosilicate glass, or barium borosilicate glass is used. Note that when the glass substrate contains a large amount of barium oxide (BaO), the glass substrate can be heat-resistant and more practical. Alternatively, crystallized glass or the like may be used.

The separation layer 113 can be formed using an element selected from tungsten, molybdenum, titanium, tantalum, niobium, nickel, cobalt, zirconium, ruthenium, rhodium, palladium, osmium, iridium, and silicon; an alloy material containing any of the elements; or a compound material containing any of the elements. The separation layer 113 can also be formed to have a single-layer structure or a stacked-layer structure using any of the materials. Note that the crystalline structure of the separation layer 113 may be amorphous, microcrystalline, or polycrystalline. The separation layer 113 can also be formed using a metal oxide such as aluminum oxide, gallium oxide, zinc oxide, titanium dioxide, indium oxide, indium tin oxide, indium zinc oxide, or InGaZnO (IGZO).

The separation layer 113 can be formed by a sputtering method, a CVD method, a coating method, a printing method, or the like. Note that the coating method includes a spin coating method, a droplet discharge method, and a dispensing method.

In the case where the separation layer 113 has a single-layer structure, the separation layer 113 is preferably formed using tungsten, molybdenum, or a tungsten-molybdenum alloy. Alternatively, the separation layer 113 is preferably formed using an oxide or oxynitride of tungsten, an oxide or oxynitride of molybdenum, or an oxide or oxynitride of a tungsten-molybdenum alloy.

In the case where the separation layer 113 has a stacked-layer structure including, for example, a layer containing tungsten and a layer containing an oxide of tungsten, the layer containing an oxide of tungsten may be formed as follows: the layer containing tungsten is formed first and then an oxide insulating layer is formed in contact therewith, so that the layer containing an oxide of tungsten is formed at the interface between the layer containing tungsten and the oxide insulating layer. Alternatively, the layer containing an oxide of tungsten may be formed by performing thermal oxidation treatment, oxygen plasma treatment, treatment with a highly oxidizing solution such as ozone water, or the like on the surface of the layer containing tungsten.

In this embodiment, a glass substrate is used as the element formation substrate 101. The separation layer 113 is formed of tungsten over the element formation substrate 101 by a sputtering method.

[Formation of Insulating Layer]

Next, the insulating layer 205 is formed as a base layer over the separation layer 113 (see FIG. 6A). The insulating layer 205 is preferably formed as a single layer or a multilayer using silicon oxide, silicon nitride, silicon oxynitride, silicon nitride oxide, aluminum oxide, aluminum oxynitride, aluminum nitride oxide, or the like. The insulating layer 205 may have, for example, a two-layer structure of silicon oxide and silicon nitride or a five-layer structure in which materials selected from the above are combined. The insulating layer 205 can be formed by a sputtering method, a CVD method, a thermal oxidation method, a coating method, a printing method, or the like.

The thickness of the insulating layer 205 may be greater than or equal to 30 nm and less than or equal to 500 nm, preferably greater than or equal to 50 nm and less than or equal to 400 nm.

The insulating layer 205 can prevent or reduce diffusion of impurity elements from the element formation substrate 101, the separation layer 113, or the like. Even after the element formation substrate 101 is replaced by the substrate 111, the insulating layer 205 can prevent or reduce diffusion of impurity elements into the light-emitting element 125 from the substrate 111, the bonding layer 112, or the like. In this embodiment, the insulating layer 205 is formed by stacking a 200-nm-thick silicon oxynitride film and a 50-nm-thick silicon nitride oxide film by a plasma CVD method.

[Formation of Gate Electrode]

Next, the gate electrode 206 is formed over the insulating layer 205 (see FIG. 6A). The gate electrode 206 can be formed using a metal element selected from aluminum, chromium, copper, tantalum, titanium, molybdenum, and tungsten; an alloy containing any of these metal elements as a component; an alloy containing any of these metal elements in combination; or the like. Further, one or more metal elements selected from manganese and zirconium may be used. The gate electrode 206 may have a single-layer structure or a stacked structure of two or more layers. For example, a single-layer structure of an aluminum film containing silicon, a two-layer structure in which an aluminum film is stacked over a titanium film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a two-layer structure in which a copper film is stacked over a titanium film, a three-layer structure in which a titanium film, an aluminum film, and a titanium film are stacked in this order, and the like can be given. Alternatively, a film, an alloy film, or a nitride film which contains aluminum and one or more elements selected from titanium, tantalum, tungsten, molybdenum, chromium, neodymium, and scandium may be used.

The gate electrode 206 can be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. It is also possible to have a stacked-layer structure formed using the above light-transmitting conductive material and the above metal element.

First, a conductive film to be the gate electrode 206 is stacked over the insulating layer 205 by a sputtering method, a CVD method, an evaporation method, or the like, and a resist mask is formed over the conductive film by a photolithography process. Next, part of the conductive film to be the gate electrode 206 is etched with the use of the resist mask to form the gate electrode 206. At the same time, a wiring and another electrode can be formed.

The conductive film may be etched by a dry etching method, a wet etching method, or both a dry etching method and a wet etching method. Note that in the case where the conductive film is etched by a dry etching method, ashing treatment may be performed before the resist mask is removed, whereby the resist mask can be easily removed using a stripper.

Note that the gate electrode 206 may be formed by an electrolytic plating method, a printing method, an inkjet method, or the like instead of the above formation method.

The thickness of the gate electrode 206 is greater than or equal to 5 nm and less than or equal to 500 nm, preferably greater than or equal to 10 nm and less than or equal to 300 nm, more preferably greater than or equal to 10 nm and less than or equal to 200 nm.

The gate electrode 206 may be formed using a light-blocking conductive material, whereby external light can be prevented from reaching the semiconductor layer 208 from the gate electrode 206 side. As a result, a variation in electrical characteristics of the transistor due to light irradiation can be suppressed.

[Formation of Gate Insulating Layer]

Next, the gate insulating layer 207 is formed (see FIG. 6A). The gate insulating layer 207 can be formed to have a single-layer structure or a stacked-layer structure using, for example, any of silicon oxide, silicon oxynitride, silicon nitride oxide, silicon nitride, aluminum oxide, a mixture of aluminum oxide and silicon oxide, hafnium oxide, gallium oxide, Ga—Zn-based metal oxide, and the like.

The gate insulating layer 207 may be formed using a high-k material such as hafnium silicate (HfSiO$_x$), hafnium silicate to which nitrogen is added (HfSi$_x$O$_y$N$_z$), hafnium aluminate to which nitrogen is added (HfAl$_x$O$_y$N$_z$), hafnium oxide, or yttrium oxide, so that gate leakage current of the transistor can be reduced. For example, a stacked layer of silicon oxynitride and hafnium oxide may be used.

The thickness of the gate insulating layer 207 is preferably greater than or equal to 5 nm and less than or equal to 400 nm, further preferably greater than or equal to 10 nm and less than or equal to 300 nm, still further preferably greater than or equal to 50 nm and less than or equal to 250 nm.

The gate insulating layer 207 can be formed by a sputtering method, a CVD method, an evaporation method, or the like.

In the case where a silicon oxide film, a silicon oxynitride film, or a silicon nitride oxide film is formed as the gate insulating layer 207, a deposition gas containing silicon and an oxidizing gas are preferably used as a source gas. Typical examples of the deposition gas containing silicon include silane, disilane, trisilane, and silane fluoride. As the oxidizing gas, oxygen, ozone, dinitrogen monoxide, nitrogen dioxide, and the like can be given as examples.

The gate insulating layer 207 can have a stacked-layer structure in which a nitride insulating layer and an oxide insulating layer are stacked in this order from the gate electrode 206 side. When the nitride insulating layer is provided on the gate electrode 206 side, hydrogen, nitrogen, an alkali metal, an alkaline earth metal, or the like can be prevented from moving from the gate electrode 206 side to the semiconductor layer 208. Note that nitrogen, an alkali metal, an alkaline earth metal, or the like generally serves as an impurity element of a semiconductor. In addition, hydrogen serves as an impurity element of an oxide semiconductor. Thus, an "impurity" in this specification and the like includes hydrogen, nitrogen, an alkali metal, an alkaline earth metal, or the like.

In the case where an oxide semiconductor is used for the semiconductor layer 208, the density of defect states at the interface between the gate insulating layer 207 and the semiconductor layer 208 can be reduced by providing the oxide insulating layer on the semiconductor layer 208 side. Consequently, a transistor whose electrical characteristics are hardly degraded can be obtained. Note that in the case where an oxide semiconductor is used for the semiconductor layer 208, an oxide insulating layer containing oxygen in a proportion higher than that in the stoichiometric composition is preferably formed as the oxide insulating layer. This is because the density of defect states at the interface between the gate insulating layer 207 and the semiconductor layer 208 can be further reduced.

In the case where the gate insulating layer 207 is a stacked layer of a nitride insulating layer and an oxide insulating layer as described above, it is preferable that the nitride insulating layer be thicker than the oxide insulating layer.

The nitride insulating layer has a dielectric constant higher than that of the oxide insulating layer; therefore, an electric field generated from the gate electrode 206 can be efficiently transmitted to the semiconductor layer 208 even when the gate insulating layer 207 has a large thickness. When the gate insulating layer 207 has a large total thickness, the withstand voltage of the gate insulating layer 207 can be increased. Accordingly, the reliability of the semiconductor device can be improved.

The gate insulating layer 207 can have a stacked-layer structure in which a first nitride insulating layer with few defects, a second nitride insulating layer with a high blocking property against hydrogen, and an oxide insulating layer are stacked in that order from the gate electrode 206 side. When the first nitride insulating layer with few defects is used in the gate insulating layer 207, the withstand voltage of the gate insulating layer 207 can be improved. Particularly when an oxide semiconductor is used for the semiconductor layer 208, the use of the second nitride insulating layer with a high blocking property against hydrogen in the gate insulating layer 207 makes it possible to prevent hydrogen contained in the gate electrode 206 and the first nitride insulating layer from moving to the semiconductor layer 208.

An example of a method for forming the first and second nitride insulating layers is described below. First, a silicon nitride film with few defects is formed as the first nitride insulating layer by a plasma CVD method in which a mixed gas of silane, nitrogen, and ammonia is used as a source gas. Next, a silicon nitride film in which the hydrogen concentration is low and hydrogen can be blocked is formed as the second nitride insulating layer by switching the source gas to a mixed gas of silane and nitrogen. By such a formation method, the gate insulating layer 207 in which nitride insulating layers with few defects and a blocking property against hydrogen are stacked can be formed.

The gate insulating layer 207 can have a stacked-layer structure in which a third nitride insulating layer with a high blocking property against an impurity, the first nitride insulating layer with few defects, the second nitride insulating layer with a high blocking property against hydrogen, and the oxide insulating layer are stacked in that order from the gate electrode 206 side. When the third nitride insulating layer with a high blocking property against an impurity is provided in the gate insulating layer 207, hydrogen, nitrogen, alkali metal, alkaline earth metal, or the like, can be prevented from moving from the gate electrode 206 to the semiconductor layer 208.

An example of a method for forming the first to third nitride insulating layers is described below. First, a silicon nitride film with a high blocking property against an impurity is formed as the third nitride insulating layer by a plasma CVD method in which a mixed gas of silane, nitrogen, and ammonia is used as a source gas. Next, a silicon nitride film with few defects is formed as the first nitride insulating layer by increasing the flow rate of ammonia. Then, a silicon nitride film in which the hydrogen concentration is low and hydrogen can be blocked is formed as the second nitride insulating layer by switching the source gas to a mixed gas of silane and nitrogen. By such a formation method, the gate insulating layer 207 in which nitride insulating layers with few defects and a blocking properly against an impurity are stacked can be formed.

Moreover, in the case of forming a gallium oxide film as the gate insulating layer 207, a metal organic chemical vapor deposition (MOCVD) method can be employed.

Note that the threshold voltage of a transistor can be changed by stacking the semiconductor layer 208 in which a channel of the transistor is formed and an insulating layer containing hafnium oxide with an oxide insulating layer provided therebetween and injecting electrons into the insulating layer containing hafnium oxide.

[Formation of Semiconductor Layer]

The semiconductor layer 208 can be formed using an amorphous semiconductor, a microcrystalline semiconductor, a polycrystalline semiconductor, or the like. For example, amorphous silicon or microcrystalline germanium can be used. Alternatively, a compound semiconductor such as silicon carbide, gallium arsenide, an oxide semiconductor, or a nitride semiconductor, an organic semiconductor, or the like can be used.

In the case of using an organic semiconductor for the semiconductor layer 208, a low molecular organic material having an aromatic ring, a π-electron conjugated conductive polymer, or the like can be used. For example, rubrene, tetracene, pentacene, polylenediimide, tetracyanoquinodimethane, polythiophene, polyacetylene, or polyparaphenylene vinylene can be used.

In the case of using an oxide semiconductor for the semiconductor layer 208, a c-axis aligned crystalline oxide semiconductor (CAAC-OS), a polycrystalline oxide semiconductor, a microcrystalline oxide semiconductor, a nanocrystalline oxide semiconductor (nc-OS), an amorphous oxide semiconductor, or the like can be used.

Note that an oxide semiconductor has an energy gap as wide as 3.0 eV or more and high visible-light transmissivity. In a transistor obtained by processing an oxide semiconductor under appropriate conditions, the off-state current at ambient temperature (e.g., 25° C.) can be less than or equal to 100 zA ($1\times10^{-19}$ A), less than or equal to 10 zA ($1\times10^{-20}$ A), and further less than or equal to 1 zA ($1\times10^{-21}$ A). Therefore, a display device with low power consumption can be provided.

In the case where an oxide semiconductor is used for the semiconductor layer 208, an insulating layer containing oxygen is preferably used as an insulating layer that is in contact with the semiconductor layer 208.

The thickness of the semiconductor layer 208 is greater than or equal to 3 nm and less than or equal to 200 nm, preferably greater than or equal to 3 nm and less than or equal to 100 nm, more preferably greater than or equal to 3 nm and less than or equal to 50 nm. In this embodiment, as the semiconductor layer 208, an oxide semiconductor film with a thickness of 30 nm is formed by a sputtering method.

Next, a resist mask is formed over the oxide semiconductor film, and part of the oxide semiconductor film is selectively etched using the resist mask to form the semiconductor layer 208. The resist mask can be formed by a photolithography method, a printing method, an inkjet method, or the like as appropriate. Formation of the resist mask by an inkjet method needs no photomask; thus, fabrication cost can be reduced.

Note that the etching of the oxide semiconductor film may be performed by either one or both of a dry etching method and a wet etching method. After the etching of the oxide semiconductor film, the resist mask is removed (see FIG. 6B).

[Formation of Source Electrode, Drain Electrode, and the Like]

Figure 6C:
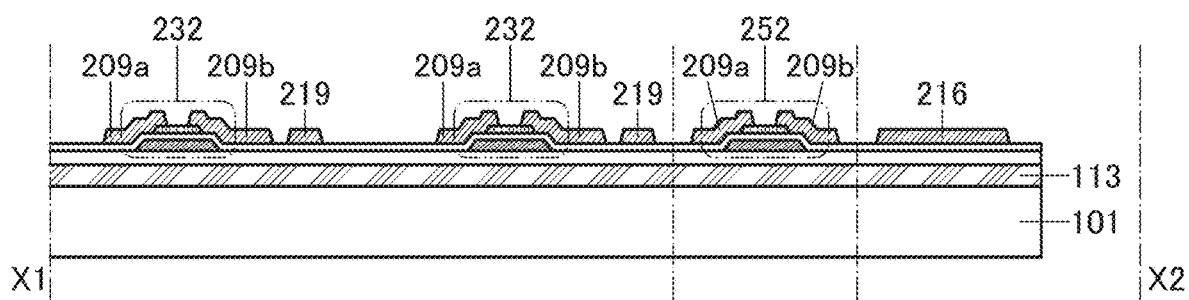

Next, the source electrode 209a, the drain electrode 209b, the wiring 219, and the terminal electrode 216 are formed (see FIG. 6C). First, a conductive film is formed over the gate insulating layer 207 and the semiconductor layer 208.

The conductive film can have a single-layer structure or a stacked-layer structure containing any of metals such as aluminum, titanium, chromium, nickel, copper, yttrium, zirconium, molybdenum, silver, tantalum, and tungsten or an alloy containing any of these metals as its main component. For example, the following structures can be given: a single-layer structure of an aluminum film containing silicon, a two-layer structure in which an aluminum film is stacked over a titanium film, a two-layer structure in which an aluminum film is stacked over a tungsten film, a two-layer structure in which a copper film is stacked over a copper-magnesium-aluminum alloy film, a two-layer structure in which a copper film is stacked over a titanium film, a two-layer structure in which a copper film is stacked over a tungsten film, a three-layer structure in which a titanium film or a titanium nitride film, an aluminum film or a copper film, and a titanium film or a titanium nitride film are stacked in this order, a three-layer structure in which a molybdenum film or a molybdenum nitride film, an aluminum film or a copper film, and a molybdenum film or a molybdenum nitride film are stacked in this order, and a three-layer structure in which a tungsten film, a copper film, and a tungsten film are stacked in this order.

Note that a conductive material containing oxygen such as indium tin oxide, zinc oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added, or a conductive material containing nitrogen such as titanium nitride or tantalum nitride may be used. It is also possible to use a stacked-layer structure formed using a material containing the above metal element and conductive material containing oxygen. It is also possible to use a stacked-layer structure formed using a material containing the above metal element and a conductive material containing nitrogen. It is also possible to use a stacked-layer structure formed using a material containing the above metal element, a conductive material containing oxygen, and a conductive material containing nitrogen.

The thickness of the conductive film is greater than or equal to 5 nm and less than or equal to 500 nm, preferably greater than or equal to 10 nm and less than or equal to 300 nm, more preferably greater than or equal to 10 nm and less than or equal to 200 nm. In this embodiment, a 300-nm-thick tungsten film is formed as the conductive film.

Then, part of the conductive film is selectively etched using a resist mask to form the source electrode 209a, the drain electrode 209b, the wiring 219, and the terminal electrode 216 (including other electrodes and wirings formed using the same film). The resist mask can be formed by a photolithography method, a printing method, an inkjet method, or the like as appropriate. Formation of the resist mask by an inkjet method needs no photomask; thus, fabrication cost can be reduced.

The conductive film may be etched by a dry etching method, a wet etching method, or both a dry etching method and a wet etching method. Note that an exposed portion of the semiconductor layer 208 is removed by the etching step in some cases. After the etching of the conductive film, the resist mask is removed.

[Formation of Insulating Layer]

Figure 6D:
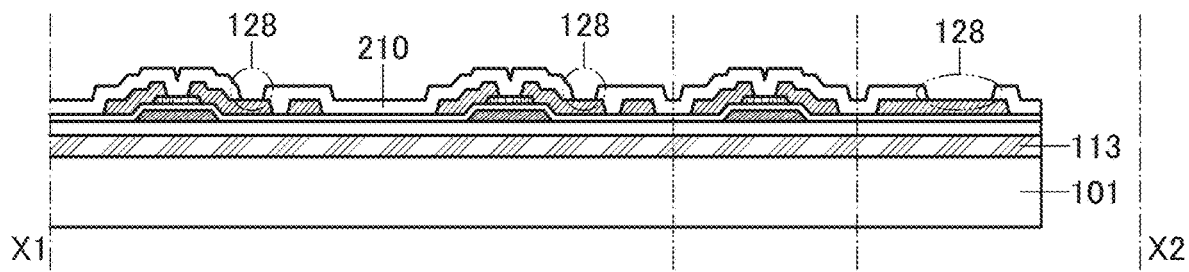

Next, the insulating layer 210 is formed over the source electrode 209a, the drain electrode 209b, the wiring 219, and the terminal electrode 216 (see FIG. 6D). The insulating layer 210 can be formed using a material and a method similar to those of the insulating layer 205.

In the case where an oxide semiconductor is used for the semiconductor layer 208, an insulating layer containing oxygen is preferably used for at least part of the insulating layer 210 that is in contact with the semiconductor layer 208. For example, in the case where the insulating layer 210 is a stack of a plurality of layers, at least a layer that is in contact with the semiconductor layer 208 is preferably formed using silicon oxide.

[Formation of Opening]

Next, part of the insulating layer 210 is selectively etched using a resist mask to form an opening 128 (see FIG. 6D). At the same time, another opening that is not illustrated is also formed. The resist mask can be formed by a photolithography method, a printing method, an inkjet method, or the like as appropriate. Formation of the resist mask by an inkjet method needs no photomask; thus, fabrication cost can be reduced.

The insulating layer 210 may be etched by a dry etching method, a wet etching method, or both a dry etching method and a wet etching method.

The drain electrode 209b and the terminal electrode 216 are partly exposed by the formation of the opening 128. The resist mask is removed after the formation of the opening 128.

[Formation of Planarization Film]

Figure 7A:
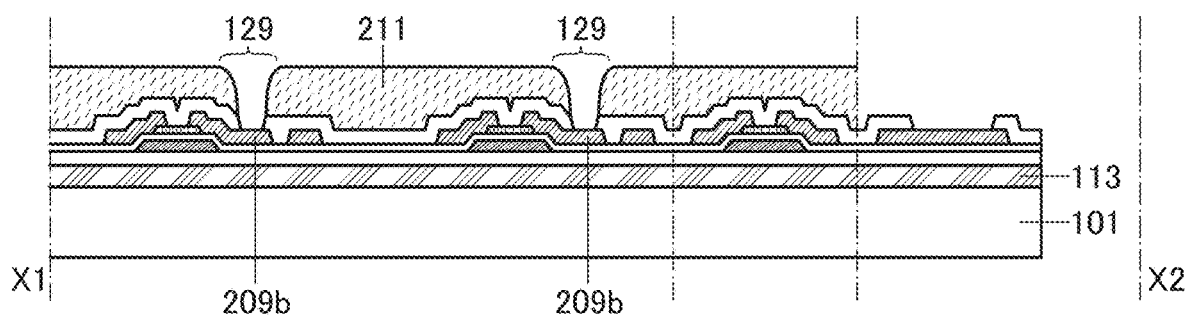
FIGS. 7A to 7D are cross-sectional views illustrating one example of a method for manufacturing a display device.

Next, the insulating layer 211 is formed over the insulating layer 210 (see FIG. 7A). The insulating layer 211 can be formed using a material and a method similar to those of the insulating layer 205.

Planarization treatment may be performed on the insulating layer 211 to reduce unevenness of a surface on which the light-emitting element 125 is formed. The planarization treatment may be, but not particularly limited to, polishing treatment (e.g., chemical mechanical polishing (CMP)) or dry etching treatment.

Forming the insulating layer 211 using an insulating material with a planarization function can make polishing treatment unnecessary. As the insulating material with a planarization function, for example, an organic material such as a polyimide resin or an acrylic resin can be used. Besides such organic materials, a low-dielectric constant material (a low-k material) or the like can be used. Note that the insulating layer 211 may be formed by stacking a plurality of insulating layers formed of any of these materials.

Part of the insulating layer 211 that overlaps with the opening 128 is removed to form an opening 129. At the same time, another opening that is not illustrated is also formed. In addition, the insulating layer 211 in a region to which the external electrode 124 is connected later is removed. Note that the opening 129 or the like can be formed in such a manner that a resist mask is formed by a photolithography process over the insulating layer 211 and a region of the insulating layer 211 that is not covered with the resist mask is etched. A surface of the drain electrode 209b is exposed by the formation of the opening 129.

When the insulating layer 211 is formed using a photosensitive material, the opening 129 can be formed without the resist mask. In this embodiment, a photosensitive polyimide resin is used to form the insulating layer 211 and the opening 129.

[Formation of Anode]

Figure 7B:
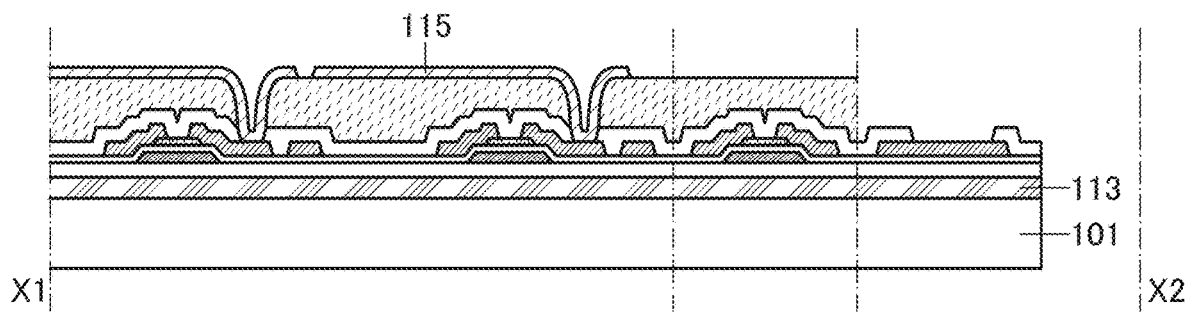

Next, the electrode 115 is formed over the insulating layer 211 (see FIG. 7B). The electrode 115 is preferably formed using a conductive material that efficiently reflects light emitted from the EL layer 117 formed later. Note that the electrode 115 may have a stacked-layer structure of a plurality of layers without limitation to a single-layer structure. For example, in the case where the electrode 115 is used as an anode, a layer in contact with the EL layer 117 may be a light-transmitting layer, such as an indium tin oxide layer, having a work function higher than that of the EL layer 117, and a layer having high reflectance (e.g., aluminum, an alloy containing aluminum, or silver) may be provided in contact with the layer.

Note that although the display device having a top-emission structure is described as an example in this embodiment, a display device having a bottom-emission structure or a dual-emission structure may be used.

In the case where the display device 100 has a bottom-emission structure or a dual-emission structure, the electrode 115 is preferably formed using a light-transmitting conductive material.

The electrode 115 can be formed in such a manner that a conductive film to be the electrode 115 is formed over the insulating layer 211, a resist mask is formed over the conductive film, and a region of the conductive film that is not covered with the resist mask is etched. The conductive film can be etched by a dry etching method, a wet etching method, or both a dry etching method and a wet etching method. The resist mask can be formed by a photolithography method, a printing method, an inkjet method, or the like as appropriate. Formation of the resist mask by an inkjet method needs no photomask; thus, fabrication cost can be reduced. The resist mask is removed after the formation of the electrode 115.

[Formation of Partition]

Figure 7C:
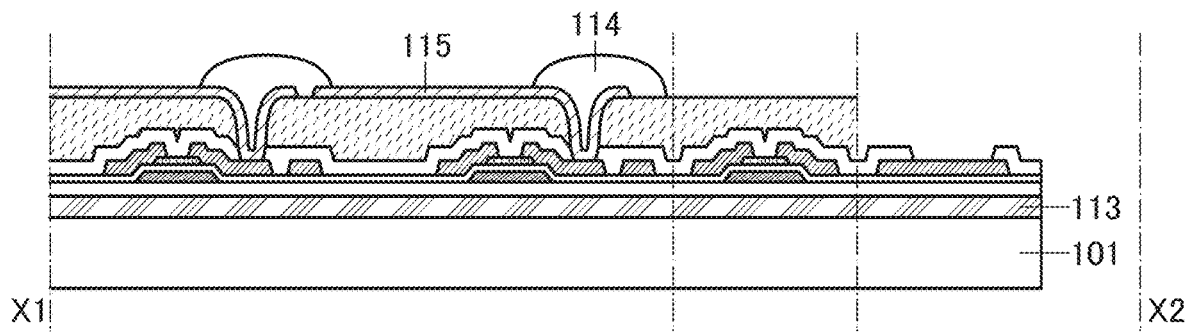
Figure 7D:
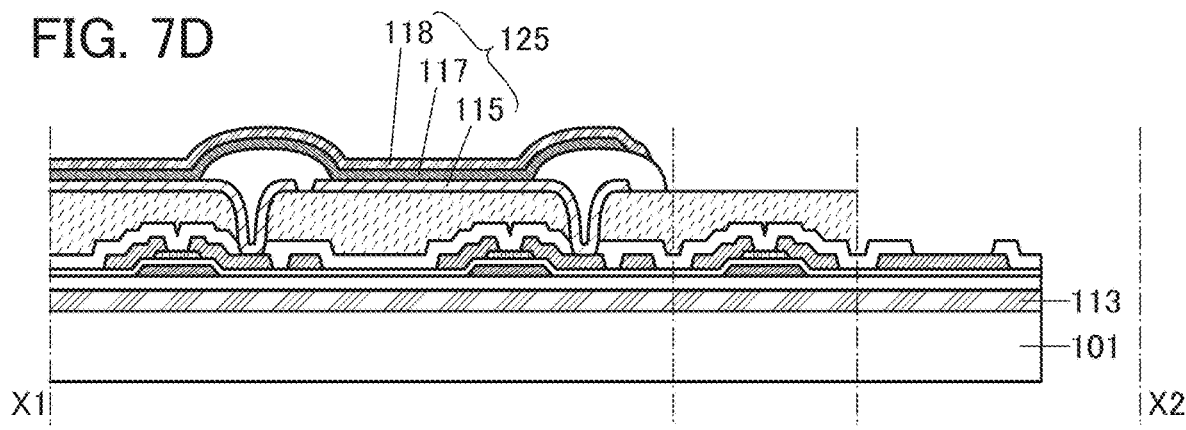

Next, the partition 114 is formed (see FIG. 7C). The partition 114 is provided in order to prevent an unintended electrical short-circuit between light-emitting elements 125 in adjacent pixels and unintended light emission from the light-emitting element 125. In the case of using a metal mask for formation of the EL layer 117 described later, the partition 114 has a function of preventing the contact of the metal mask with the electrode 115. The partition 114 can be formed of an organic resin material such as an epoxy resin, an acrylic resin, or an imide resin or an inorganic material such as silicon oxide. The partition 114 is preferably formed so that its sidewall has a tapered shape or a tilted surface with a continuous curvature. The sidewall of the partition 114 having the above-described shape enables favorable coverage with the EL layer 117 and the electrode 118 formed later.

[Formation of EL Layer]

A structure of the EL layer 117 is described in Embodiment 6.

[Formation of Cathode]

The electrode 118 is used as a cathode in this embodiment, and thus is preferably formed using a material that has a low work function and can inject electrons into the EL layer 117 described later. As well as a single-layer of a metal having a low work function, a stack in which a metal material such as aluminum, a conductive oxide material such as indium tin oxide, or a semiconductor material is formed over a several-nanometer-thick buffer layer formed of an alkali metal or an alkaline earth metal having a low work function may be used as the electrode 118.

In the case where light emitted from the EL layer 117 is extracted through the electrode 118, the electrode 118 preferably has a property of transmitting visible light. The light-emitting element 125 includes the electrode 115, the EL layer 117, and the electrode 118 (see FIG. 7D).

[Formation of Counter Element Formation Substrate]

Figure 8A:
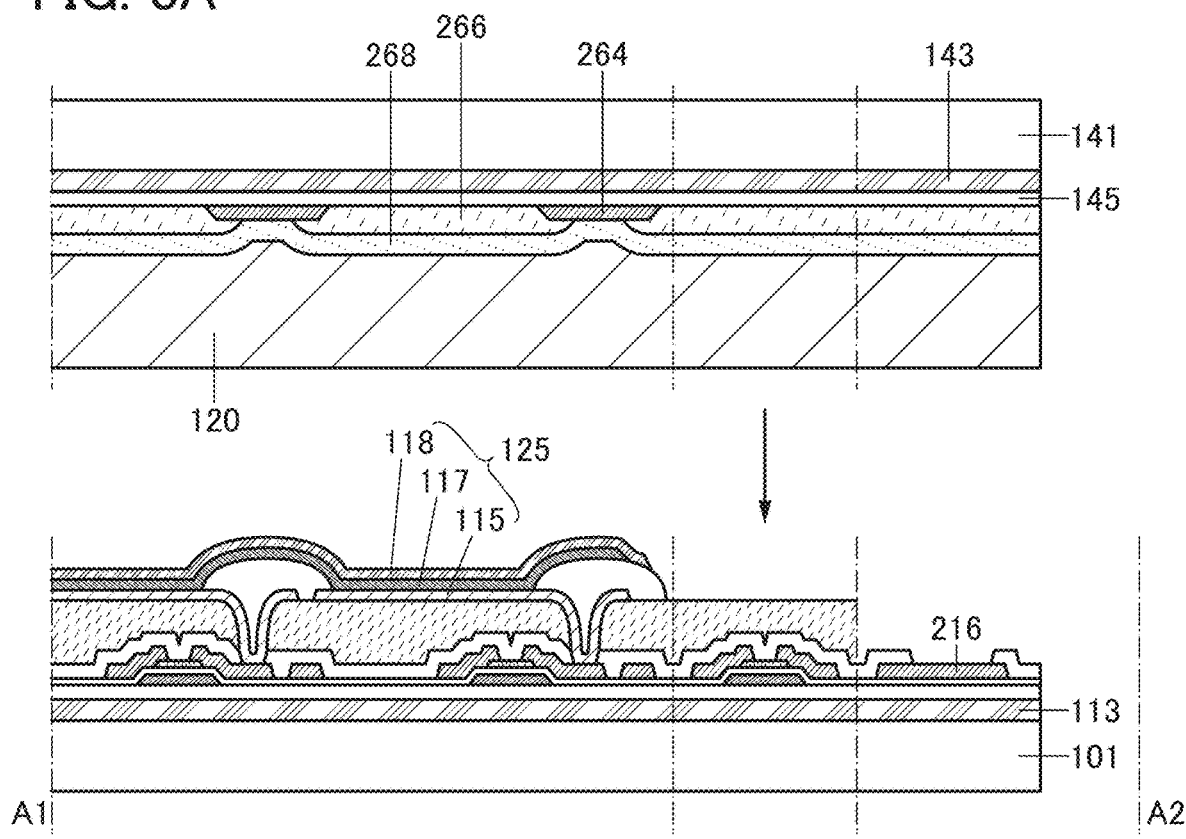
FIGS. 8A and 8B are cross-sectional views illustrating one example of a method for manufacturing a display device.

An element formation substrate 141 provided with the light-blocking layer 264, the coloring layer 266, the overcoat layer 268, the insulating layer 145, and a separation layer 143 is formed over the element formation substrate 101 with the bonding layer 120 therebetween (see FIG. 8A). Note that the element formation substrate 141 is formed to face the element formation substrate 101 and may thus be called a "counter element formation substrate". A structure of the element formation substrate 141 (counter element formation substrate) is described later.

The element formation substrate 141 is fixed over the element formation substrate 101 by the bonding layer 120. A light curable adhesive, a reactive curable adhesive, a thermosetting adhesive, or an anaerobic adhesive can be used as the bonding layer 120. For example, an epoxy resin, an acrylic resin, or an imide resin can be used. In a top-emission structure, a drying agent (e.g., zeolite) having a size less than or equal to the wavelength of light or a filler (e.g., titanium oxide or zirconium) with a high refractive index is preferably mixed into the bonding layer 120, in which case the efficiency of extracting light emitted from the EL layer 117 can be improved.

[Separation of Element Formation Substrate from Insulating Layer]

Figure 8B:
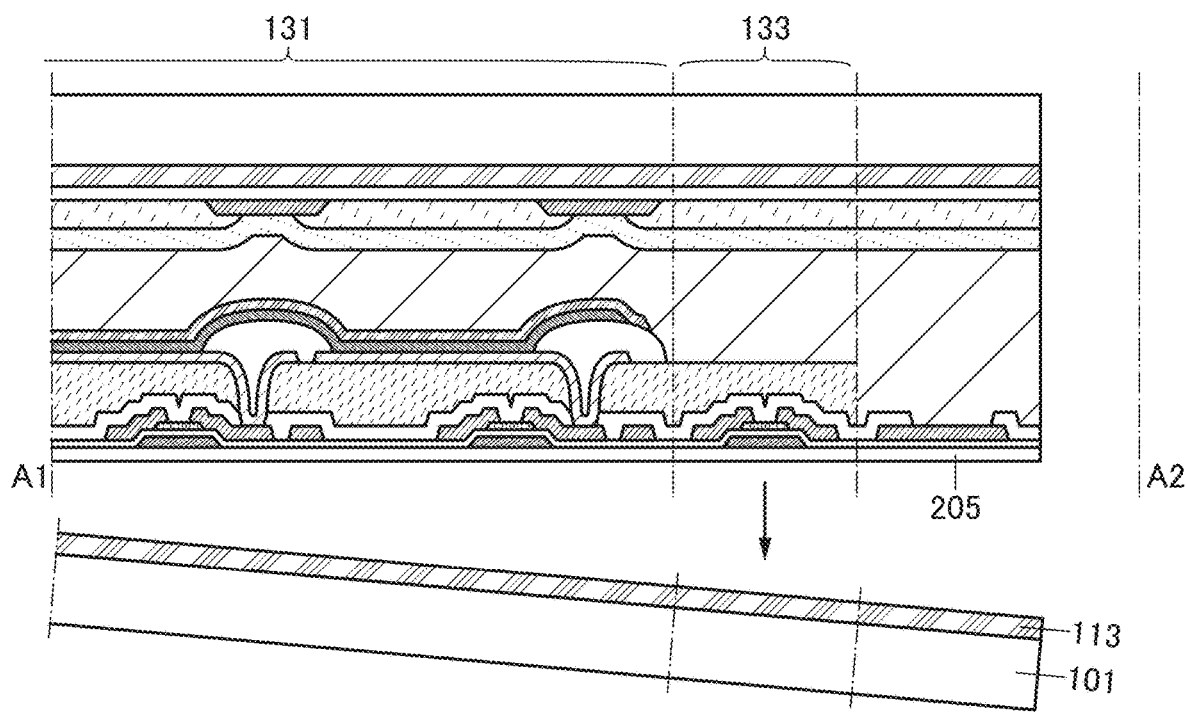

Next, the element formation substrate 101 attached to the insulating layer 205 with the separation layer 113 therebetween is separated from the insulating layer 205 (see FIG. 8B). As a separation method, mechanical force (a separation process with a human hand or a gripper, a separation process by rotation of a roller, ultrasonic waves, or the like) may be used. For example, a cut is made in the separation layer 113 with a sharp edged tool, by laser light irradiation, or the like and water is injected into the cut. Alternatively, the cut is sprayed with a mist of water. A portion between the separation layer 113 and the insulating layer 205 absorbs water through capillarity action, so that the element formation substrate 101 can be separated easily from the insulating layer 205.

[Bonding of Substrate]

Figure 9A:
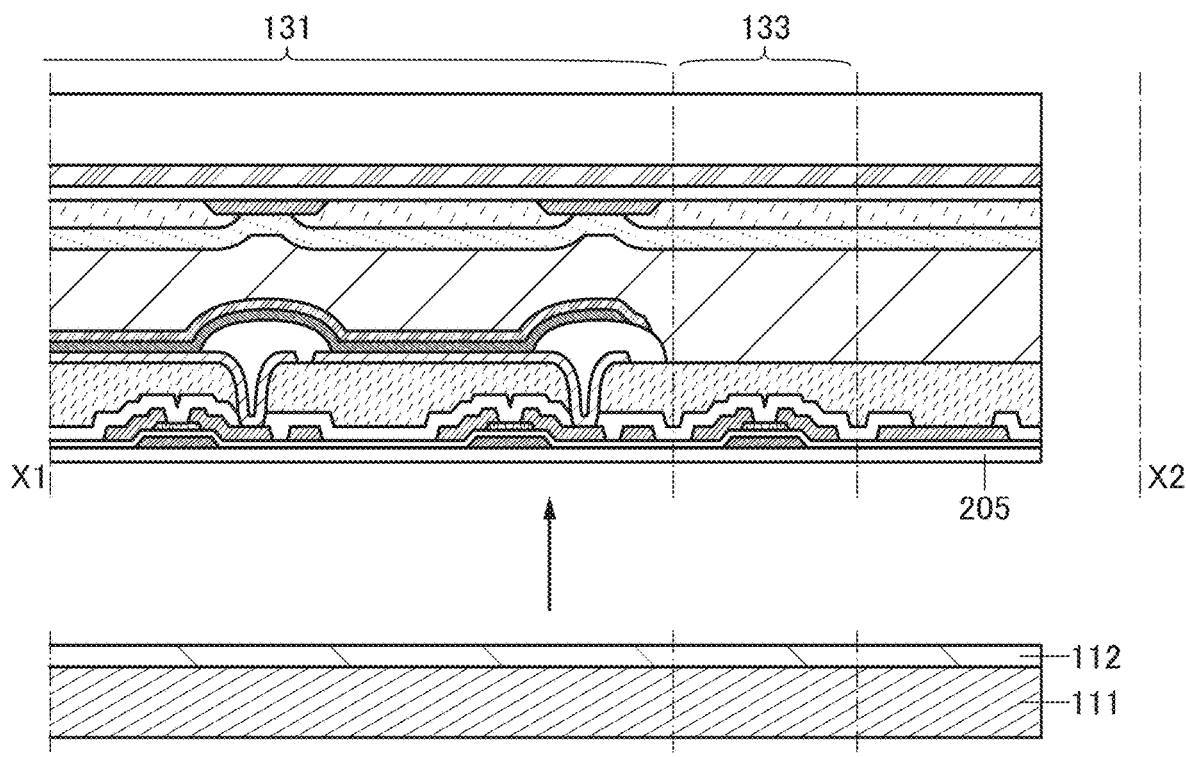
FIGS. 9A and 9B are cross-sectional views illustrating one example of a method for manufacturing a display device.
Figure 9B:
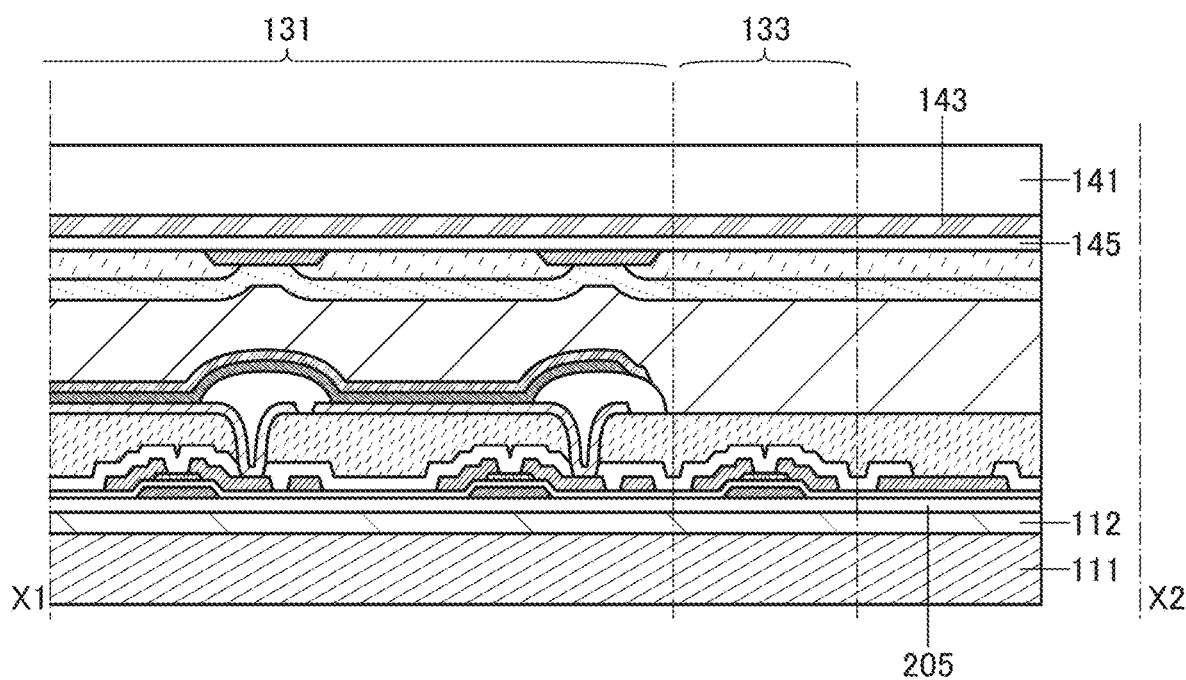

Next, the substrate 111 is attached to the insulating layer 205 with the bonding layer 112 therebetween (see FIGS. 9A and 9B). The bonding layer 112 can be formed using a material similar to that of the bonding layer 120. In this embodiment, a 20-μm-thick aramid (polyamide resin) with a Young's modulus of 10 GPa is used for the substrate 111.

[Separation of Counter Element Formation Substrate from Insulating Layer]

Figure 10A:
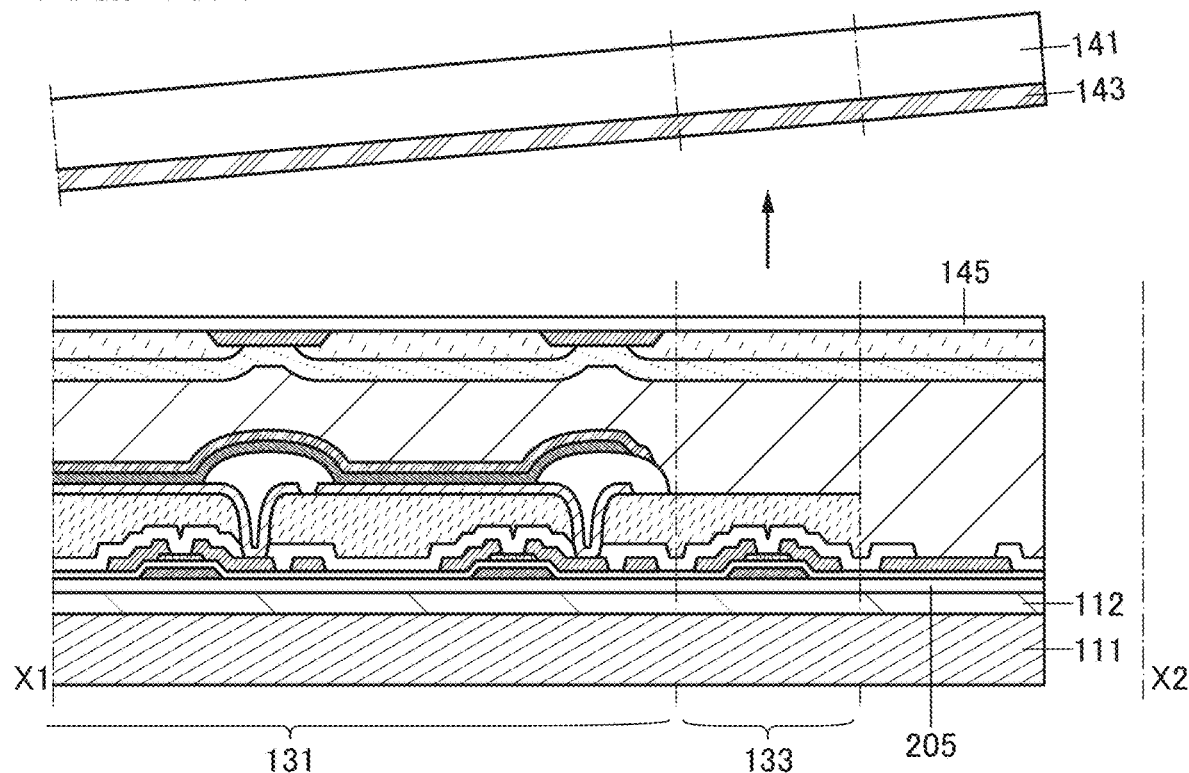
FIGS. 10A and 10B are cross-sectional views illustrating one example of a method for manufacturing a display device.

Next, the element formation substrate 141 overlapping with the insulating layer 145 with the separation layer 143 therebetween is separated from the insulating layer 145 (see FIG. 10A). The element formation substrate 141 can be separated in a manner similar to that of the above-described separation method of the element formation substrate 101.

[Bonding of Substrate]

Figure 10B:
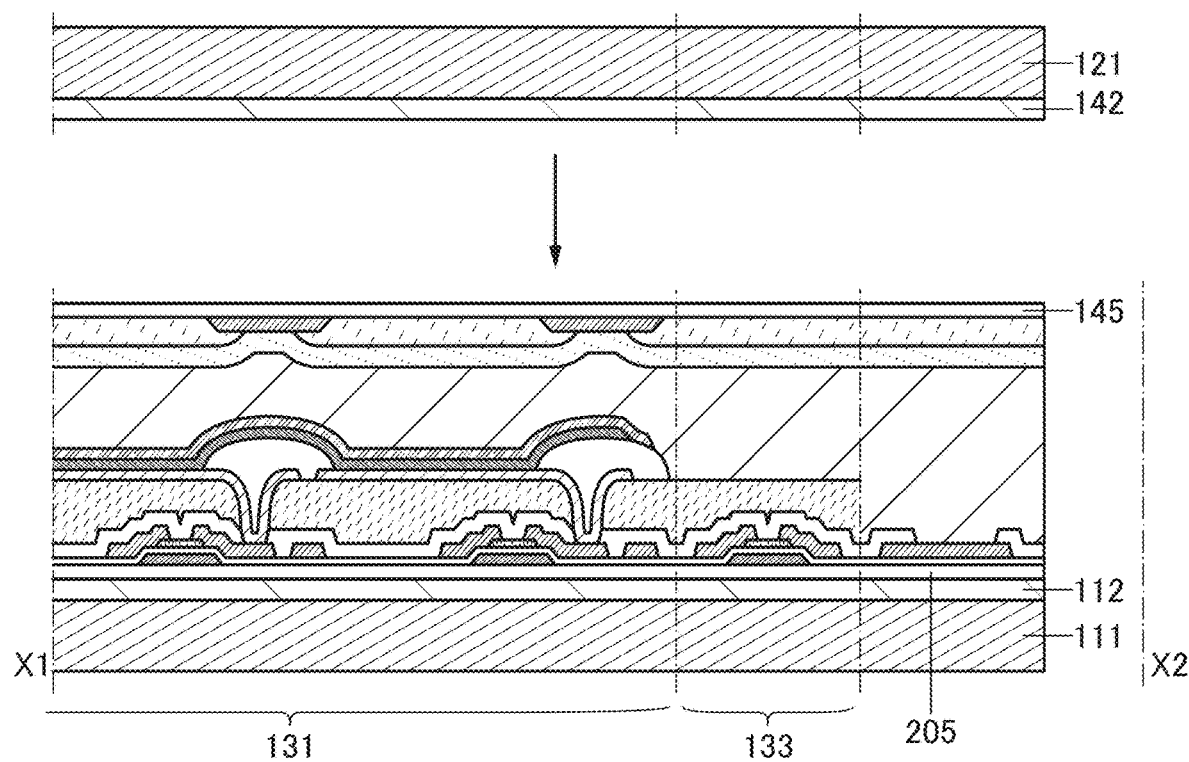

Next, the substrate 121 is attached to the insulating layer 145 with the bonding layer 142 therebetween (see FIG. 10B). The bonding layer 142 can be formed using a material similar to that of the bonding layer 120. The substrate 121 can be formed using a material similar to that of the substrate 111.

[Formation of Opening]

Figure 11A:
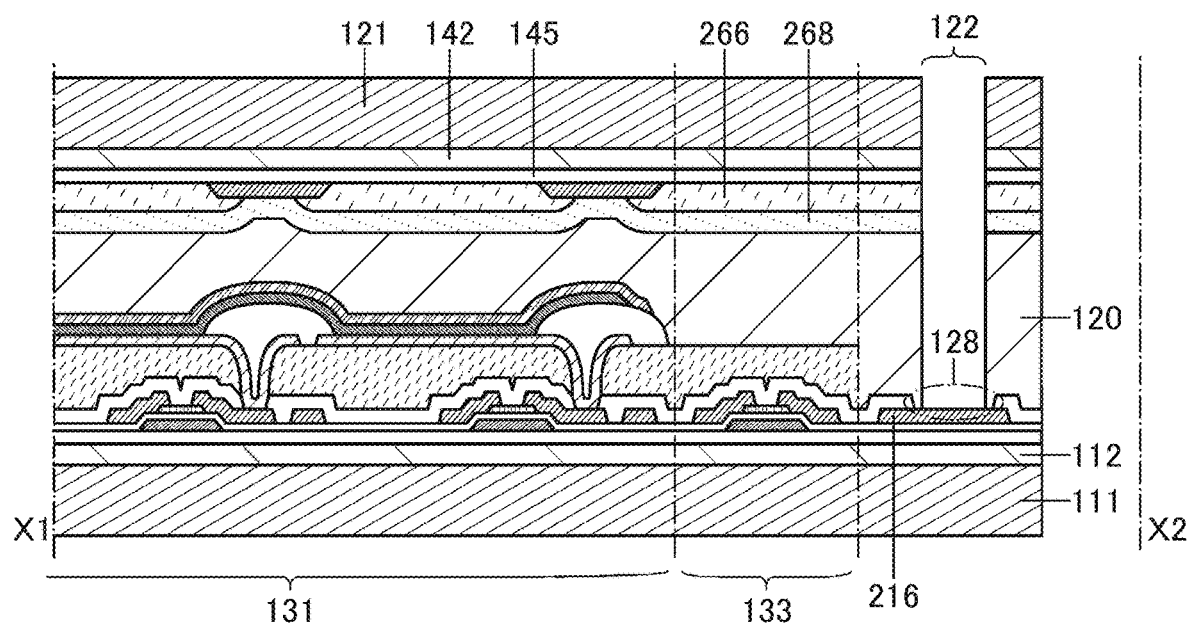
FIGS. 11A and 11B are cross-sectional views illustrating one example of a method for manufacturing a display device.

Next, the substrate 121, the bonding layer 142, the insulating layer 145, the coloring layer 266, the overcoat layer 268, and the bonding layer 120 in a region overlapping with the terminal electrode 216 and the opening 128 are removed to form the opening 122 (see FIG. 11A). A surface of the terminal electrode 216 is partly exposed by the formation of the opening 122.

[Formation of External Electrode]

Figure 11B:
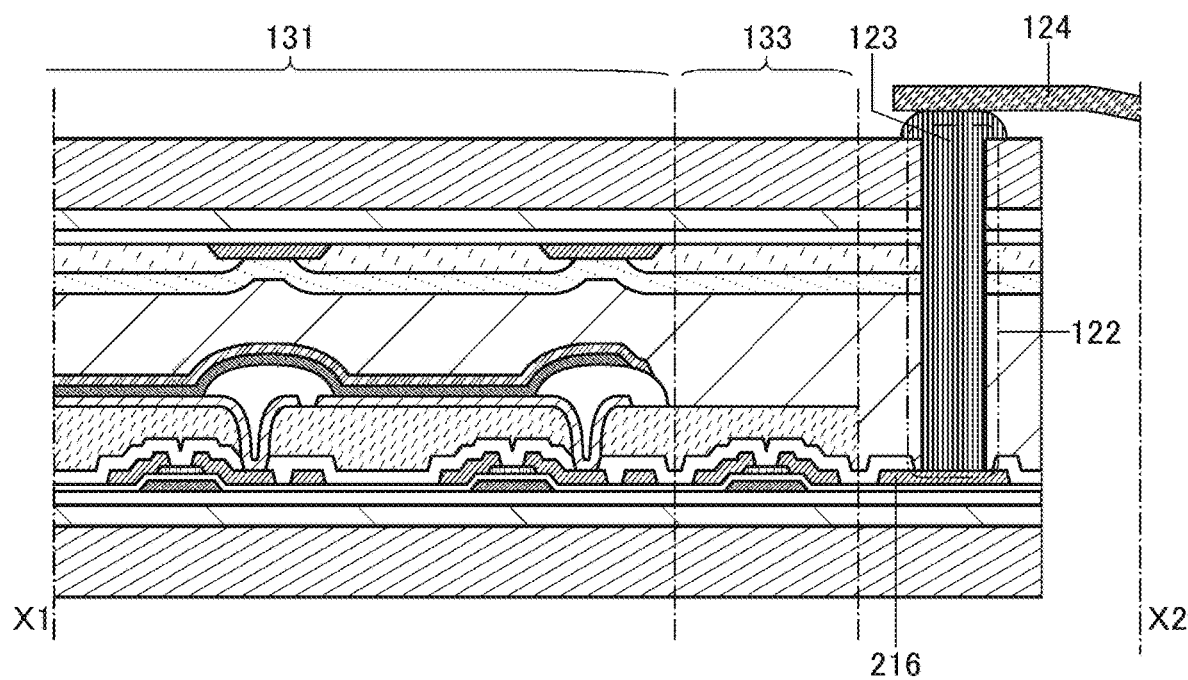
Figure 12:
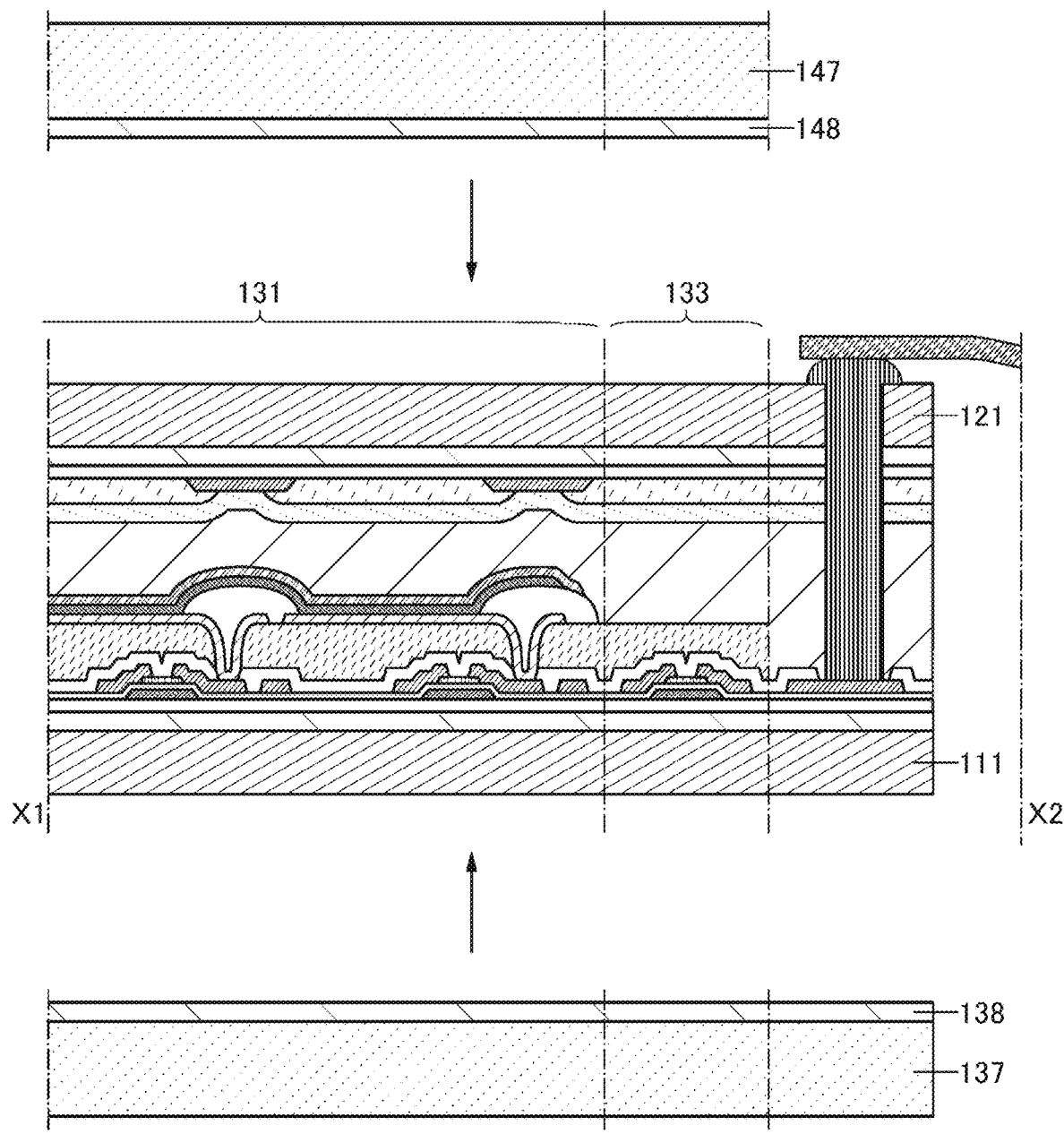
FIG. 12 is a cross-sectional view illustrating one example of a method for manufacturing a display device.

Next, the anisotropic conductive connection layer 123 is formed in and on the opening 122, and the external electrode 124 for inputting electric power or a signal to the display device 100 is formed over the anisotropic conductive connection layer 123 (see FIG. 11B). The terminal electrode 216 is electrically connected to the external electrode 124 through the anisotropic conductive connection layer 123. For example, a flexible printed circuit (FPC) can be used as the external electrode 124.

The anisotropic conductive connection layer 123 can be formed using any of various anisotropic conductive films (ACF), anisotropic conductive pastes (ACP), and the like.

The anisotropic conductive connection layer 123 is formed by curing a paste-form or sheet-form material that is obtained by mixing conductive particles to a thermosetting resin or a thermosetting, light curable resin. The anisotropic conductive connection layer 123 exhibits alp anisotropic conductive property by light irradiation or thermocompression bonding. As the conductive particles used for the anisotropic conductive connection layer 123, for example, particles of a spherical organic resin coated with a thin-film metal such as Au, Ni, or Co can be used.

[Bonding of Substrates]

Then, the substrate 137 is bonded to the substrate 111 with the bonding layer 138 provided therebetween. The substrate 147 is bonded to the substrate 121 with the bonding layer 148 provided therebetween (see FIG. 12). The bonding layers 138 and 148 can be formed using a material similar to that of the bonding layer 120. In this embodiment, for the substrate 137 and the substrate 147, silicone rubber that has a light-transmitting property with respect to visible light, a thickness of 200 μm, and a Young's modulus of 0.03 GPa is used.

[Components Formed Over Counter Element Formation Substrate]

Next, components, such as the light-blocking layer 264, formed over the element formation substrate 141 are described with reference to FIGS. 13A to 13D.

First, the element formation substrate 141 is prepared. The element formation substrate 141 can be formed using a material similar to that of the element formation substrate 101. Then, the separation layer 143 and the insulating layer 145 are formed over the element formation substrate 141 (see FIG. 13A). The separation layer 143 can be formed using a material and a method similar to those of the separation layer 113. The insulating layer 145 can be formed using a material and a method similar to those of the insulating layer 205.

Figure 13A:
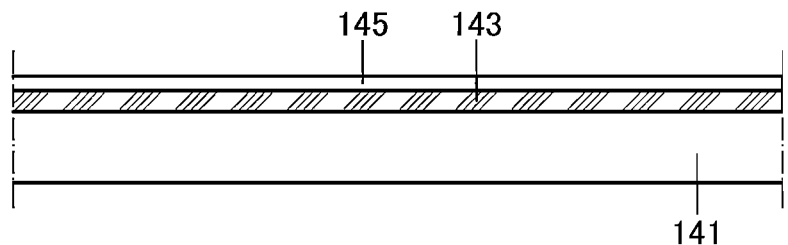
FIGS. 13A to 13D are cross-sectional views illustrating one example of a method for manufacturing a display device.
Figure 13B:
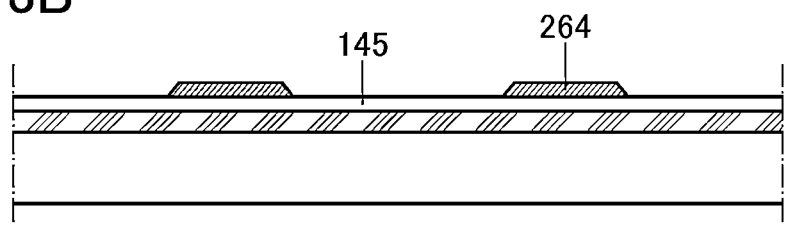
Figure 13C:
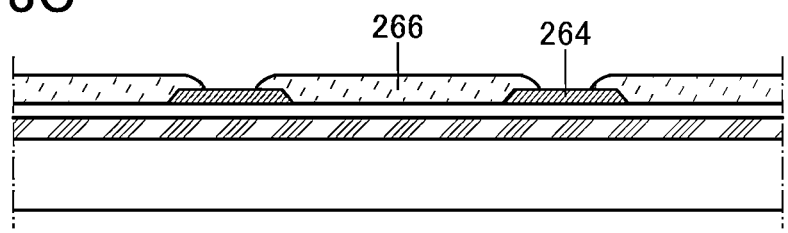

Next, the light-blocking layer 264 is formed over the insulating layer 145 (see FIG. 13B). After that, the coloring layer 266 is formed (see FIG. 13C).

The light-blocking layer 264 and the coloring layer 266 each are formed in a desired position with any of various materials by a printing method, an inkjet method, a photolithography method, or the like.

Figure 13D:
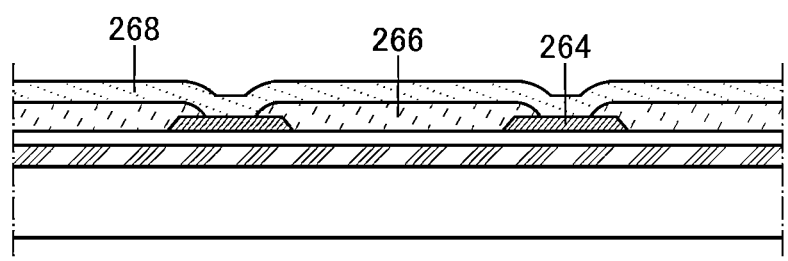

Next, the overcoat layer 268 is formed over the light-blocking layer 264 and the coloring layer 266 (see FIG. 13D).

For the overcoat layer 268, an organic insulating layer of an acrylic resin, an epoxy resin, polyimide, or the like can be used. With the overcoat layer 268, for example, an impurity or the like contained in the coloring layer 266 can be prevented from diffusing into the light-emitting element 125 side. Note that the overcoat layer 268 is not necessarily formed.

A light-transmitting conductive film may be formed as the overcoat layer 268. The light-transmitting conductive film is formed as the overcoat layer 268, so that the light 235 emitted from the light-emitting element 125 can be transmitted through the overcoat layer 268 and layers overlapping with the overcoat layer 268, while ionized impurities can be prevented from passing through the overcoat layer 268.

The light-transmitting conductive film can be formed using, for example, indium oxide, indium tin oxide (ITO), indium zinc oxide, zinc oxide, or zinc oxide to which gallium is added. Graphene or a metal film that is thin enough to have a light-transmitting property can also be used.

Through the above-described steps, the components such as the light-blocking layer 264 can be formed over the element formation substrate 141.

This embodiment can be implemented in an appropriate combination with any of the structures described in other embodiments.

Embodiment 3

A display device 150 having a bottom-emission structure can be fabricated by modification of the structure of the display device 100 having a top-emission structure.

<Display Device Having Bottom-Emission Structure>

Figure 14:
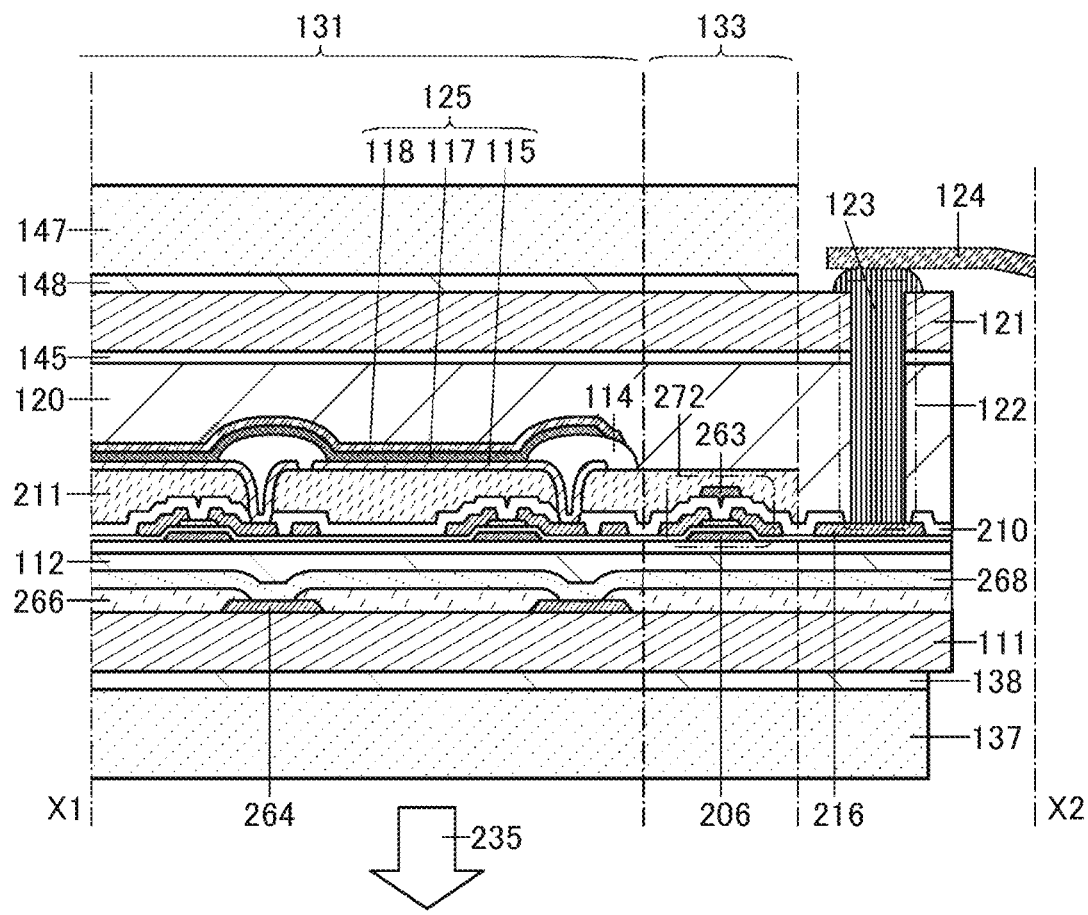
FIG. 14 is a cross-sectional view illustrating one mode of a display device.

FIG. 14 illustrates an example of a cross-sectional structure of the display device 150 having a bottom-emission structure. Note that FIG. 14 is a cross-sectional view of a portion similar to the portion denoted by the dashed-dotted line X1-X2 FIG. 3A that is a perspective view of the display device 100. The display device 150 having a bottom-emission structure differs from the display device 100 in the position where the light-blocking layer 264, the coloring layer 266, and the overcoat layer 268 are formed. Specifically, in the display device 150, the light-blocking layer 264, the coloring layer 266, and the overcoat layer 268 are formed over the substrate 111.

In the display device 150, the substrate 121 on which the insulating layer 145 is directly formed can be attached to the substrate 111 with the bonding layer 120 therebetween. In other words, the insulating layer 145 does not need to be transferred from the element formation substrate 141; thus, the element formation substrate 141, the separation layer 143, and the bonding layer 142 are not needed. This can improve the productivity, yield, and the like of the display device. Note that other components of the display device 150 can be formed as in the case of the display device 100.

In the display device 150 having a bottom-emission structure, the electrode 115 is formed using a light-transmitting conductive material, and the electrode 118 is formed using a conductive material that efficiently reflects light emitted from the EL layer 117.

In the display device 150, the light 235 emitted from the EL layer 17 can be extracted from the substrate 111 side through the coloring layer 266.

<Back Gate Electrode>

Note that the display device 150 is an example of a display device in which a transistor 272 is used as a transistor included in the driver circuit 133. Although the transistor 272 can be formed in a manner similar to that of the transistor 252, the transistor 272 differs from the transistor 252 in that an electrode 263 is formed over the insulating layer 210 in a region overlapping with the semiconductor layer 208. The electrode 263 can be formed using a material and a method similar to those of the gate electrode 206.

The electrode 263 can also serve as a gate electrode. In the case where one of the gate electrode 206 and the electrode 263 is simply referred to as a "gate electrode", the other may be referred to as a "back gate electrode". One of the gate electrode 206 and the electrode 263 may be referred to as a "first gate electrode", and the other may be referred to as a "second gate electrode".

In general, the back gate electrode is formed using a conductive film and positioned so that the channel formation region of the semiconductor layer is positioned between the gate electrode and the back gate electrode. Thus, the back gate electrode can function in a manner similar to that of the gate electrode. The potential of the back gate electrode may be the same as that of the gate electrode or may be a GND potential or a predetermined potential. By changing a potential of the back gate electrode, the threshold voltage of the transistor can be changed.

Furthermore, the gate electrode and the hack gate electrode are formed using conductive films and thus each have a function of preventing an electric field generated outside the transistor from influencing the semiconductor layer in which the channel is formed (in particular, a function of blocking static electricity).

In the case where light is incident on the back gate electrode side, when the back gate electrode is formed using a light-blocking conductive film, light can be prevented from entering the semiconductor layer from the back gate electrode side. Thus, photodegradation of the semiconductor layer can be prevented and deterioration in electrical characteristics of the transistor, such as a shift of the threshold voltage, can be prevented.

By providing the gate electrode 206 and the electrode 263 with the semiconductor layer 208 therebetween and setting the potentials of the gate electrode 206 and the electrode 263 to be equal, a region of the semiconductor layer 208 through which carriers flow is enlarged in the film thickness direction; thus, the number of transferred carriers is increased. As a result, the on-state current and the field-effect mobility of the transistor are increased.

The gate electrode 206 and the electrode 263 each have a function of blocking an external electric field; thus, charges in a layer under the gate electrode 206 and in a layer over the electrode 263 do not affect the semiconductor layer 208. Thus, there is little change in the threshold voltage in a stress test (e.g., a negative gate bias temperature (−GBT) stress test in which a negative voltage is applied to a gate or a +GBT stress test in which a positive voltage is applied to a gate). In addition, changes in the rising voltages of on-state current at different drain voltages can be suppressed.

The BT stress test is one kind of accelerated test and can evaluate, in a short time, change in characteristics (i.e., a change over time) of transistors, which is caused by long-term use. In particular, the amount of change in threshold voltage of the transistor in the BT stress test is an important indicator when examining the reliability of the transistor. As the amount of change in the threshold voltage in the BT stress test is small, the transistor has higher reliability.

By providing the gate electrode 206 and the electrode 263 and setting the potentials of the gate electrode 206 and the electrode 263 to be the same, the amount of change in the threshold voltage is reduced. Accordingly, variation in electrical characteristics among a plurality of transistors is also reduced.

Note that a back gate electrode may be provided in the transistor 232 formed in the display area 131.

This embodiment can be implemented in an appropriate combination with any of the structures described in other embodiments.

Embodiment 4

A display device 160 in which the coloring layer 266, the light-blocking layer 264, the overcoat layer 268, and the like are not provided can be manufactured by modification of the structure of the display device 100 having a top-emission structure.

Figure 15A:
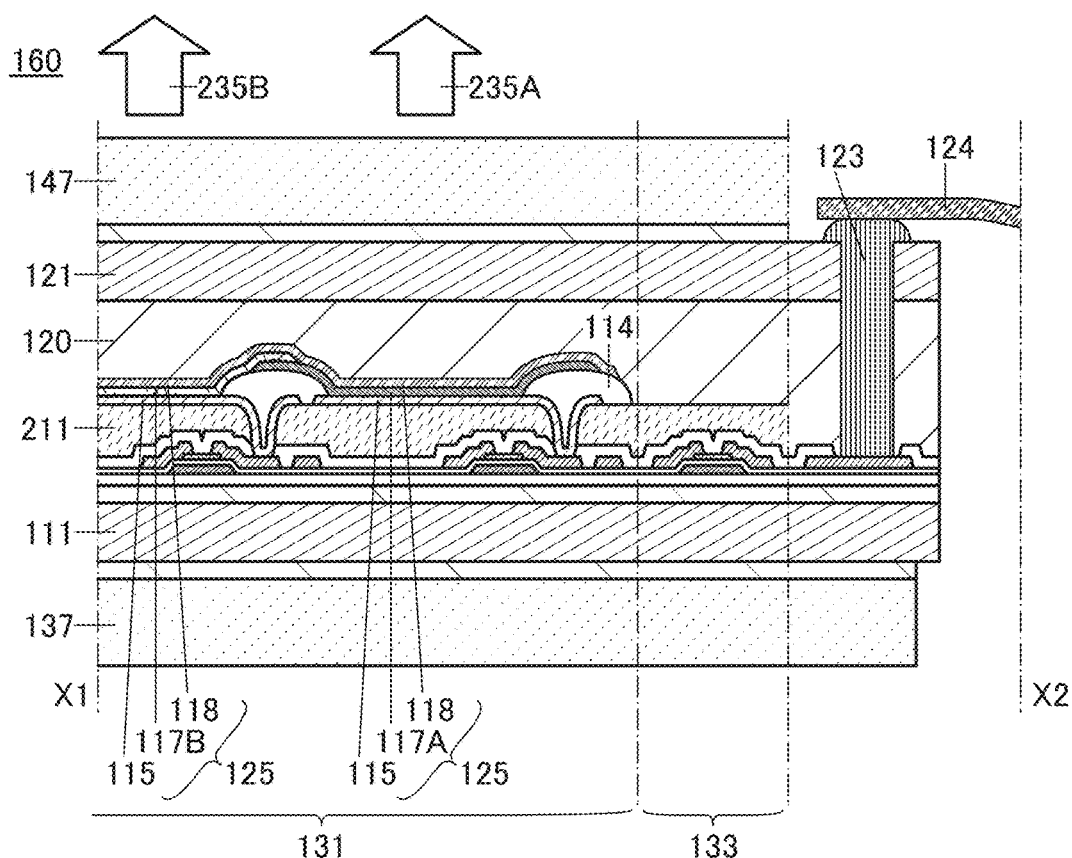
FIGS. 15A and 15B are cross-sectional views each illustrating one mode of a display device.
Figure 15B:
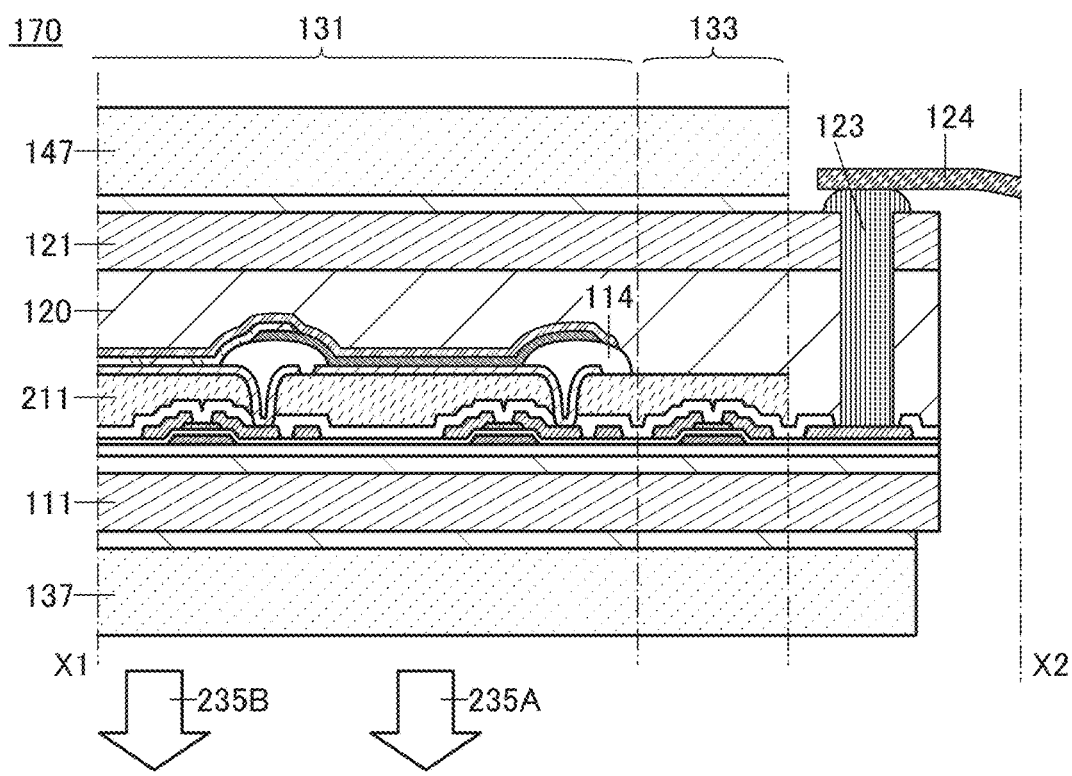

FIG. 15A illustrates an example of a cross-sectional structure of the display device 160. Note that FIGS. 15A and 15B are cross-sectional views of a portion similar to the portion denoted by the dashed-dotted line X1-X2 in FIG. 3A that is a perspective view of the display device 100. In the display device 160, color display can be performed by using an EL layer 117A, an EL layer 117B, an EL layer 117C (not shown), and the like instead of the light-blocking layer 264, the coloring layer 266, and the overcoat layer 268. The EL layer 117A, the EL layer 117B, and the like can emit light of the respective colors such as red, blue, and green. For example, the EL layer 117A emits light 235A of a red wavelength, the EL layer 117B emits light 235B of a blue wavelength, and the EL layer 117C emits light 235C (not shown) of a green wavelength.

Since the coloring layer 266 is not provided, a reduction in luminance caused when the light 235A, light 235B, and light 235C are transmitted through the coloring layer 266 can be prevented. The thicknesses of the EL layer 117A, EL layer 117B, and EL layer 117C are adjusted in accordance with the wavelengths of the light 235A, light 235B, and light 235C, whereby a higher color purity can be achieved.

Note that in a manner similar to that of the display device 160, a display device 170 in which the coloring layer 266, the light-blocking layer 264, the overcoat layer 268, and the like are not provided can also be manufactured by modification of the structure of the display device 150 having a bottom emission structure. FIG. 15B illustrates an example of a cross-sectional structure of the display device 170.

Figure 27A:
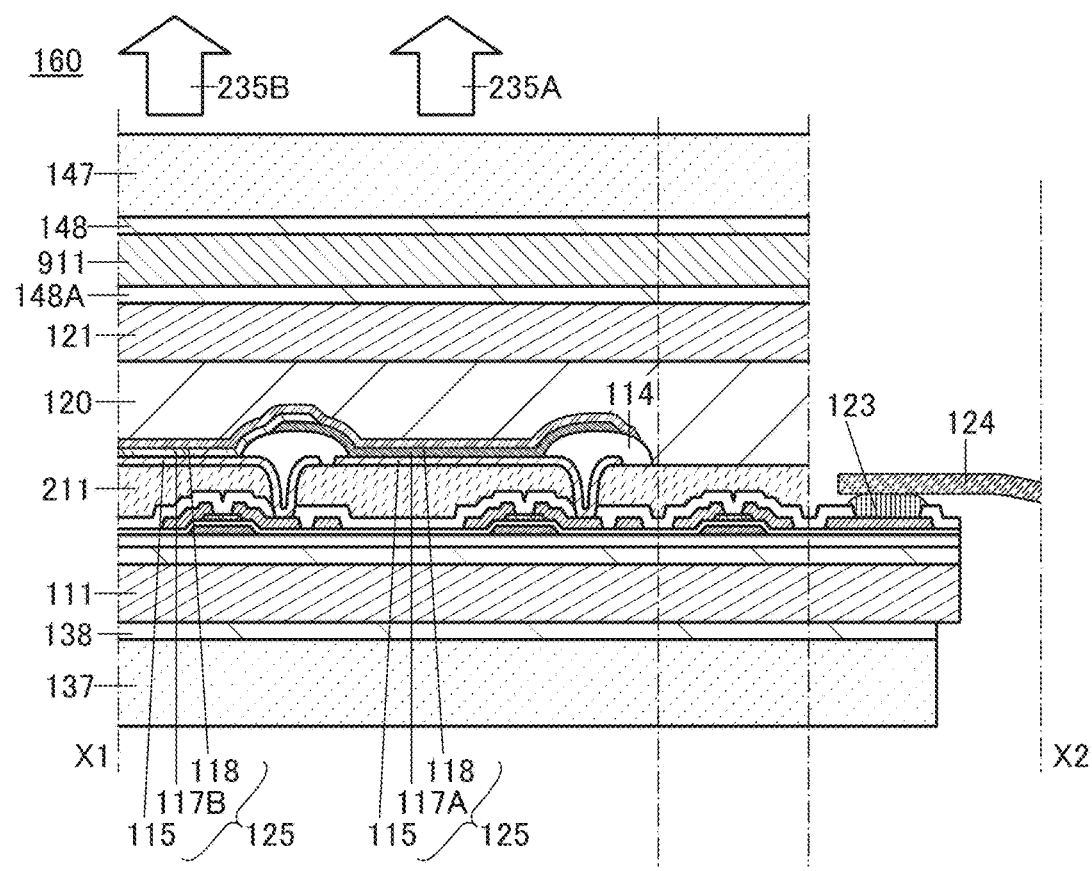
FIGS. 27A and 27B are cross-sectional views each illustrating one mode of a display device.
Figure 27B:
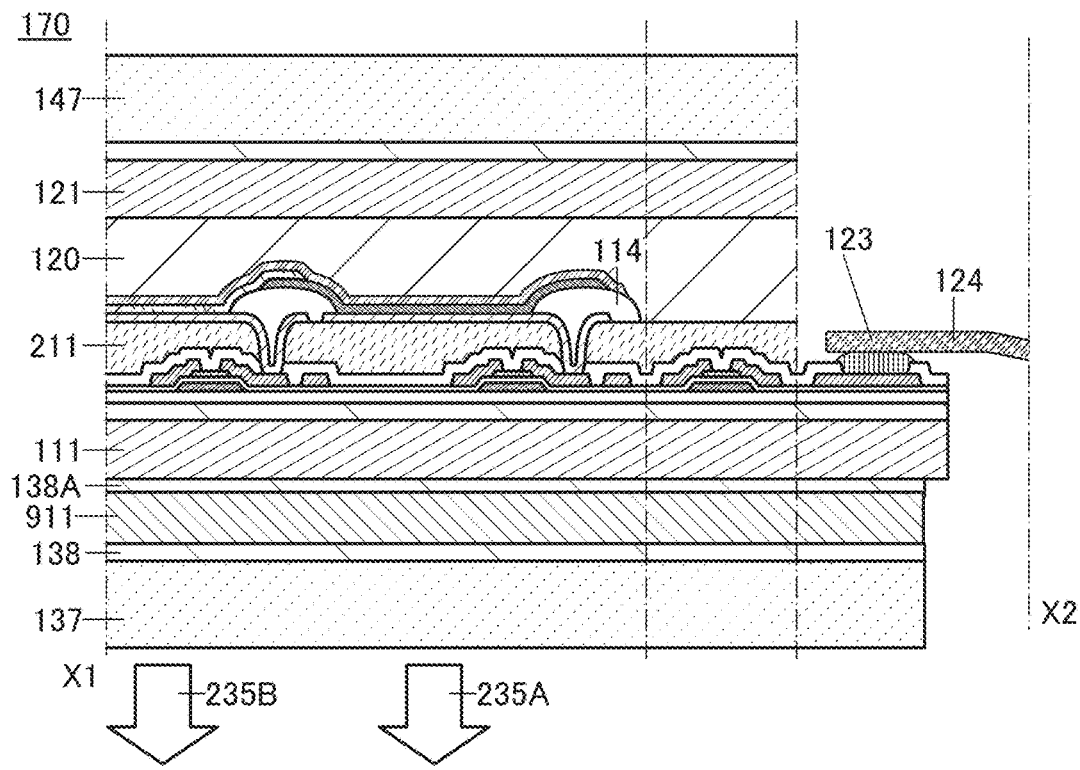

Note that as illustrated in FIGS. 27A and 27B, an optical film 911, examples of which include a polarizing plate, a retardation plate, and a quarter-wave plate, may be additionally provided. The optical film 911 is bonded with the use of a bonding layer 148A or a bonding layer 138A. This structure can reduce reflection at a screen surface. Moreover, the optical film 911 can be protected.

This embodiment can be implemented in an appropriate combination with any of the structures described in other embodiments.

Embodiment 5

Figure 16A:
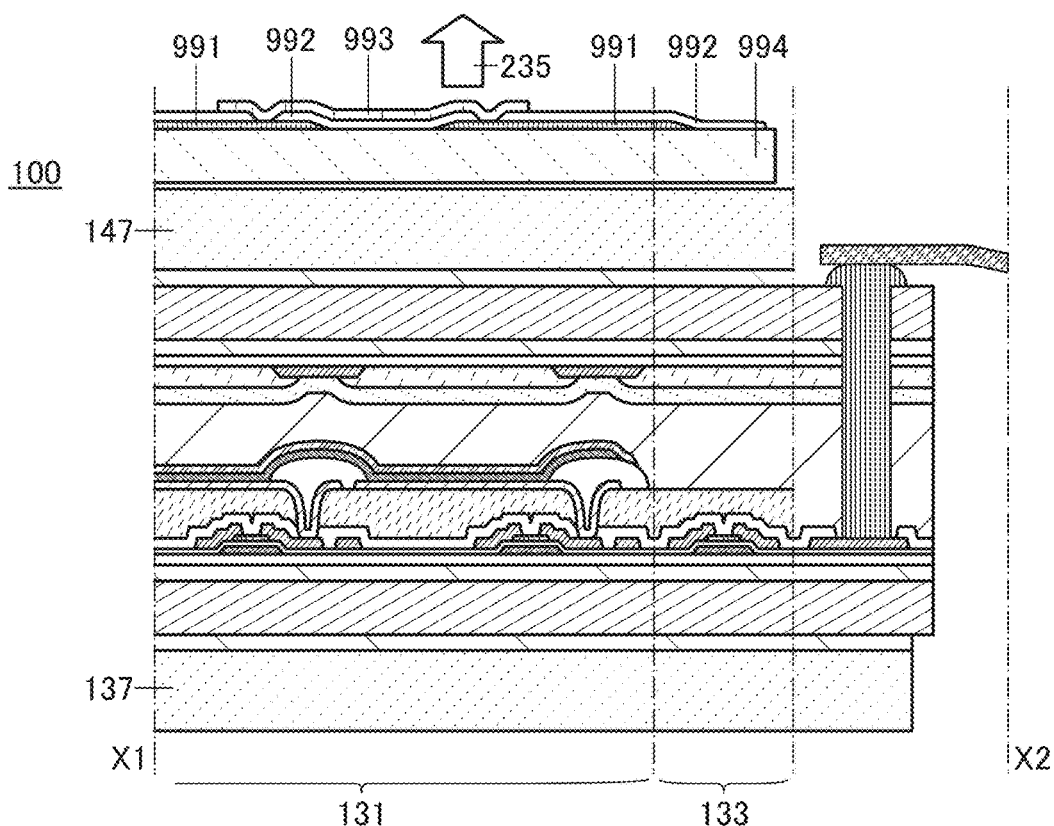
FIGS. 16A and 16B are cross-sectional views each illustrating one mode of a display device.

In the display device 100, a substrate provided with a touch sensor may be provided over the substrate 147 as illustrated in FIG. 16A. The touch sensor is formed using a conductive layer 991, a conductive layer 993, and the like. In addition, an insulating layer 992 is formed between the conductive layers.

As the conductive layer 991 and/or the conductive layer 993, a transparent conductive film of indium tin oxide, indium zinc oxide, or the like is preferably used. Note that a layer containing a low-resistance material may be used for part or the whole of the conductive layer 991 and/or the conductive layer 993 in order to reduce resistance. For example, the conductive layer 991 and/or the conductive layer 993 can be formed as a single layer or a stack using any of metals such as aluminum, titanium, chromium, nickel, copper, yttrium, zirconium, molybdenum, silver, tantalum, and tungsten and an alloy containing any of these metals as a main component. Alternatively, a metal nanowire may be used as the conductive layer 991 and/or the conductive layer 993. Silver or the like is preferably used as a metal for the metal nanowire, in which case the resistance value can be reduced and the sensitivity of the sensor can be improved.

The insulating layer 992 is preferably formed as a single layer or a multilayer using silicon oxide, silicon nitride, silicon oxynitride, silicon nitride oxide, aluminum oxide, aluminum oxynitride, aluminum nitride oxide, or the like. The insulating layer 992 can be formed by a sputtering method, a CVD method, a thermal oxidation method, a coating method, a printing method, or the like.

Although the touch sensor is provided over the substrate 994, one embodiment of the present invention is not limited thereto. The touch sensor may be provided under the substrate 994 (i.e., between the substrate 121 and the substrate 994).

Figure 16B:
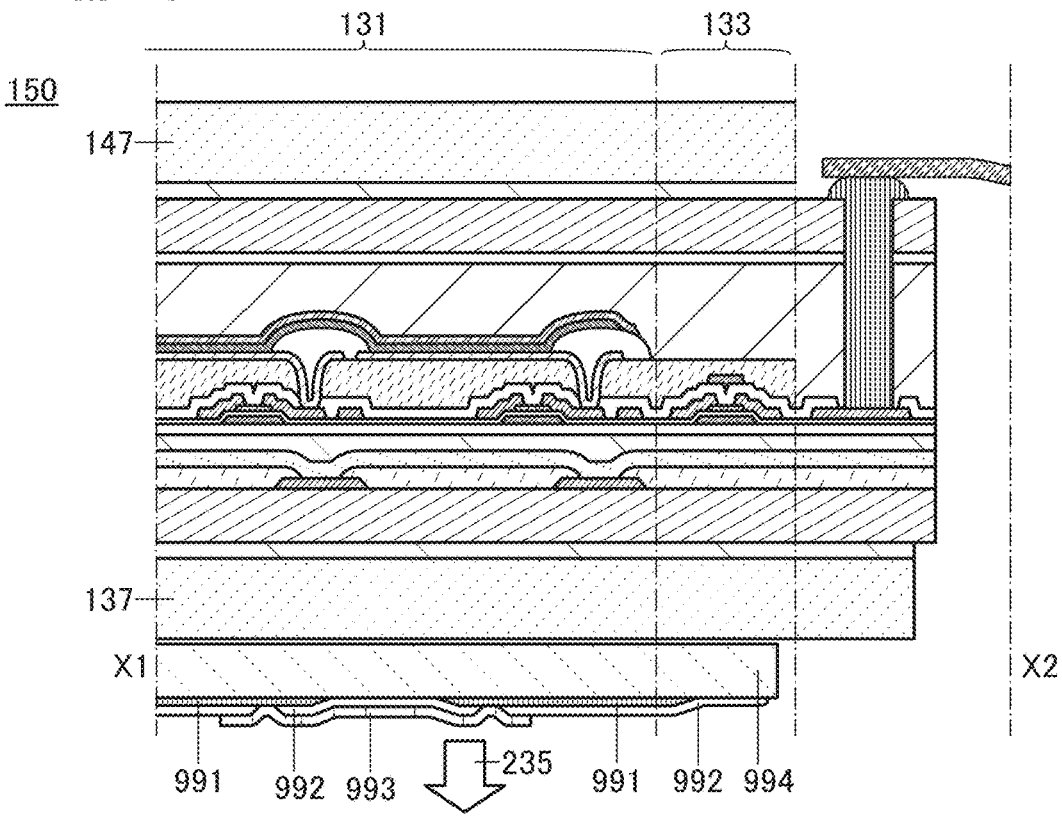

The substrate provided with the touch sensor may be positioned under the substrate 137 in the display device 150. FIG. 16B illustrates an example of this case.

Figure 28A:
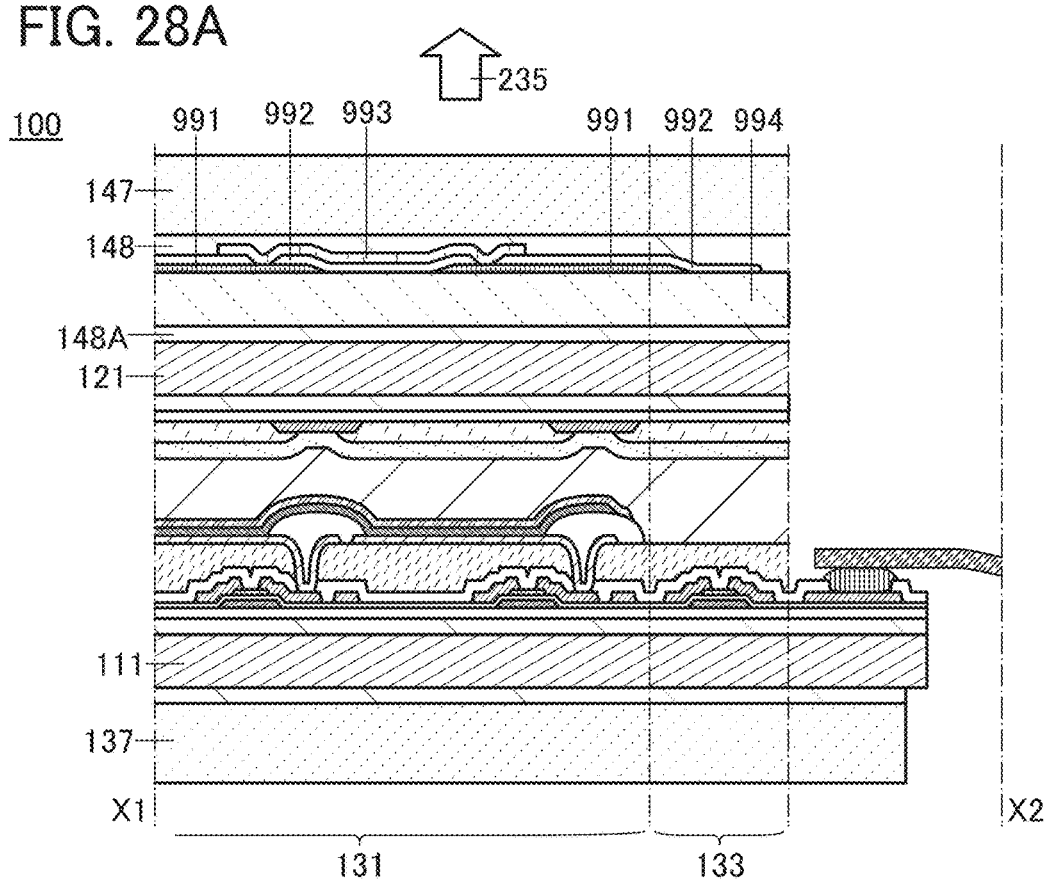
FIGS. 28A and 28B are cross-sectional views each illustrating one mode of a display device.
Figure 28B:
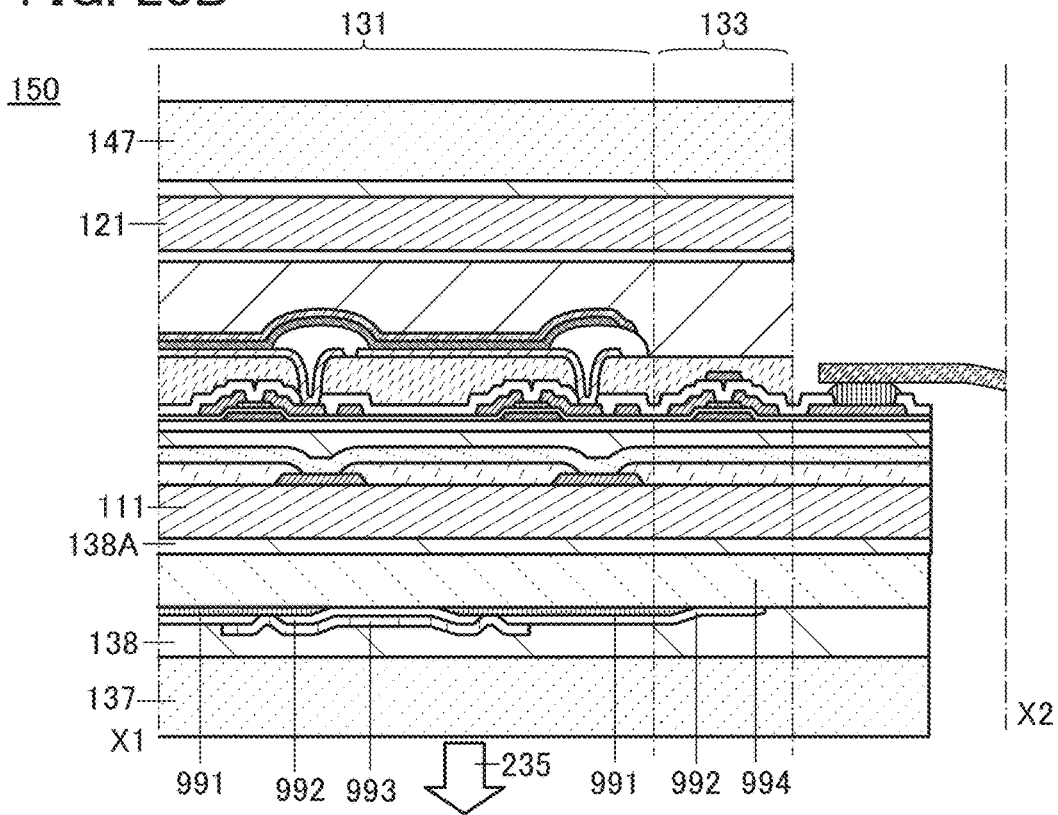

The touch sensor may be positioned over the substrate 121 with the bonding layer 148A provided therebetween as illustrated in FIG. 28A, or may be positioned under the substrate 111 with the bonding layer 138A provided therebetween as illustrated in FIG. 28B.

Note that the substrate 994 may have a function of an optical film. That is, the substrate 994 may have a function of a polarizing plate, a retardation plate, or the like.

Figure 17A:
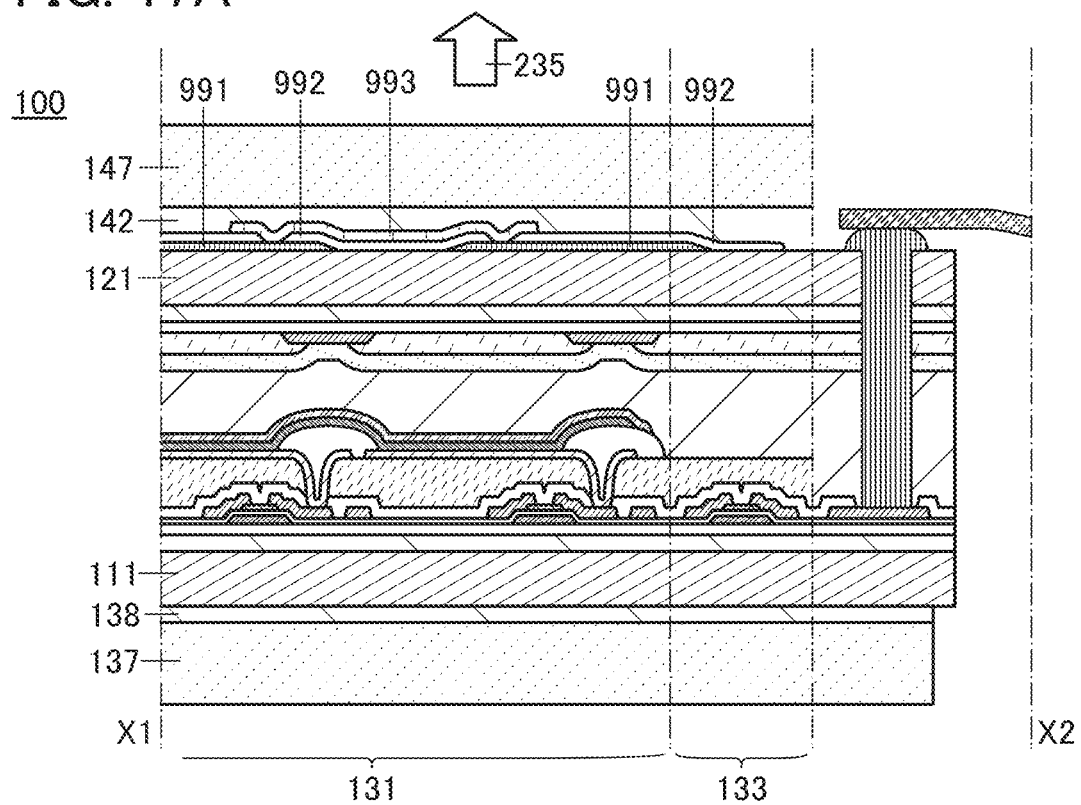
FIGS. 17A and 17B are cross-sectional views each illustrating one mode of a display device.

In the display device 100, the substrate 121 may be provided with a touch sensor. FIG. 17A illustrates an example in which the substrate 121 is provided with a touch sensor and the substrate 147 is formed over the touch sensor and the bonding layer 142.

Figure 17B:
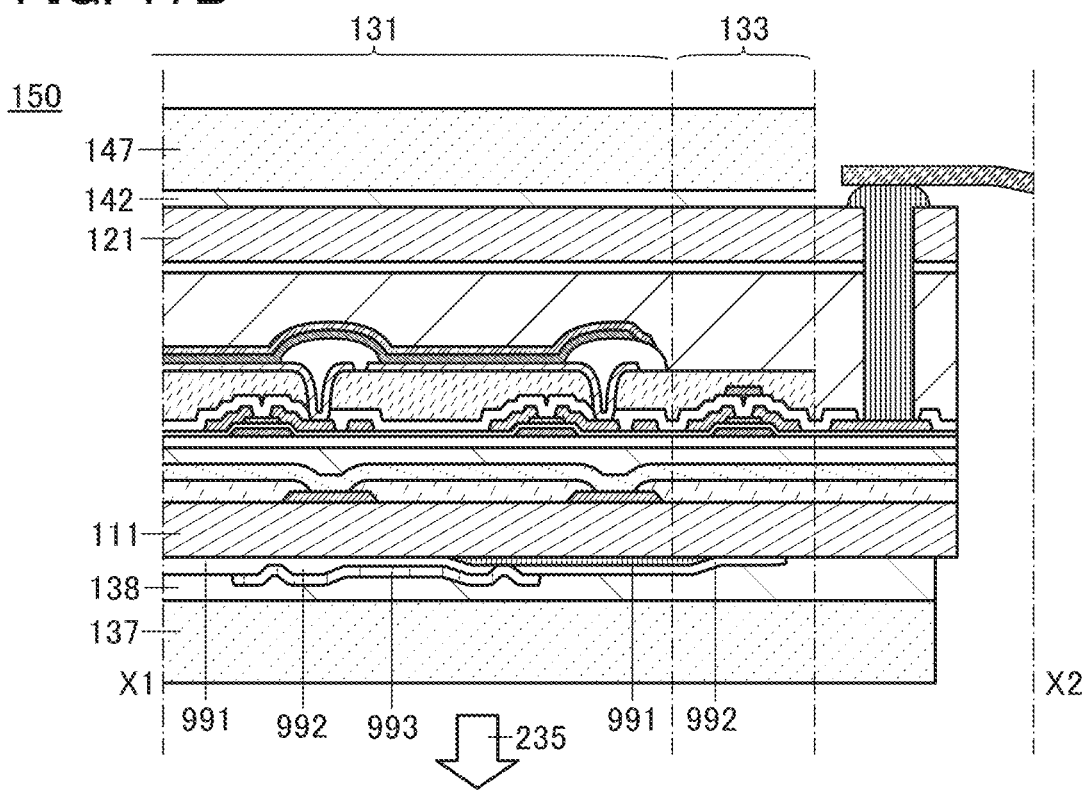

In the display device 150, the substrate 111 may be provided with a touch sensor. FIG. 17B illustrates an example in which the substrate 111 is provided with a touch sensor and the substrate 137 is formed under the touch sensor and the bonding layer 138.

Figure 18A:
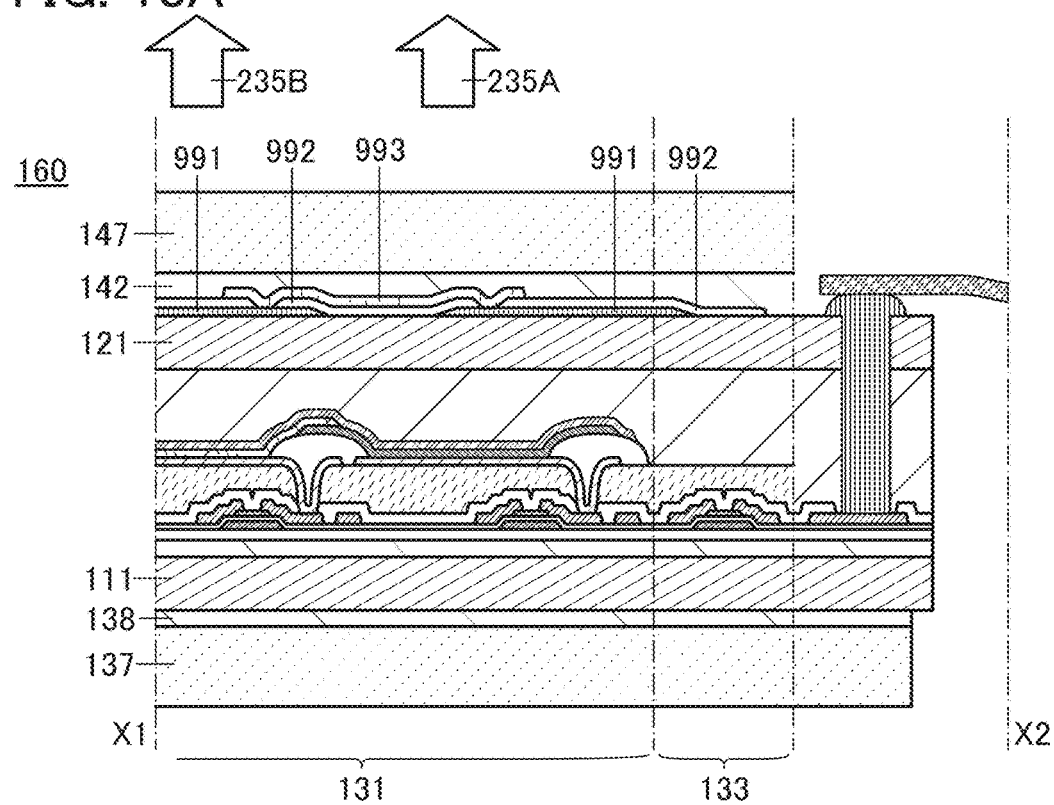
FIGS. 18A and 18B are cross-sectional views each illustrating one mode of a display device.

In the display device 160, the substrate 121 may be provided with a touch sensor. FIG. 18A illustrates an example in which the substrate 121 is provided with a touch sensor and the substrate 147 is formed over the touch sensor and the bonding layer 142.

Figure 18B:
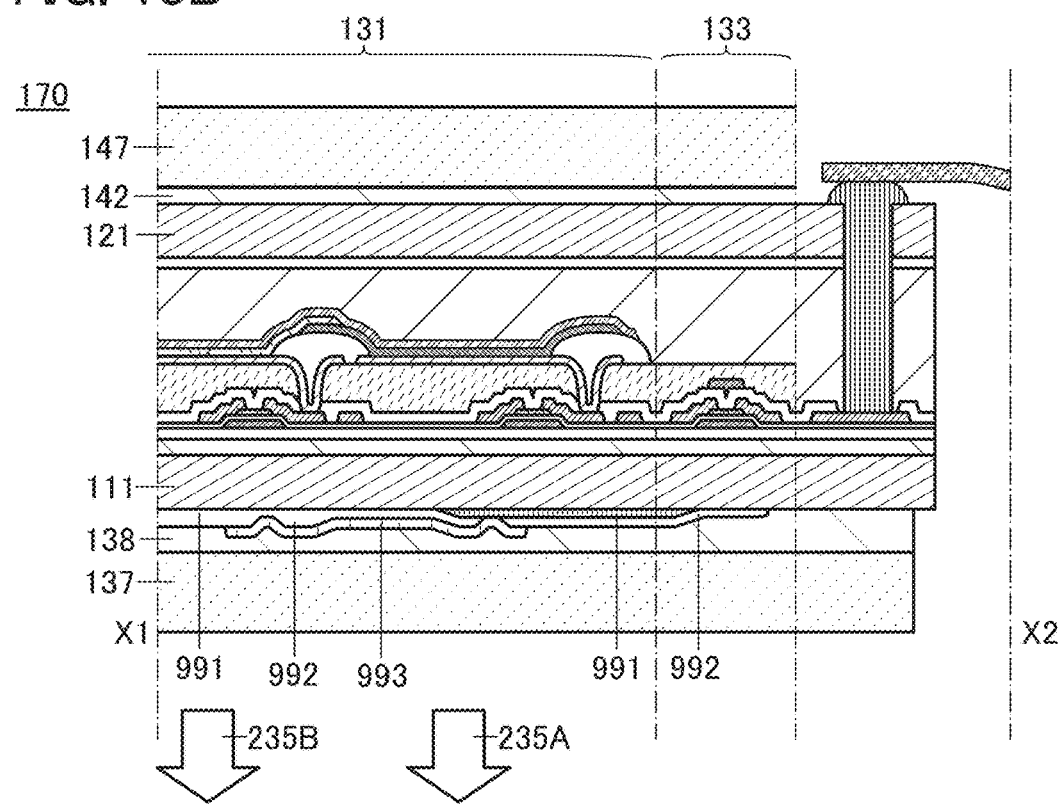

In the display device 170, the substrate 111 may be provided with a touch sensor. FIG. 18B illustrates an example in which the substrate 111 is provided with a touch sensor and the substrate 137 is formed under the touch sensor and the bonding layer 138.

Figure 29A:
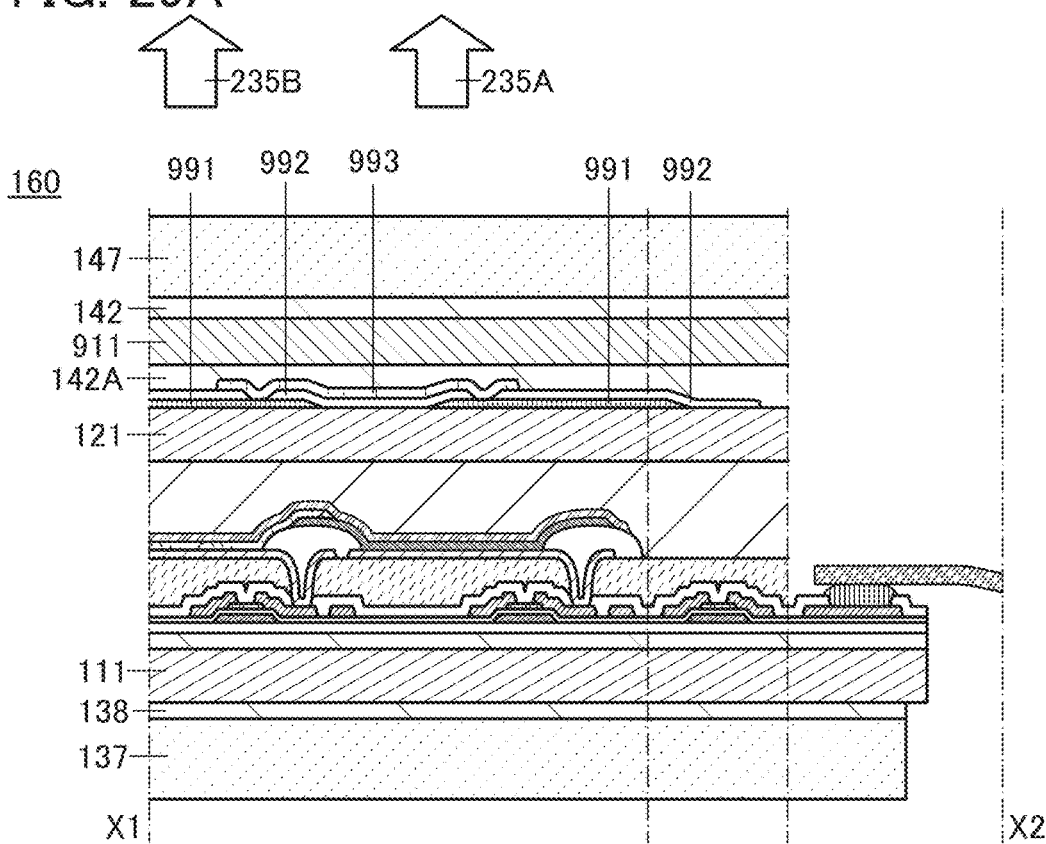
FIGS. 29A and 29B are cross-sectional views each illustrating one mode of a display device.
Figure 29B:
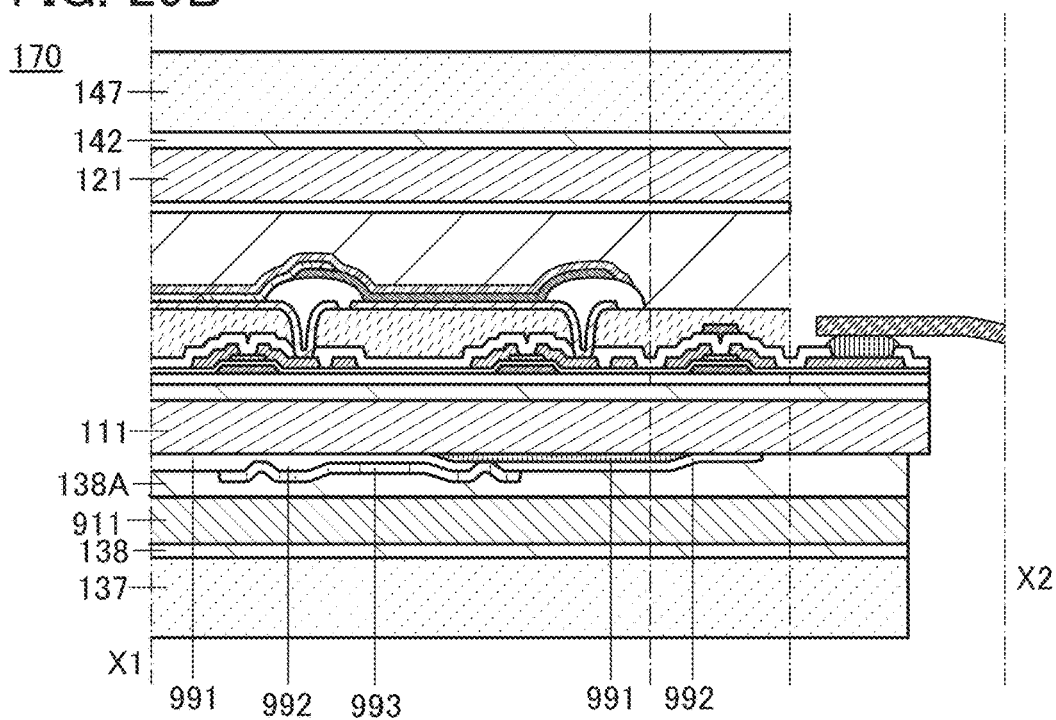

Note that in FIGS. 18A and 18B, the optical film 911 may be provided. FIGS. 29A and 29B illustrate an example of this case. The optical film 911 is bonded with the use of a bonding layer 142A or the bonding layer 138A.

This embodiment can be implemented in an appropriate combination with any of the structures described in other embodiments.

Embodiment 6

In this embodiment, structure examples of a light-emitting element that can be applied to the light-emitting element 125 are described. Note that an EL layer 320 described in this embodiment corresponds to the EL layer 117 described in the above embodiment.

<Structure of Light-Emitting Element>

In a light-emitting element 330 illustrated in FIG. 9A, the EL layer 320 is interposed between a pair of electrodes (an electrode 318 and an electrode 322). Note that the electrode 318 is used as an anode and the electrode 322 is used as a cathode as an example in the following description of this embodiment.

The EL layer 320 includes at least a light-emitting layer and may have a stacked-layer structure including a functional layer other than the light-emitting layer. As the functional layer other than the light-emitting layer, a layer containing a substance having a high hole-injection property, a substance having a high hole-transport property, a substance having a high electron-transport property, a substance having a high electron-injection property, a bipolar substance (a substance having high electron- and hole-transport properties), or the like can be used. Specifically, functional layers such as a hole-injection layer, a hole-transport layer, an electron-transport layer, and an electron-injection layer can be used in combination as appropriate.

Figure 19A:
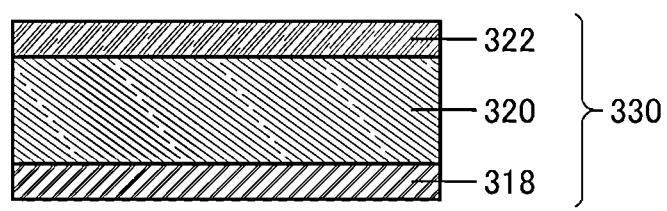
FIGS. 19A and 19B illustrate structure examples of light-emitting elements.

The light-emitting element 330 illustrated in FIG. 19A emits light when current flows because of a potential difference generated between the electrode 318 and the electrode 322 and holes and electrons are recombined in the EL layer 320. That is, the light-emitting region is formed in the EL layer 320.

In the present invention, light emitted from the light-emitting element 330 is extracted to the outside from the electrode 318 side or the electrode 322 side. Therefore, one of the electrode 318 and the electrode 322 is formed of a light-transmitting substance.

Figure 19B:
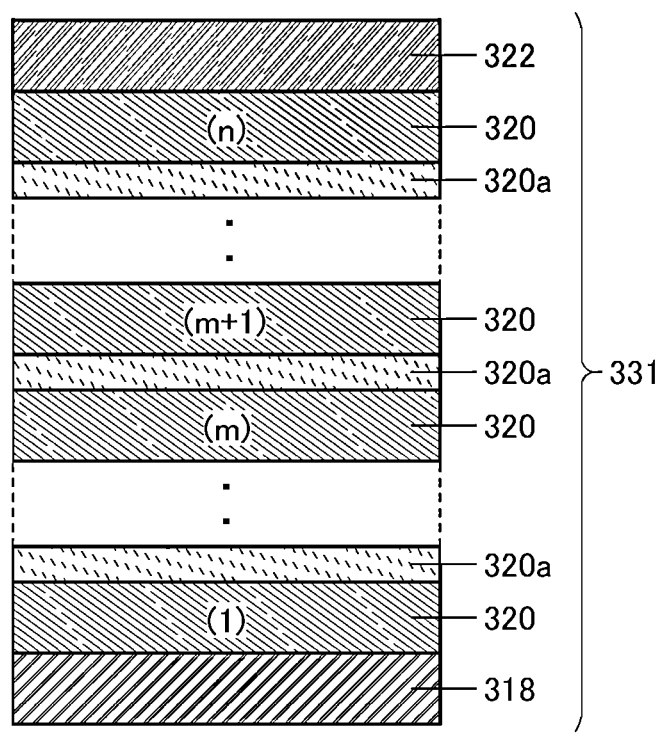

Note that a plurality of EL layers 320 may be stacked between the electrode 318 and the electrode 322 as in a light-emitting element 331 illustrated in FIG. 19B. In the case where n (n is a natural number of 2 or more) layers are stacked, a charge generation layer 320a is preferably provided between an m-th EL layer 320 and an (m+1)-th EL layer 320. Note that m is a natural number greater than or equal to 1 and less than n.

The charge generation layer 320a can be formed using a composite material of an organic compound and a metal oxide, a metal oxide, a composite material of an organic compound and an alkali metal, an alkaline earth metal, or a compound thereof; alternatively, these materials can be combined as appropriate. Examples of the composite material of an organic compound and a metal oxide include composite materials of an organic compound and a metal oxide such as vanadium oxide, molybdenum oxide, and tungsten oxide. As the organic compound, a variety of compounds can be used; for example, low molecular compounds such as an aromatic amine compound, a carbazole derivative, and aromatic hydrocarbon and oligomers, dendrimers, and polymers of these low molecular compounds. As the organic compound, it is preferable to use the organic compound which has a hole-transport property and has a hole mobility of $10^{-6}$ cm$^2$/Vs or higher. However, substances other than the substances given above may also be used as long as the substances have hole-transport properties higher than electron-transport properties. These materials used for the charge generation layer 320a have excellent carrier-injection properties and carrier-transport properties; thus, the light-emitting element 330 can be driven with low current and with low voltage.

Note that the charge generation layer 320a may be formed with a combination of a composite material of an organic compound and a metal oxide with another material. For example, a layer containing a composite material of the organic compound and the metal oxide may be combined with a layer containing a compound of a substance selected from substances with an electron-donating property and a compound with a high electron-transport property. Moreover, a layer containing a composite material of the organic compound and the metal oxide may be combined with a transparent conductive film.

The light-emitting element 331 having such a structure is unlikely to suffer the problem of energy transfer, quenching, or the like and has an expanded choice of materials, and thus can easily have both high emission efficiency and a long lifetime. Moreover, it is easy to obtain phosphorescence from one light-emitting layer and fluorescence from the other light-emitting layer.

The charge generation layer 320a has a function of injecting holes to one of the EL layers 320 that is in contact with the charge generation layer 320a and a function of injecting electrons to the other EL layer 320 that is in contact with the charge generation layer 320a, when voltage is applied between the electrode 318 and the electrode 322.

The light-emitting element 331 illustrated in FIG. 19B can provide a variety of emission colors by changing the type of the light-emitting substance used for the EL layer 320. In addition, a plurality of light-emitting substances emitting light of different colors may be used as the light-emitting substances, whereby light emission having a broad spectrum or white light emission can be obtained.

In the case of obtaining white light emission using the light-emitting element 331 illustrated in FIG. 19B, as for the combination of a plurality of EL layers, a structure for emitting white light including red light, green light, and blue light may be used; for example, the structure may include a light-emitting layer containing a blue fluorescent substance as a light-emitting substance and a light-emitting layer containing red and green phosphorescent substances as light-emitting substances. Alternatively, a structure including a light-emitting layer emitting red light, a light-emitting layer emitting green light, and a light-emitting layer emitting blue light may be employed. Further alternatively, with a structure including light-emitting layers emitting light of complementary colors, white light emission can be obtained. In a stacked-layer element including two light-emitting layers in which light emitted from one of the light-emitting layers and light emitted from the other light-emitting layer have complementary colors to each other, the combinations of colors are as follows: blue and yellow, blue-green and red, and the like.

Note that in the structure of the above-described stacked-layer element, by providing the charge generation layer between the stacked light-emitting layers, the element can have a long lifetime in a high-luminance region while keeping the current density low. In addition, the voltage drop due to the resistance of the electrode material can be reduced, whereby uniform light emission in a large area is possible.

This embodiment can be implemented in an appropriate combination with any of the structures described in other embodiments.

Embodiment 7

In this embodiment, examples of an electronic device and a lighting device including the display device of one embodiment of the present invention are described with reference to drawings.

As examples of the electronic devices including a flexible display device, the following can be given: television devices (also called televisions or television receivers), monitors of computers or the like, digital cameras, digital video cameras, digital photo frames, mobile phones (also called cellular phones or mobile phone devices), portable game machines, portable information terminals, audio reproducing devices, large game machines such as pachinko machines, and the like.

In addition, a lighting device or a display device can be incorporated along a curved inside/outside wall surface of a house or a building or a curved interior/exterior surface of a car.

Figure 20A:
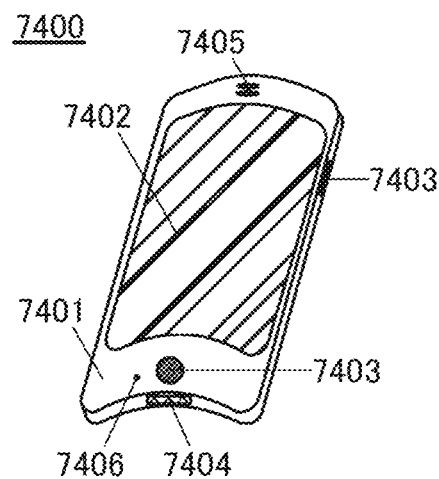
FIGS. 20A to 20E illustrate examples of electronic devices and lighting devices.

FIG. 20A illustrates an example of a mobile phone. A mobile phone 7400 is provided with a display portion 7402 incorporated in a housing 7401, an operation button 7403, an external connection port 7404, a speaker 7405, a microphone 7406, and the like. Note that the mobile phone 7400 is manufactured using the display device in the display portion 7402.

When the display portion 7402 of the mobile phone 7400 illustrated in FIG. 20A is touched with a finger or the like, data can be input to the mobile phone 7400. Further, operations such as making a call and inputting a character can be performed by touch on the display portion 7402 with a finger or the like.

The power can be turned on or off with the operation button 7403. In addition, types of images displayed on the display portion 7402 can be switched; for example, switching images from a mail creation screen to a main menu screen is performed with the operation button 7403.

Here, the display portion 7402 includes the display device of one embodiment of the present invention. Thus, the mobile phone can have a curved display portion and high reliability.

Figure 20B:
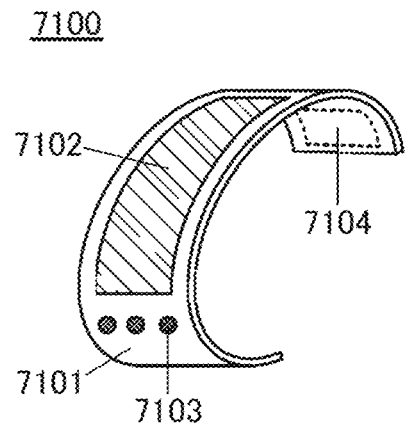

FIG. 20B illustrates an example of a wristband-type display device. A portable display device 7100 includes a housing 7101, a display portion 7102, an operation button 7103, and a sending and receiving device 7104.

The portable display device 7100 can receive a video signal with the sending and receiving device 7104 and can display the received video on the display portion 7102. In addition, with the sending and receiving device 7104, the portable display device 7100 can send an audio signal to another receiving device.

With the operation button 7103, power ON/OFF, switching displayed videos, adjusting volume, and the like can be performed.

Here, the display portion 7102 includes the display device of one embodiment of the present invention. Thus, the portable display device can have a curved display portion and high reliability.

FIGS. 20C to 20F, illustrate examples of lighting devices. Lighting devices 7200, 7210, and 7220 each include a stage 7201 provided with an operation switch 7203 and a light-emitting portion supported by the stage 7201.

Figure 20C:
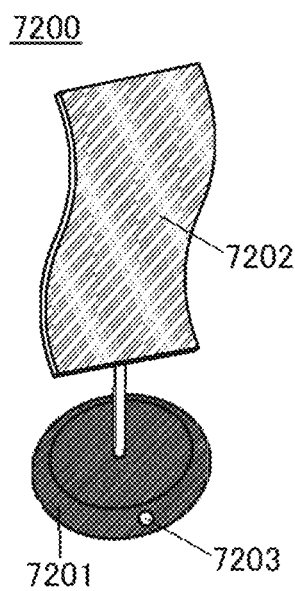

The lighting device 7200 illustrated in FIG. 20C includes a light-emitting portion 7202 with a wave-shaped light-emitting surface and thus is a good-design lighting device.

Figure 20D:
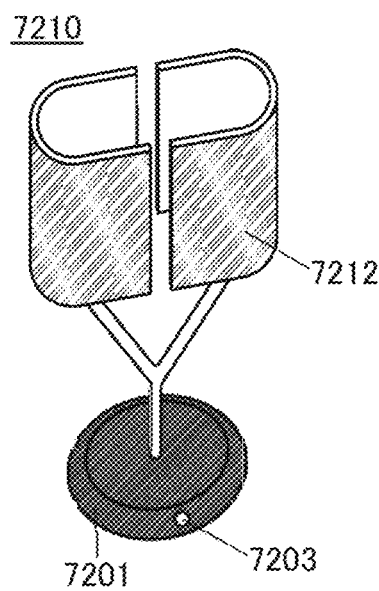

A light-emitting portion 7212 included in the lighting device 7210 illustrated in FIG. 20D has two convex-curved light-emitting portions symmetrically placed. Thus, light radiates from the lighting device 7210.

Figure 20E:
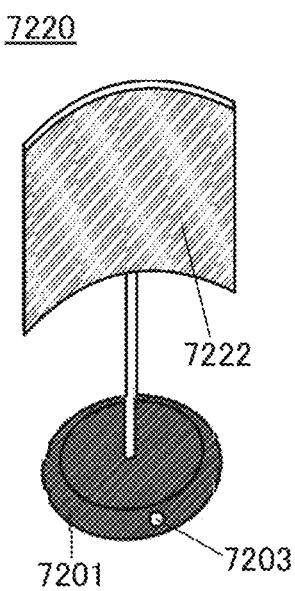

The lighting device 7220 illustrated in FIG. 20E includes a concave-curved light-emitting portion 7222. This is suitable for illuminating a specific range because light emitted from the light-emitting portion 7222 is collected to the front of the lighting device 7220.

The light-emitting portion included in each of the lighting devices 7200, 7210, and 7220 is flexible; thus, the light-emitting portion may be fixed on a plastic member, a movable frame, or the like so that an emission surface of the light-emitting portion can be bent freely depending on the intended use.

The light-emitting portions included in the lighting devices 7200, 7210, and 7220 each include the display device of one embodiment of the present invention. Thus, the lighting devices whose display portions can be curved into any shape and which has high reliability can be provided.

Figure 30:
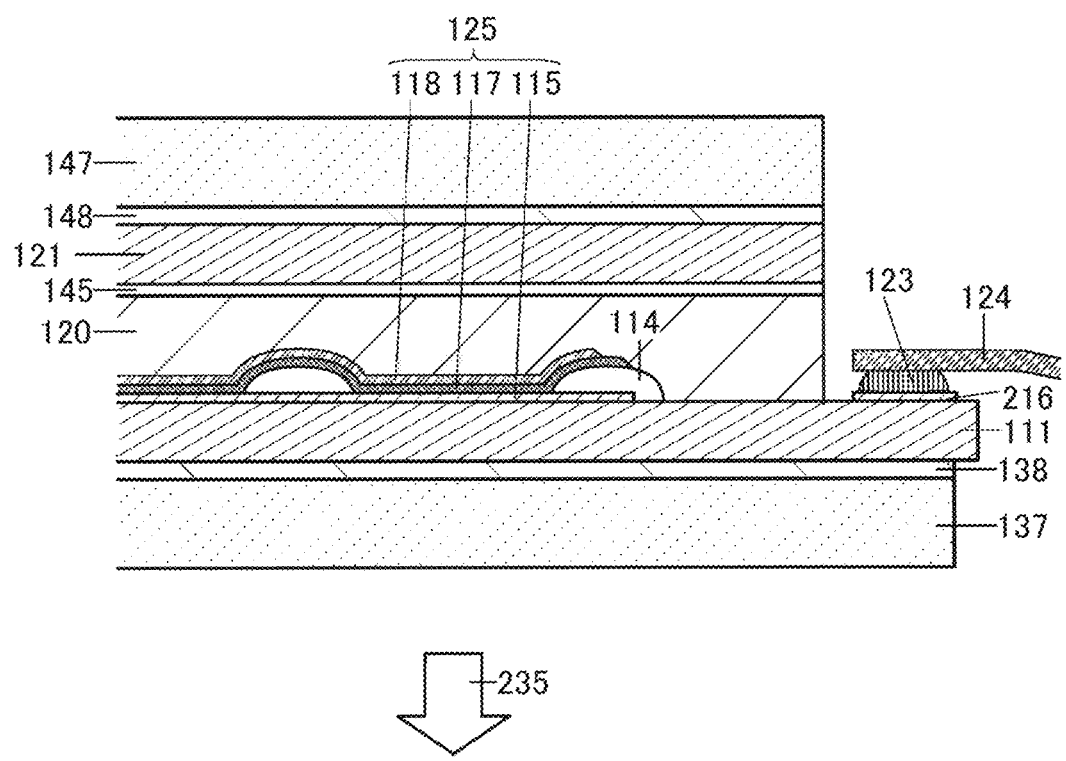
FIG. 30 is a cross-sectional view illustrating one mode of a lighting device.

FIG. 30 shows a cross-sectional view of a lighting device.

Figure 21A:
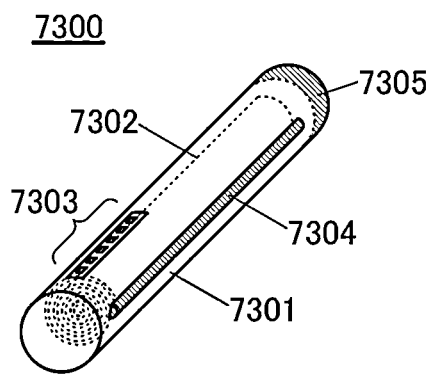
FIGS. 21A and 21B illustrate one example of an electronic device.

FIG. 21A illustrates an example of a portable display device. A display device 7300 includes a housing 7301, a display portion 7302, operation buttons 7303, a display portion pull 7304, and a control portion 7305.

The display device 7300 includes a rolled flexible display portion 7302 in the cylindrical housing 7301.

The display device 7300 can receive a video signal with the control portion 7305 and can display the received video on the display portion 7302. In addition, a battery is included in the control portion 7305. Moreover, a connector may be included in the control portion 7305 so that a video signal or power can be supplied directly.

With the operation buttons 7303, power ON/OFF, switching of displayed videos, and the like can be performed.

Figure 21B:
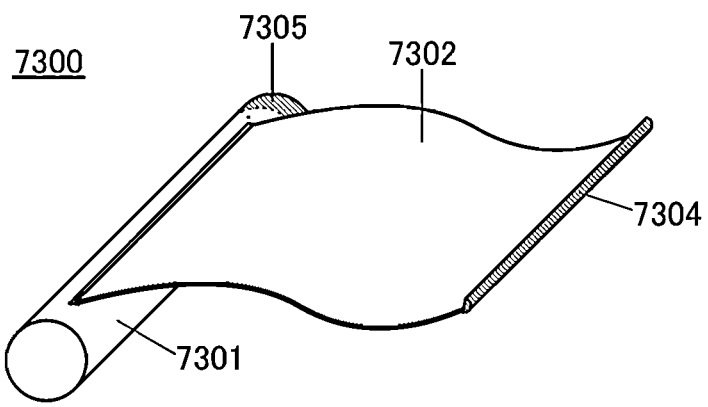

FIG. 21B illustrates a state in which the display portion 7302 is pulled out with the display portion pull 7304. Videos can be displayed on the display portion 7302 in this state. Further, the operation buttons 7303 on the surface of the housing 7301 allow one-handed operation.

Note that a reinforcement frame may be provided for an edge portion of the display portion 7302 in order to prevent the display portion 7302 from being curved when pulled out.

Note that in addition to this structure, a speaker may be provided for the housing so that sound is output with an audio signal received together with a video signal.

The display portion 7302 includes the display device of one embodiment of the present invention. Thus, the display portion 7302 is a flexible, highly reliable display device, which makes the display device 7300 lightweight and highly reliable.

FIGS. 22A and 22B illustrate a double foldable tablet terminal 9600 as an example. FIG. 22A illustrates the tablet terminal 9600 which is unfolded. The tablet terminal 9600 includes a housing 9630, a display portion 9631, a display mode switch 9626, a power switch 9627, a power-saving mode switch 9625, a clasp 9629, and an operation switch 9628.

The housing 9630 includes a housing 9630a and a housing 9630b, which are connected with a hinge portion 9639. The hinge portion 9639 makes the housing 9630 double foldable.

The display portion 9631 is provided on the housing 9630a, the housing 9630b, and the hinge portion 9639. By the use of the display device that is disclosed in the present specification and the like, the tablet terminal in which the display portion 9631 can be bent and which has high reliability can be provided.

Part of the display portion 9631 can be a touchscreen region 9632 and data can be input when a displayed operation key 9638 is touched. A structure can be employed in which half of the display portion 9631 has only a display function and the other half has a touchscreen function. The whole display portion 9631 may have a touchscreen function. For example, keyboard buttons may be displayed on the entire region of the display portion 9631 so that the display portion 9631 can be used as a data input terminal.

The display mode switch 9626 can switch the display between portrait mode, landscape mode, and the like, and between monochrome display and color display, for example. The power-saving switch 9625 can control display luminance in accordance with the amount of external light in use of the tablet terminal detected by an optical sensor incorporated in the tablet terminal. Another detection device including a sensor for detecting inclination, such as a gyroscope or an acceleration sensor, may be incorporated in the tablet terminal, in addition to the optical sensor.

FIG. 22B illustrates the tablet terminal 9600 which is folded. The tablet terminal 9600 includes the housing 9630, a solar cell 9633, and a charge and discharge control circuit 9634. As an example, FIG. 22B illustrates the charge and discharge control circuit 9634 including the battery 9635 and the DC-to-DC converter 9636.

By including the display device that is disclosed in the present specification and the like, the display portion 9631 is foldable. Since the tablet terminal 9600 is double foldable, the housing 9630 can be closed when the tablet terminal is not in use, for example; thus, the tablet terminal is highly portable. Moreover, since the display portion 9631 can be protected when the housing 9630 is closed, the tablet terminal can have high durability and high reliability for long-term use.

The tablet terminal illustrated in FIGS. 22A and 22B can have other functions such as a function of displaying various kinds of data (e.g., a still image, a moving image, and a text image), a function of displaying a calendar, a date, the time, or the like on the display portion, a touch-input function of operating or editing the data displayed on the display portion by touch input, and a function of controlling processing by various kinds of software (programs).

The solar cell 9633 provided on a surface of the tablet terminal can supply power to the touchscreen, the display portion, a video signal processing portion, or the like. Note that the solar cell 9633 is preferably provided on both surfaces of the housing 9630, in which case the battery 9635 can be charged efficiently. When a lithium ion battery is used as the battery 9635, there is an advantage of downsizing or the like.

The structure and operation of the charge and discharge control circuit 9634 illustrated in FIG. 22B is described with reference to a block diagram of FIG. 22C. FIG. 22C illustrates the solar cell 9633, the battery 9635, the DC-to-DC converter 9636, a converter 9637, switches SW1 to SW3, and the display portion 9631. The battery 9635, the DC-to-DC converter 9636, the converter 9637, and the switches SW1 to SW3 correspond to the charge and discharge control circuit 9634 illustrated in FIG. 22B.

First, description is made on an example of the operation in the case where power is generated by the solar cell 9633 with the use of external light. The voltage of the power generated by the solar cell is raised or lowered by the DC-to-DC converter 9636 so as to be voltage for charging the battery 9635. Then, when power from the solar cell 9633 is used for the operation of the display portion 9631, the switch SW1 is turned on and the voltage of the power is raised or lowered by the converter 9637 so as to be voltage needed for the display portion 9631. When images are not displayed on the display portion 9631, the switch SW1 is turned off and the switch SW2 is turned on so that the battery 9635 is charged.

Although the solar cell 9633 is described as an example of a power generation unit, the power generation unit is not particularly limited, and the battery 9635 may be charged by another power generation unit such as a piezoelectric element or a thermoelectric conversion element (Peltier element). For example, the battery 9635 may be charged by a non-contact power transmission module which is capable of charging by transmitting and receiving power by wireless (without contact), or another charge unit used in combination.

It is needless to say that one embodiment of the present invention is not limited to the above-described electronic devices and lighting devices as long as the display device of one embodiment of the present invention is included.

This embodiment can be implemented in an appropriate combination with any of the structures described in other embodiments.

Example

A display device 500 was formed by the method described in Embodiment 2. As a display element, a light-emitting element including an organic EL material was used. Note that for the substrate 111 and the substrate 121, a 20-μm-thick aramid with a Young's modulus of approximately 10 GPa was used. For the substrate 137 and the substrate 147, 200-μm-thick silicone rubber with a Young's modulus of approximately 0.03 GPa was used.

Figure 23A:
FIGS. 23A and 23B are photographs for explaining Example.

Then, the entire display region of the display device 500 was made to emit light and the display device 500 was folded double such that the display region on the left of the bent portion and that on the right of the bent portion overlapped with each other FIG. 23A is a photograph showing the display device 500 folded double in an emission state.

Figure 23B:
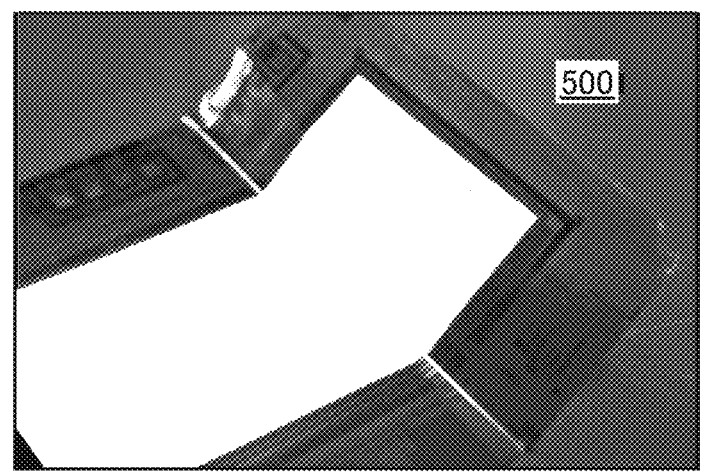

Then, the display device 500 folded double was unfolded, and a display state of the display device 500 was observed. FIG. 23B is a photograph showing the display device 500 that was unfolded. Even after the display device 500 was folded and unfolded, the entire display region thereof emitted light and the display state remained to be excellent.

Note that a display device which was not provided with the substrate 137 and the substrate 147 was fabricated as a comparative sample by the method described in Embodiment 2, and folded double. In this display device, the substrate 111 and the substrate 121 were cracked, and light emission was not maintained in the entire display region.

This application is based on Japanese Patent Application serial no. 2013-169542 filed with Japan Patent Office on Aug. 19, 2013, the entire contents of which are hereby incorporated by reference.

What is claimed is:
1. A light-emitting device comprising:
a display area comprising a first transistor and a light-emitting element;
a driver circuit comprising a second transistor; and
a terminal electrode electrically connected to the driver circuit,
wherein the first transistor, the light-emitting element, the second transistor, and the terminal electrode are between a first flexible substrate and a second flexible substrate over the first flexible substrate,
wherein each of the first flexible substrate and the second flexible substrate comprises an organic resin material,
wherein a third flexible substrate is over the second flexible substrate,
wherein the third flexible substrate and the display area overlap with each other,
wherein the third flexible substrate and the driver circuit overlap with each other,
wherein the third flexible substrate and the terminal electrode do not overlap with each other, and
wherein a Young's modulus of the third flexible substrate is smaller than one fiftieth of a Young's modulus of the second flexible substrate.
2. A light-emitting device comprising:
a display area comprising a first transistor and a light-emitting element;
a driver circuit comprising a second transistor; and
a terminal electrode electrically connected to the driver circuit,
wherein the first transistor, the light-emitting element, the second transistor, and the terminal electrode are between a first flexible substrate and a second flexible substrate over the first flexible substrate,
wherein each of the first flexible substrate and the second flexible substrate comprises an organic resin material,
wherein a rubber is over the second flexible substrate, wherein a thickness of the rubber is greater than or equal to 2 times and less than or equal to 100 times a thickness of the second flexible substrate, wherein the rubber and the display area overlap with each other, wherein the rubber and the driver circuit overlap with each other, wherein the rubber and the terminal electrode do not overlap with each other, and wherein a Young's modulus of the rubber is smaller than one fiftieth of a Young's modulus of the second flexible substrate.

3. The light-emitting device according to claim 1, wherein the Young's modulus of the third flexible substrate is smaller than or equal to 2 GPa.

4. The light-emitting device according to claim 2, wherein the Young's modulus of the rubber is smaller than or equal to 2 GPa.

5. The light-emitting device according to claim 1, wherein the display area is foldable so that a first portion of the second flexible substrate and a second portion of the second flexible substrate face each other.

6. The light-emitting device according to claim 2, wherein the display area is foldable so that a first portion of the second flexible substrate and a second portion of the second flexible substrate face each other.

7. The light-emitting device according to claim 1, further comprising a touch sensor in the display area.

8. The light-emitting device according to claim 2, further comprising a touch sensor in the display area.

9. The light-emitting device according to claim 1, wherein the terminal electrode is electrically connected to an external electrode through a conductive layer in an opening of the second flexible substrate.

10. The light-emitting device according to claim 2, wherein the terminal electrode is electrically connected to an external electrode through a conductive layer in an opening of the second flexible substrate.

11. The light-emitting device according to claim 1, further comprising a fourth flexible substrate under the first flexible substrate, wherein a Young's modulus of the fourth flexible substrate is smaller than a Young's modulus of the first flexible substrate.

12. The light-emitting device according to claim 11, wherein the fourth flexible substrate and the terminal electrode overlap with each other.

13. The light-emitting device according to claim 2, further comprising a third flexible substrate under the first flexible substrate, wherein a Young's modulus of the third flexible substrate is smaller than a Young's modulus of the first flexible substrate.

14. The light-emitting device according to claim 13, wherein the third flexible substrate and the terminal electrode overlap with each other.

15. The light-emitting device according to claim 2, wherein the rubber has a light-transmitting property with respect to visible light.

16. An electronic device comprising:
a first housing and a second housing; and
the light-emitting device according to claim 1,
wherein the display area and the first housing overlap with each other,
wherein the display area and the second housing overlap with each other, and
wherein the display area is configured to be bent between the first housing and the second housing.

17. An electronic device comprising:
a first housing and a second housing; and
the light-emitting device according to claim 2,
wherein the display area and the first housing overlap with each other,
wherein the display area and the second housing overlap with each other, and
wherein the display area is configured to be bent between the first housing and the second housing.

* * * * *